US012740231B2

(12) United States Patent
Yamazaki et al.

(10) Patent No.: US 12,740,231 B2
(45) Date of Patent: Sep. 15, 2026

(54) DISPLAY DEVICE

(71) Applicant: Semiconductor Energy Laboratory Co., Ltd., Atsugi (JP)

(72) Inventors: Shunpei Yamazaki, Setagaya (JP); Satoshi Seo, Sagamihara (JP); Kenichi Okazaki, Atsugi (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 330 days.

(21) Appl. No.: 18/273,081

(22) PCT Filed: Jan. 19, 2022

(86) PCT No.: PCT/IB2022/050412
§ 371 (c)(1),
(2) Date: Jul. 19, 2023

(87) PCT Pub. No.: WO2022/162501
PCT Pub. Date: Aug. 4, 2022

(65) Prior Publication Data

US 2024/0057422 A1 Feb. 15, 2024

(30) Foreign Application Priority Data

Jan. 28, 2021 (JP) ................................ 2021-012374

(51) Int. Cl.
*H10K 50/19* (2023.01)
*H10K 59/121* (2023.01)
(Continued)

(52) U.S. Cl.
CPC ........... *H10K 50/19* (2023.02); *H10K 59/121* (2023.02); *H10K 59/131* (2023.02); *H10K 59/32* (2023.02);
(Continued)

(58) Field of Classification Search
CPC ............................ H10K 50/19; H10K 59/131
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 102388674 A 3/2012
CN 104752481 A 7/2015
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Christopher M Raabe
(74) *Attorney, Agent, or Firm* — Eric J. Robinson; Robinson Intellectual Property Law Office, P.C.

(57) ABSTRACT

A high-resolution display device is provided. A display device having both high display quality and high resolution is provided. The display device includes a plurality of first light-emitting elements and a plurality of second light-emitting elements. The first light-emitting element comprises a first pixel electrode, a first EL layer, a common layer, and a common electrode. The second light-emitting element comprises a second pixel electrode, a second EL layer, the common layer, and the common electrode. The first EL layer and the second EL layer are provided to be apart from each other, and a side surface of the first EL layer and a side surface of the second EL layer are provided to face each other. A first light-emitting unit, a first intermediate layer, and a second light-emitting unit are stacked in the first EL
(Continued)

layer. A third light-emitting unit, a second intermediate layer, and a fourth light-emitting unit are stacked in the second EL layer. The first light-emitting unit and the second light-emitting unit each comprise a first light-emitting layer emitting light of a first color, and the third light-emitting unit and the fourth light-emitting unit each comprise a second light-emitting layer emitting light of a second color different from the first color.

8 Claims, 28 Drawing Sheets

(51) Int. Cl.
*H10K 59/131* (2023.01)
*H10K 59/32* (2023.01)
*H10K 59/35* (2023.01)
*H10K 59/80* (2023.01)

(52) U.S. Cl.
CPC ........... *H10K 59/35* (2023.02); *H10K 59/871* (2023.02); *H10K 59/8722* (2023.02); *H10K 59/8731* (2023.02)

(58) Field of Classification Search
USPC .................................................. 313/498–512
See application file for complete search history.

(56) References Cited

U.S. PATENT DOCUMENTS

| | | | |
|---|---|---|---|
| 8,421,344 B2 | 4/2013 | Nendai | |
| 9,721,997 B2 | 8/2017 | Lee | |
| 11,335,876 B2 | 5/2022 | Seok et al. | |
| 2002/0072139 A1 | 6/2002 | Kashiwabara | |
| 2002/0113546 A1 | 8/2002 | Seo et al. | |
| 2011/0148290 A1 | 6/2011 | Oota | |
| 2011/0316414 A1 | 12/2011 | Nendai | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2015/0144908 A1* | 5/2015 | Yoon | H10K 59/35 257/40 |
| 2015/0188087 A1 | 7/2015 | Lee | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0179418 A1 | 6/2017 | Lee | |
| 2017/0256754 A1 | 9/2017 | Defranco et al. | |
| 2018/0151819 A1 | 5/2018 | Kim | |
| 2018/0190908 A1 | 7/2018 | Ke et al. | |
| 2020/0006692 A1 | 1/2020 | Seok et al. | |
| 2020/0057330 A1 | 2/2020 | Yamazaki et al. | |
| 2020/0203662 A1 | 6/2020 | Mollard et al. | |
| 2020/0211477 A1* | 7/2020 | Lai | G09G 3/3258 |
| 2021/0028257 A1* | 1/2021 | Kim | H10K 59/8052 |
| 2022/0130918 A1 | 4/2022 | Yamazaki et al. | |
| 2022/0149312 A1* | 5/2022 | Lee | H10K 50/171 |
| 2022/0209162 A1 | 6/2022 | Seo et al. | |

FOREIGN PATENT DOCUMENTS

| | | |
|---|---|---|
| CN | 106898630 A | 6/2017 |
| CN | 108134010 A | 6/2018 |
| CN | 109509765 A | 3/2019 |
| CN | 109937443 A | 6/2019 |
| CN | 110660831 A | 1/2020 |
| DE | 102017128304 | 5/2018 |
| EP | 2587892 A | 5/2013 |
| EP | 3182475 A | 6/2017 |
| EP | 3595011 A | 1/2020 |
| JP | 2000-036385 A | 2/2000 |
| JP | 2002-324673 A | 11/2002 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2018-189937 A | 11/2018 |
| JP | 2019-179696 A | 10/2019 |
| JP | 2020-004970 A | 1/2020 |
| JP | 2020-160305 A | 10/2020 |
| KR | 2013-0033259 A | 4/2013 |
| KR | 2015-0080407 A | 7/2015 |
| KR | 2017-0072728 A | 6/2017 |
| KR | 2018-0025057 A | 3/2018 |
| KR | 2018-0062290 A | 6/2018 |
| KR | 2019-0076045 A | 7/2019 |
| KR | 2020-0002458 A | 1/2020 |
| KR | 2020-0082920 A | 7/2020 |
| KR | 2021-0004919 A | 1/2021 |
| TW | 201824599 | 7/2018 |
| TW | 202000653 | 1/2020 |
| WO | WO-2012/001727 | 1/2012 |
| WO | WO-2018/087625 | 5/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56) References Cited

OTHER PUBLICATIONS

International Search Report (Application No. PCT/IB2022/050412) Dated Apr. 26, 2022.
Written Opinion (Application No. PCT/IB2022/050412) Dated Apr. 26, 2022.

* cited by examiner 500
503
502
525
542
541
512R_2
512G_2
512B_2
531
531
531
512R_1
512G_1
512B_1
501
501
501
550R
550G
550B 503
502
525
512R_2
542
541

500
525
502
512R_2
512G_2
512B_2
531
531
531
512R_1
512G_1
512B_1
501
501
501
550R
550G
550B

100
A1 B1 A2 110R 110G 110B C1 C2
R G B R G B
R G B R G B
111C
113
Y
X
B2

110R 110G 110B
112Ra 112Rb 112Rc 112Ga 112Gb 112Gc 112Ba 112Bb 112Bc
A1 A2
101 111R 112R 113 121 112G 111G 131 114 112B 111B 110R 110R
112Ra 112Rb 112Rc
B1 B2
101 111R 112R 113 114 131 121 112R 111R 101
111R
111G
131
111B
131
111C 101
111R
112Rf
111G
144a
146a
111B
131
111C 143a
101
111R
112Rf
111G
144a
146a
111B
131
111C 101
147a
111R
112Rf
111G
144a
111B
131
111C 145a
101
147a
111R
112Rf
111G
111B
131
111C 145a
145a
101
111R
112R
111G
111B
131
111C

FIG. 15A
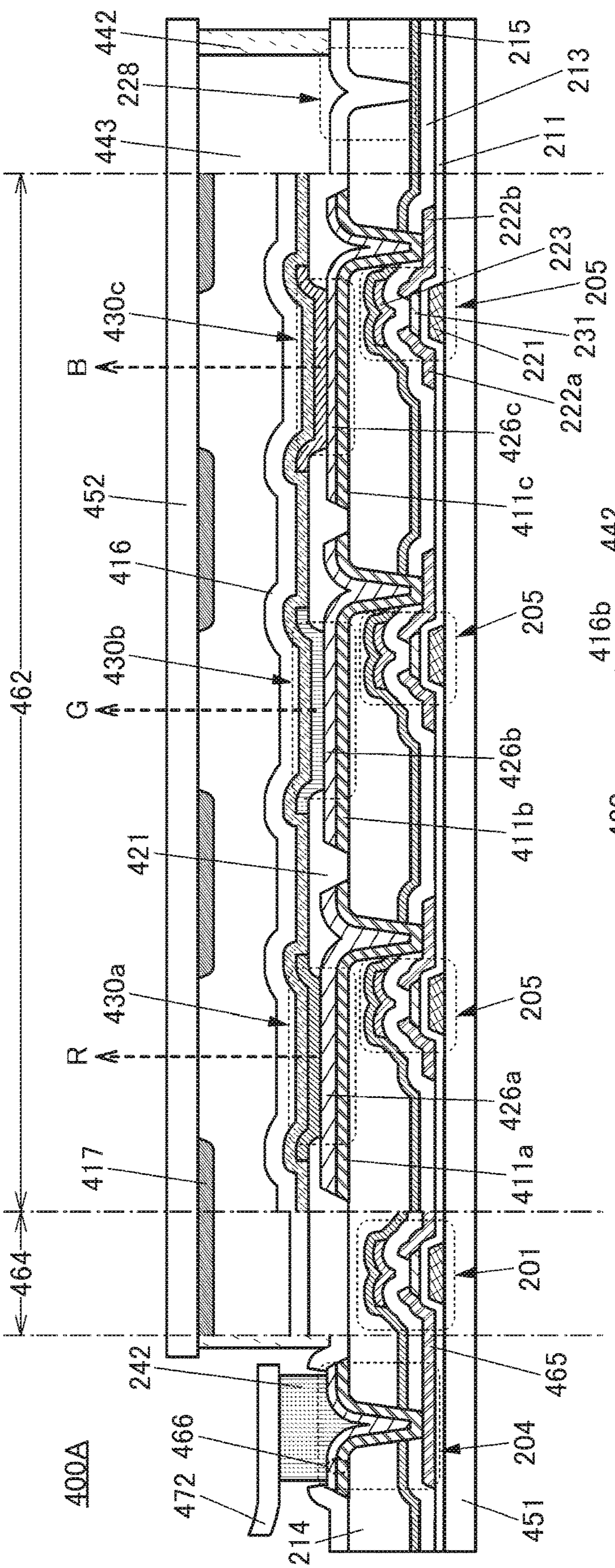
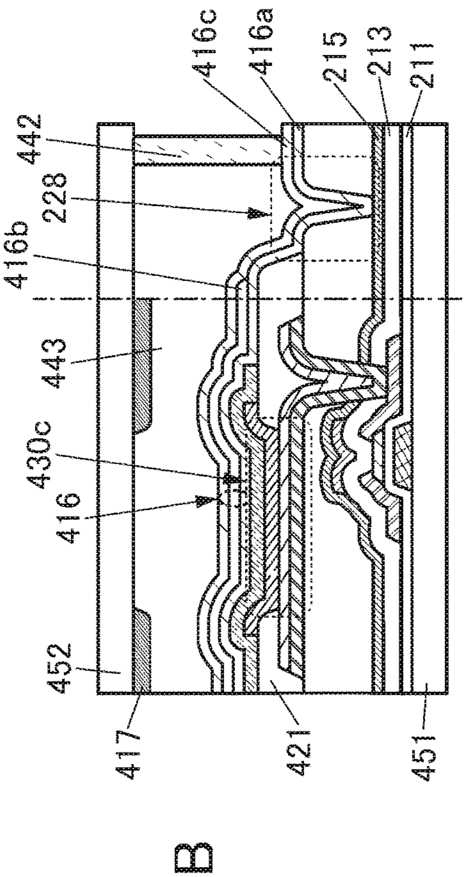
FIG. 15B
400A
442
228
443
215
213
211
222b
223
205
231
221
222a
430c
B
426c
411c
452
416
430b
G
426b
411b
421
430a
R
426a
411a
417
462
464
201
465
242
466
472
214
204
451
416c
416a
416b
430c FIG. 16A
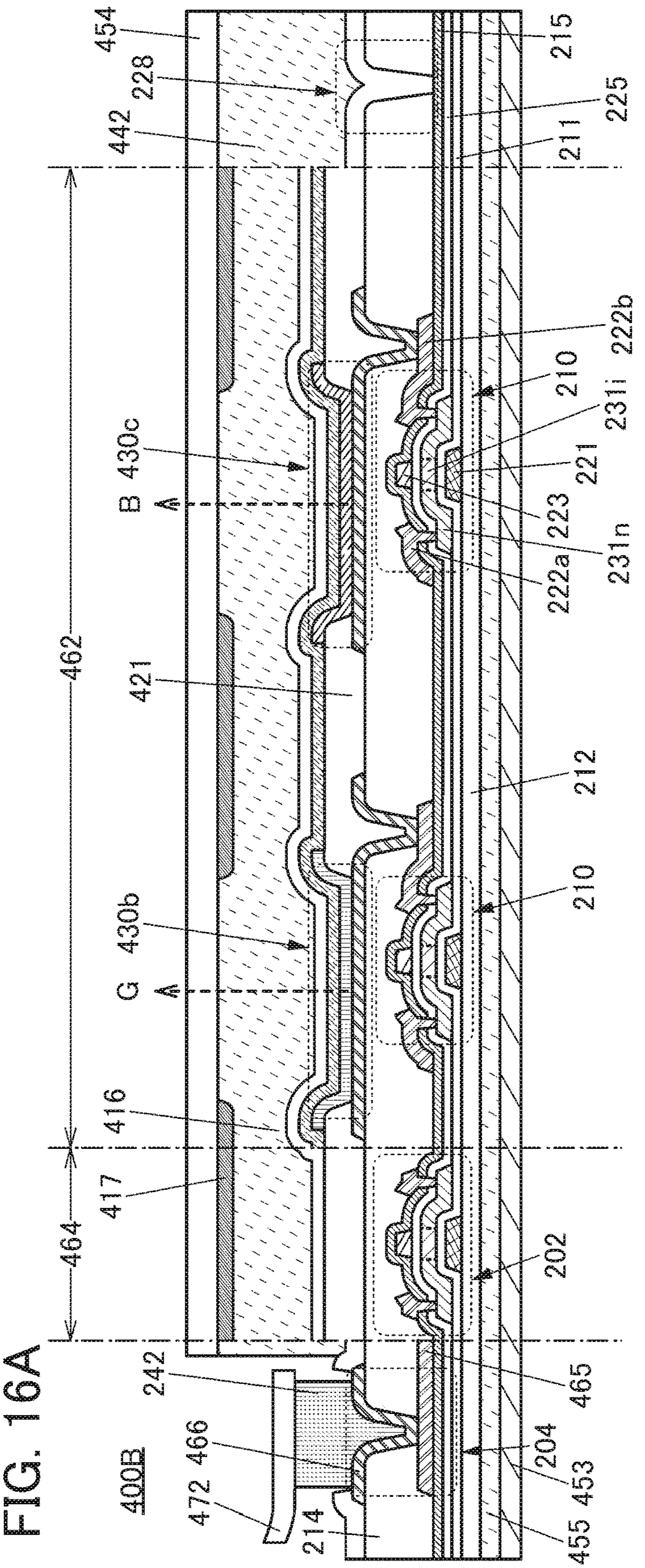
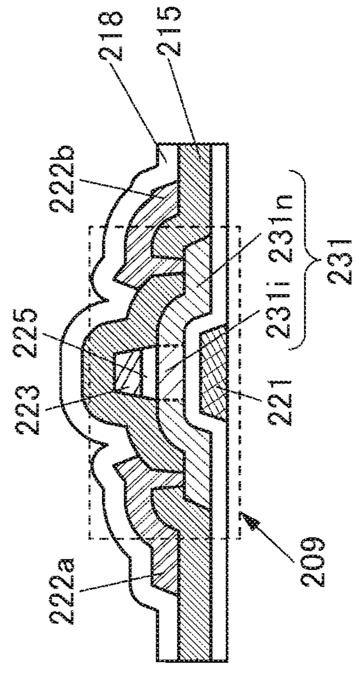
FIG. 16B
400B
454
228
442
215
225
211
462
464
B
430c
G
430b
421
416
417
242
466
472
214
222b
210
231i
221
223
231n
222a
212
202
465
204
453
455
218
215
222b
225
223
231i
231n
231
221
209
222a

DISPLAY DEVICE

TECHNICAL FIELD

One embodiment of the present invention relates to a display device. One embodiment of the present invention relates to a method for fabricating a display device.

Note that one embodiment of the present invention is not limited to the above technical field. Examples of a technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a fabrication method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Furthermore, higher resolution has been required for a stationary display device such as a television device or a monitor device along with an increase in definition. An example of a device required to have the highest resolution is a device for virtual reality (VR) or augmented reality (AR).

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a display device that easily achieves higher resolution and a method for fabricating the display device. An object of one embodiment of the present invention is to provide a display device having both high display quality and high resolution. An object of one embodiment of the present invention is to provide a display device with high contrast. An object of one embodiment of the present invention is to provide a highly reliable display device.

An object of one embodiment of the present invention is to provide a display device having a novel structure or a method for fabricating a display device. An object of one embodiment of the present invention is to provide a method for manufacturing the above-described display device with high yield. An object of one embodiment of the present invention is to at least reduce at least one of problems of the conventional technique.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems

One embodiment of the present invention is a display device including a plurality of first light-emitting elements and a plurality of second light-emitting elements. The first light-emitting element includes a first pixel electrode, a first EL layer, a common layer, and a common electrode. The second light-emitting element includes a second pixel electrode, a second EL layer, the common layer, and the common electrode. The first light-emitting element and the second light-emitting element are arranged in a first direction. The plurality of first light-emitting elements and the plurality of second light-emitting elements are each arranged in a second direction intersecting with the first direction. The first EL layer and the second EL layer are provided to be apart from each other. A side surface of the first EL layer and a side surface of the second EL layer are provided to face each other. A first light-emitting unit, a first intermediate layer, and a second light-emitting unit are stacked in the first EL layer. A third light-emitting unit, a second intermediate layer, and a fourth light-emitting unit are stacked in the second EL layer. The first light-emitting unit and the second light-emitting unit each include a first light-emitting layer emitting light of a first color, and the third light-emitting unit and the fourth light-emitting unit each include a second light-emitting layer emitting light of a second color different from the first color.

In the above, it is preferable that the side surface of the first EL layer be perpendicular or substantially perpendicular to a formation surface of the first EL layer and the side surface of the second EL layer be perpendicular or substantially perpendicular to a formation surface of the second EL layer.

In the above, it is preferable that an angle between the side surface of the first EL layer and a formation surface of the first EL layer be greater than or equal to 60° and less than or equal to 90° and an angle between the side surface of the second EL layer and a formation surface of the second EL layer be greater than or equal to 60° and less than or equal to 90°.

In any of the above, an insulating layer is preferably included between the first pixel electrode and the second pixel electrode. Furthermore, the common layer and the common electrode preferably have a region that overlaps with neither the first EL layer nor the second EL layer and overlaps with the insulating layer.

In the above, the insulating layer preferably includes an organic insulating film or an inorganic insulating film.

In any of the above, a connection electrode is preferably included on the same surface as the first pixel electrode. At this time, it is preferable that the connection electrode be electrically connected to the common electrode without through the first EL layer and the second EL layer. It is preferable that the connection electrode be electrically connected to the common electrode through the common layer.

In any of the above, it is preferable that the plurality of first light-emitting elements be arranged with a resolution higher than or equal to 1000 ppi and an aperture ratio be higher than or equal to 50%.

Effect of the Invention

According to one embodiment of the present invention, a display device that easily achieves higher resolution and a method for fabricating the display device can be provided.

Alternatively, a display device having both high display quality and high resolution can be provided. Alternatively, a display device with high contrast can be provided. Alternatively, a highly reliable display device can be provided.

According to one embodiment of the present invention, a display device having a novel structure or a method for fabricating a display device can be provided. Alternatively, a method for manufacturing the above-described display device with high yield can be provided. According to one embodiment of the present invention, at least one of problems of the conventional technique can be at least reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 15A and FIG. 15B are cross-sectional views illustrating examples of a display device.

FIG. 16A is a cross-sectional view illustrating an example of a display device. FIG. 16B is a cross-sectional view illustrating an example of a transistor.

MODE FOR CARRYING OUT THE INVENTION

Figure 1A:
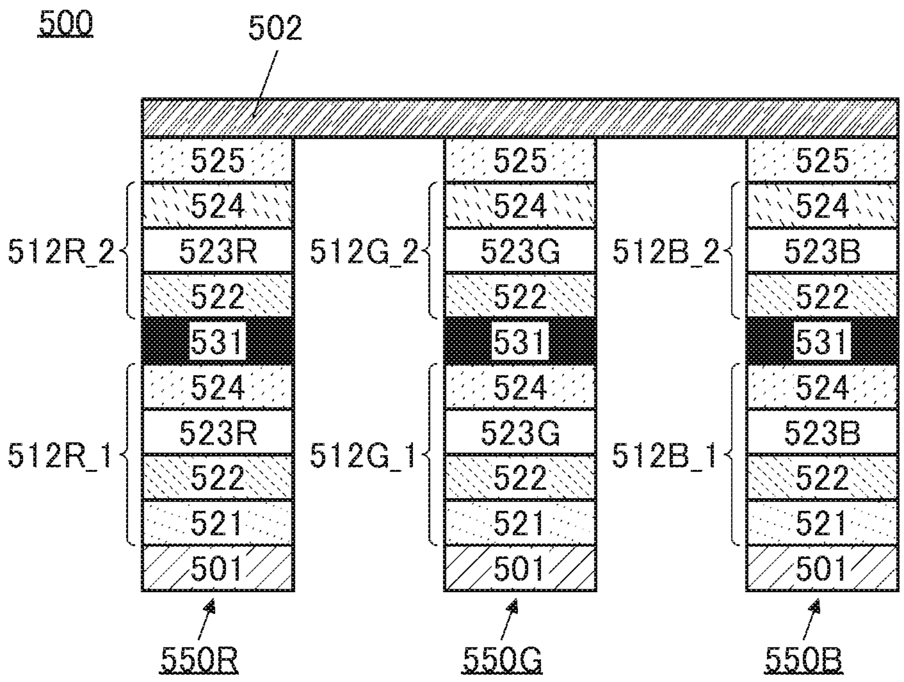
FIG. 1A and FIG. 1B are diagrams illustrating structure examples of a light-emitting apparatus.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as “first” and “second” are used in order to avoid confusion among components and do not limit the number.

In this specification and the like, the term “film” and the term “layer” can be interchanged with each other. For example, in some cases, the term “conductive layer” and the term “insulating layer” can be interchanged with the term “conductive film” and the term “insulating film”, respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a light-emitting apparatus that can be used in the display device of one embodiment of the present invention and a light-emitting element (also referred to as a light-emitting device) included in the light-emitting apparatus will be described.

Structure Example of Light-Emitting Apparatus

FIG. 1A is a schematic cross-sectional view of a light-emitting apparatus 500. The light-emitting apparatus 500 includes a light-emitting element 550R that emits red light, a light-emitting element 550G that emits green light, and a light-emitting element 550B that emits blue light.

The light-emitting element 550R has a structure in which between a pair of electrodes (an electrode 501 and an electrode 502), two light-emitting units (a light-emitting unit 512R_1 and a light-emitting unit 512R_2) are stacked with an intermediate layer 531 therebetween. Similarly, the light-emitting element 550G includes a light-emitting unit 512G_1 and a light-emitting unit 512G_2, and the light-emitting element 550B includes a light-emitting unit 512B_1 and a light-emitting unit 512B_2.

The electrode 501 functions as a pixel electrode and is provided in every light-emitting element. The electrode 502 functions as a common electrode and is shared by a plurality of light-emitting elements.

The light-emitting unit 512R_1 includes a layer 521, a layer 522, a light-emitting layer 523R, a layer 524, and the like. The light-emitting unit 512R_2 includes the layer 522, the light-emitting layer 523R, the layer 524, and the like. The light-emitting element 550R includes a layer 525 and the like between the light-emitting unit 512R_2 and the electrode 502. Note that the layer 525 can also be regarded as part of the light-emitting unit 512R_2.

The layer 521 includes, for example, a layer containing a substance with a high hole-injection property (hole-injection layer). The layer 522 includes, for example, a layer containing a substance with a high hole-transport property (hole-transport layer). The layer 524 includes, for example, a layer containing a substance with a high electron-transport property (electron-transport layer). The layer 525 includes, for example, a layer containing a substance with a high electron-injection property (electron-injection layer).

Alternatively, the layer 521 may include an electron-injection layer, the layer 522 may include an electron-transport layer, the layer 524 may include a hole-transport layer, and the layer 525 may include a hole-injection layer.

Note that in terms of the layer 522, the light-emitting layer 523R, and the layer 524, the light-emitting unit 512R_1 and the light-emitting unit 512R_2 may have the same structure (materials, thicknesses, and the like) or different structures.

FIG. 1A illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

The intermediate layer 531 has a function of injecting electrons into one of the light-emitting unit 512R_1 and the light-emitting unit 512R_2 and injecting holes into the other when voltage is applied between the electrode 501 and the electrode 502. The intermediate layer 531 can also be referred to as a charge-generation layer.

Note that the light-emitting layer 523R included in the light-emitting element 550R contains a light-emitting substance that emits red light, the light-emitting layer 523G included in the light-emitting element 550G contains a light-emitting substance that emits green light, and the light-emitting layer 523B included in the light-emitting element 550B contains a light-emitting substance that emits blue light. Note that the light-emitting element 550G and the light-emitting element 550B have a structure in which the light-emitting layer 523R included in the light-emitting element 550R is replaced with the light-emitting layer 523G and the light-emitting layer 523B, respectively, and the other components are similar to those of the light-emitting element 550R.

The structure (material, thickness, and the like) of the layer 521, the layer 522, the layer 524, and the layer 525 may be the same or different from each other among the light-emitting devices of different colors.

A structure in which a plurality of light-emitting units are connected in series with the intermediate layer 531 therebetween as in the light-emitting element 550R, the light-emitting element 550G, and the light-emitting element 550B is referred to as a tandem structure in this specification. In contrast, a structure in which one light-emitting unit is provided between a pair of electrodes is referred to as a single structure. Note that in this specification and the like, the term “tandem structure” is used; however, without being limited to this, the tandem structure may be referred to as a stack structure, for example. The tandem structure enables a light-emitting element capable of high-luminance light emission. Furthermore, the tandem structure reduces the amount of current needed for obtaining the same luminance as compared with a single structure, and thus can improve the reliability.

A structure in which light-emitting layers of light-emitting elements are separately formed as in the light-emitting element 550R, the light-emitting element 550G, and the light-emitting element 550B is referred to as a side-by-side (SBS) structure in some cases. The SBS structure can optimize materials and structures of light-emitting elements and thus can extend freedom of choice of materials and structures, whereby the luminance and the reliability can be easily improved.

It can be said that the light-emitting apparatus 500 of one embodiment of the present invention employs a tandem structure and an SBS structure. Thus, the light-emitting apparatus 500 can take advantages of both the tandem structure and the SBS structure. As illustrated in FIG. 1A, two light-emitting units are formed in series in the light-emitting apparatus 500 of one embodiment of the present invention, and this structure may be referred to as a two-unit tandem structure. In the two-unit tandem structure illustrated in FIG. 1A, a second light-emitting unit including a red-light-emitting layer is stacked over a first light-emitting unit including a red-light-emitting layer. Similarly, in the two-unit tandem structure illustrated in FIG. 1A, a second light-emitting unit including a green-light-emitting layer is stacked over a first light-emitting unit including a green-light-emitting layer, and a second light-emitting unit including a blue-light-emitting layer is stacked over a first light-emitting unit including a blue-light-emitting layer.

Figure 1B:
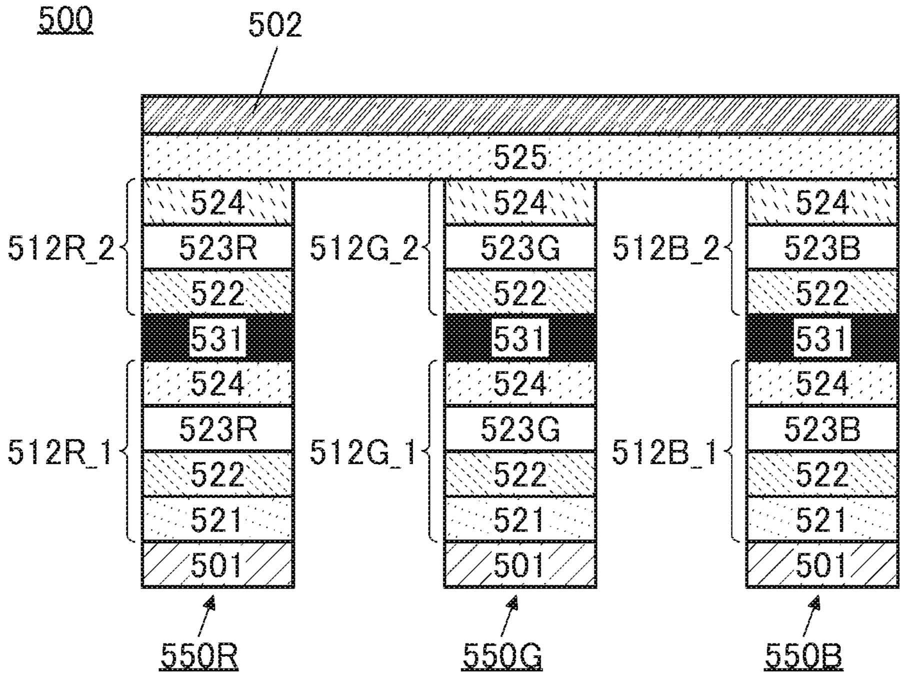

FIG. 1B illustrates a modification example of the light-emitting apparatus 500 illustrated in FIG. 1A. The light-emitting apparatus 500 illustrated in FIG. 1B is an example of the case where like the electrode 502, the layer 525 is shared by the light-emitting elements. In this case, the layer 525 can be referred to as a common layer. By providing one or more common layers for light-emitting elements in this manner, the fabricating process can be simplified, resulting in a reduction in manufacturing cost.

Figure 2A:
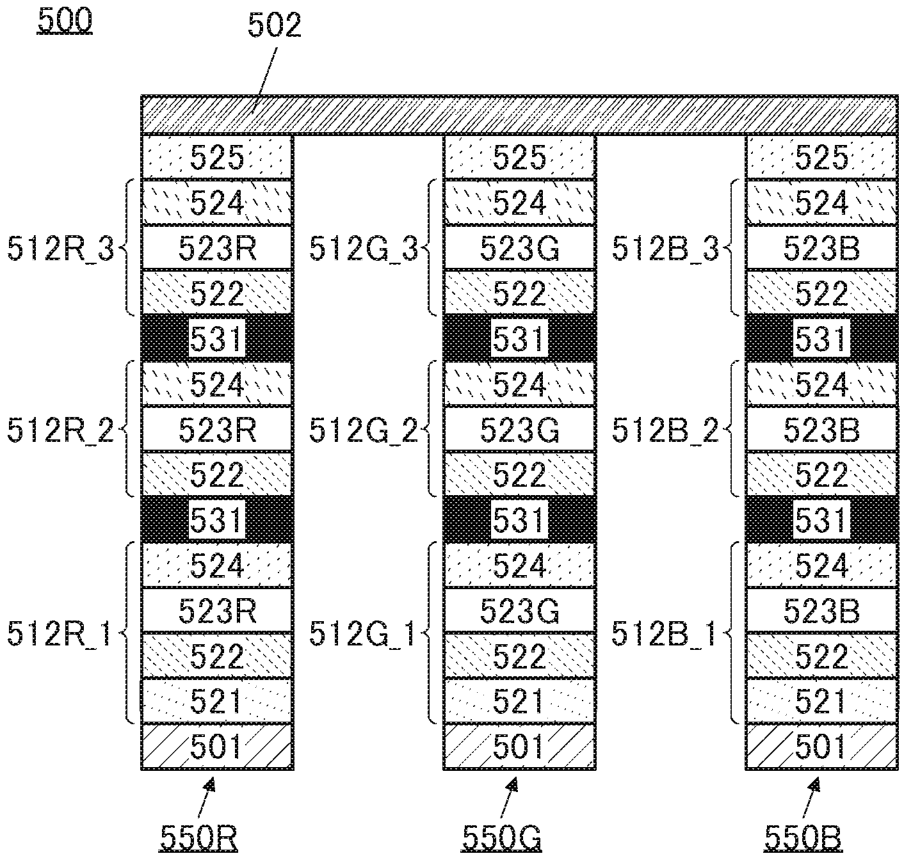
FIG. 2A and FIG. 2B are diagrams illustrating structure examples of a light-emitting apparatus.

The light-emitting apparatus 500 illustrated in FIG. 2A is an example in which three light-emitting units are stacked. In the light-emitting element 550R in FIG. 2A, a light-emitting unit 512R_3 is further stacked over the light-emitting unit 512R_2 with another intermediate layer 531 therebetween. The light-emitting unit 512R_3 has a structure similar to that of the light-emitting unit 512R_2. The same as the light-emitting unit 512R_3 applies to a light-emitting unit 512G_3 included in the light-emitting element 550G and a light-emitting unit 512B_3 included in the light-emitting element 550B.

Figure 2B:
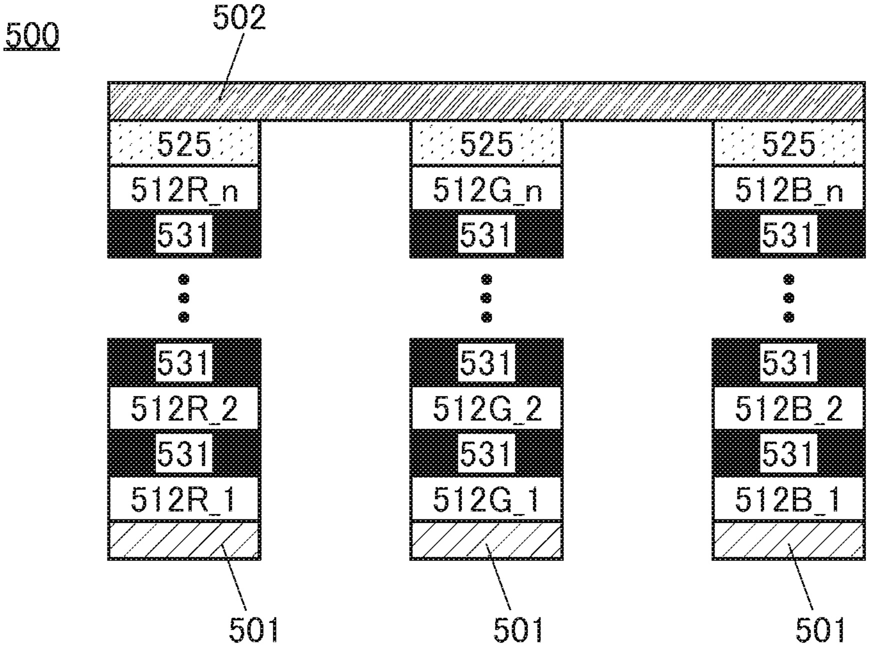

FIG. 2B illustrates an example in which n light-emitting units (n is an integer greater than or equal to 2) are stacked.

When the number of stacked light-emitting units is increased in the above manner, luminance obtained from the light-emitting element with the same amount of current can be increased in accordance with the number of stacked layers. Moreover, increasing the number of stacked light-emitting units can reduce current necessary for obtaining the same luminance; thus, power consumption of the light-emitting element can be reduced in accordance with the number of stacked layers.

Figure 3A:
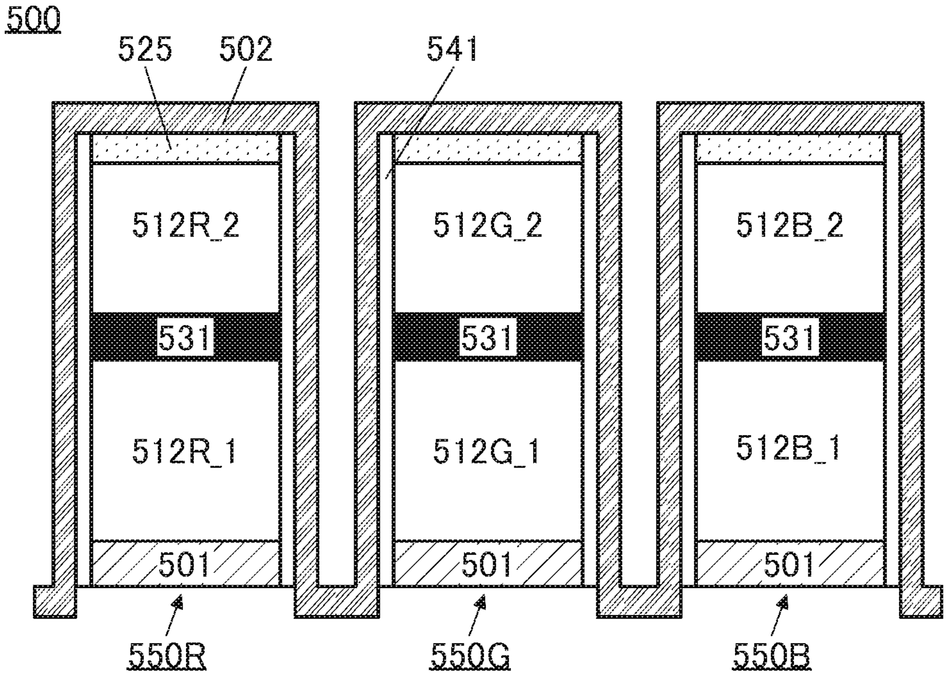
FIG. 3A and FIG. 3B are diagrams illustrating structure examples of a light-emitting apparatus.

The light-emitting apparatus 500 illustrated in FIG. 3A is an example in which two adjacent light-emitting elements are apart from each other and the electrode 502 is provided along the side surfaces of the light-emitting units and the intermediate layers 531.

Here, the intermediate layer 531 and the electrode 502 might be electrically short-circuited when in contact with each other. Thus, the intermediate layer 531 and the electrode 502 are preferably insulated from each other.

FIG. 3A illustrates an example in which an insulating layer 541 is provided to cover the side surfaces of the electrode 501, the light-emitting units, and the intermediate layer 531. The insulating layer 541 can be referred to as a sidewall protective layer, a sidewall insulating film, or the like. With the insulating layer 541, the intermediate layer 531 and the electrode 502 can be electrically insulated from each other.

The side surfaces of the light-emitting units and the intermediate layer 531 are preferably perpendicular or substantially perpendicular to the formation surface. For example, the angle between the formation surface and these side surfaces is preferably greater than or equal to 60° and less than or equal to 90°.

Figure 3B:
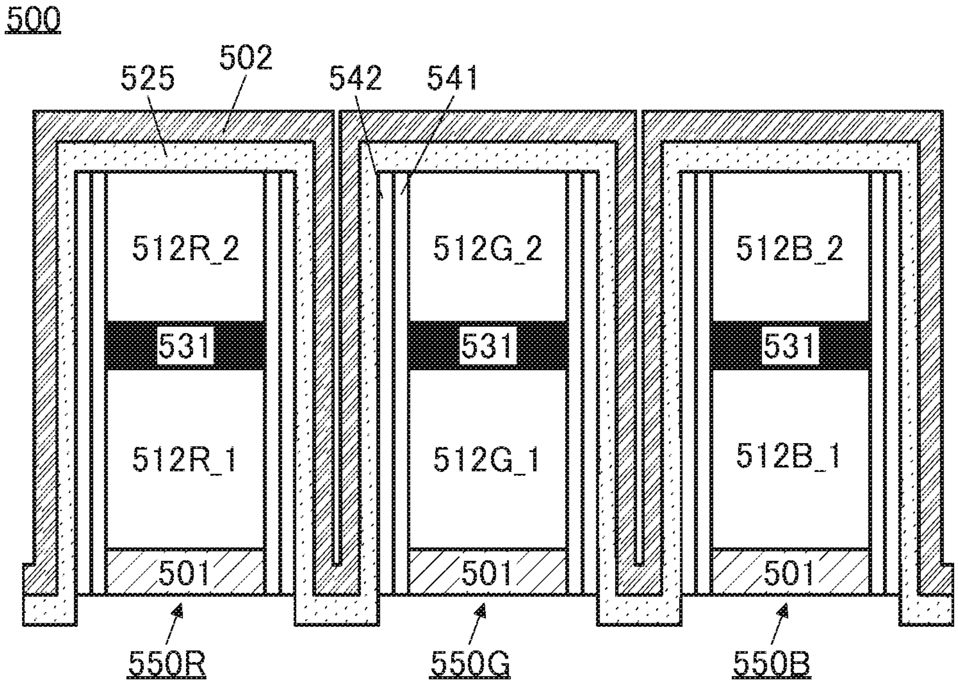

FIG. 3B illustrates an example in which the layer 525 and the electrode 502 are provided along the side surfaces of the light-emitting units and the intermediate layers 531. Furthermore, a two-layer structure of the insulating layer 541 and an insulating layer 542 is provided as a sidewall protective layer.

Figure 4A:
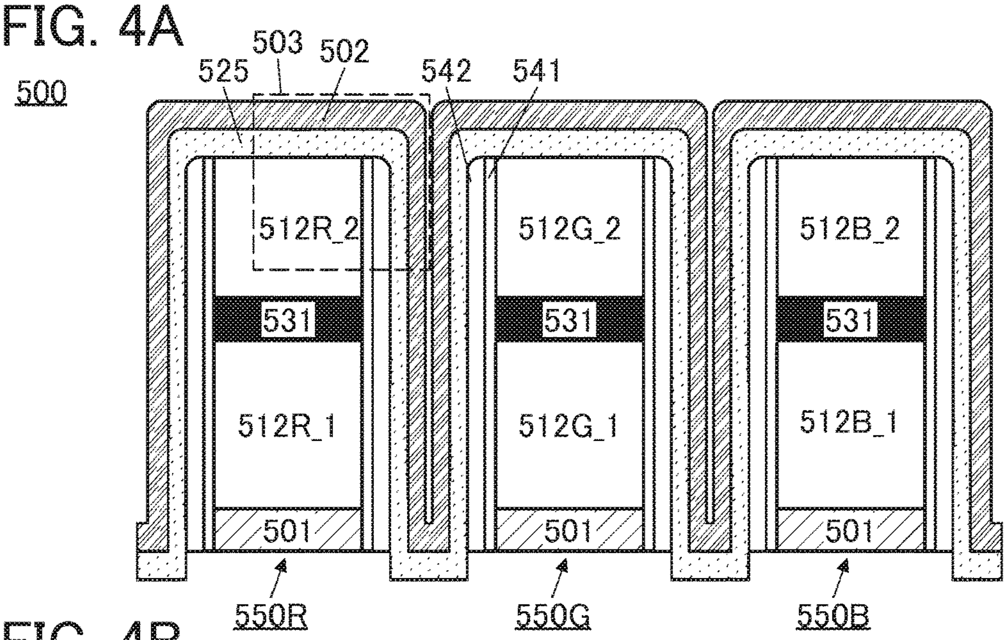
FIG. 4A to FIG. 4C are diagrams illustrating structure examples of a light-emitting apparatus.
Figure 4B:
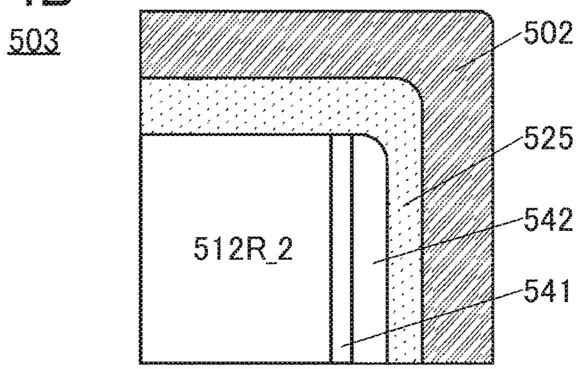

FIG. 4A illustrates a modification example of FIG. 3B. FIG. 4B is an enlarged view of a region 503 illustrated in FIG. 4A. FIG. 4A is different from FIG. 3B in the shape of an end portion of the insulating layer 542. The shape of the end portion of the insulating layer 542 is different and the layer 525 and the electrode 502 are formed along the shape of the insulating layer 542; accordingly, the shapes of the layer 525 and the electrode 502 are also different. FIG. 4A is different from FIG. 3B in the thicknesses of the insulating layer 541 and the insulating layer 542. In FIG. 4A, the thickness of the insulating layer 542 is larger than the thickness of the insulating layer 541. The shape of the end portion of the insulating layer 542 is a rounded shape as in FIG. 4B. For example, the end portion of the insulating layer 542 can be rounded as illustrated in FIG. 4B when an upper portion of the insulating layer 542 is etched by anisotropic etching in formation of the insulating layer 542 by a dry etching method. Because of being able to improve coverage with the layer 525 and the electrode 502, the rounded end portion of the insulating layer 542 is favorable. Furthermore, as illustrated in FIG. 4A and FIG. 4B, the end portion is easily rounded in some cases when the thickness of the insulating layer 542 is larger than the thickness of the insulating layer 541.

Owing to the insulating layer 541 (and the insulating layer 542) functioning as the sidewall protective layer, the electrode 502 and the intermediate layer 531 can be prevented from being electrically short-circuited. Furthermore, the insulating layer 541 (and the insulating layer 542) covers the side surfaces of the electrode 501, whereby the electrode 501 and the electrode 502 can be prevented from being electrically short-circuited. Thus, an electric short circuit at corner portions of four corners of the light-emitting element can be prevented.

An inorganic insulating film is preferably used for each of the insulating layer 541 and the insulating layer 542. For example, an oxide or a nitride such as silicon oxide, silicon oxynitride, silicon nitride oxide, silicon nitride, aluminum oxide, aluminum oxynitride, or hafnium oxide can be used. Yttrium oxide, zirconium oxide, gallium oxide, tantalum oxide, magnesium oxide, lanthanum oxide, cerium oxide, neodymium oxide, or the like may be used.

The insulating layer 541 and the insulating layer 542 can be formed by any of a variety of film deposition methods such as a sputtering method, an evaporation method, a CVD (Chemical Vapor Deposition) method, and an ALD (Atomic Layer Deposition) method, for example. In particular, the insulating layer 541 that is formed directly on the light-emitting units and the intermediate layer 531 is preferably formed by an ALD method, which causes little damage on a formation layer. At this time, the insulating layer 542 is preferably formed by a sputtering method, in which case the productivity can be increased.

For example, an aluminum oxide film formed by an ALD method can be used as the insulating layer 541 and a silicon nitride film formed by a sputtering method can be used as the insulating layer 542.

It is favorable that one or both of the insulating layer 541 and the insulating layer 542 have a function of a barrier insulating film against at least one of water and oxygen. Alternatively, it is favorable that one or both of the insulating layer 541 and the insulating layer 542 have a function of inhibiting diffusion of at least one of water and oxygen. Alternatively, it is favorable that one or both of the insulating layer 541 and the insulating layer 542 have a function of capturing or fixing (also referred to as gettering) at least one of water and oxygen.

Note that in this specification and the like, a barrier insulating film refers to an insulating film having a barrier property. In this specification and the like, a barrier property refers to a function of inhibiting diffusion of a targeted substance (also referred to as having low permeability). Alternatively, a barrier property refers to a function of capturing or fixing (also referred to as gettering) a targeted substance.

When one or both of the insulating layer 541 and the insulating layer 542 have a function of the barrier insulating film or a gettering function, entry of impurities (typically, water or oxygen) that would diffuse into the light-emitting elements from the outside can be suppressed. With such a structure, the light-emitting apparatus can have high reliability.

Figure 4C:
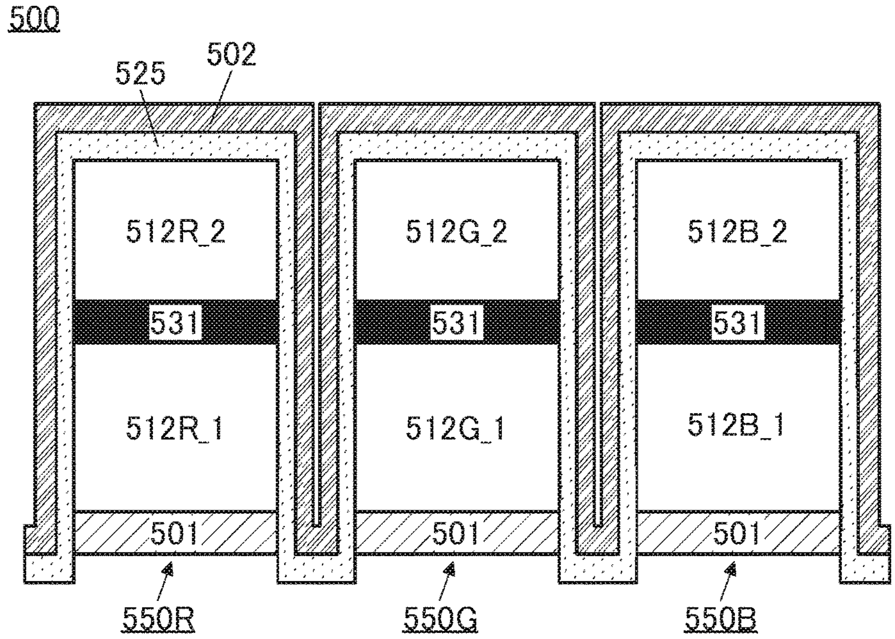

As illustrated in FIG. 4C, the insulating layer 541 and the insulating layer 542 that function as the sidewall protective layer are not necessarily provided. In FIG. 4C, the layer 525 is provided in contact with the side surfaces of the light-emitting units and the intermediate layer 531.

Structure Example of Light-Emitting Element

The emission colors of the light-emitting elements can be red, green, blue, cyan, magenta, yellow, white, or the like depending on the material that constitutes the light-emitting layer 523R and the like. Furthermore, the color purity can be further increased when the light-emitting element has a microcavity structure.

A light-emitting element that emits white light preferably contains two or more kinds of light-emitting substances in a light-emitting layer. To obtain white light emission, two or more light-emitting substances may be selected so that their emission colors are complementary. For example, when emission colors of a first light-emitting layer and a second light-emitting layer are complementary colors, the light-emitting element can be configured to emit white light as a whole.

The same applies to a light-emitting element including three or more light-emitting layers. The light-emitting layer preferably contains two or more light-emitting substances that emit light of R (red), G (green), B (blue), Y (yellow), 0 (orange), and the like. Alternatively, the light-emitting layer preferably contains two or more light-emitting substances that emit light containing two or more of color spectral components of R, G, and B.

Here, a specific example of each layer in the light-emitting element will be described.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting element, and an inorganic compound may be contained. Each of the layers included in the light-emitting element can be formed by an evaporation method (including a vacuum evaporation method), a transfer method, a printing method, an inkjet method, a coating method, or the like.

For example, the light-emitting element can include one or more of a hole-injection layer, a hole-transport layer, a hole-blocking layer, an electron-blocking layer, an electron-transport layer, and an electron-injection layer.

The hole-injection layer is a layer injecting holes from an anode into a hole-transport layer, and a layer containing a material with a high hole-injection property. Examples of the material with a high hole-injection property include an aromatic amine compound and a composite material containing a hole-transport material and an acceptor material (electron-accepting material).

The hole-transport layer is a layer transporting holes, which are injected from an anode by a hole-injection layer, to a light-emitting layer. The hole-transport layer is a layer containing a hole-transport material. As the hole-transport material, a substance having a hole mobility greater than or equal to $1\times10^{-6}$ $cm^2/Vs$ is preferable. Note that other substances can also be used as long as they have a property of transporting more holes than electrons. As the hole-transport material, materials having a high hole-transport property, such as a n-electron rich heteroaromatic compound (e.g., a carbazole derivative, a thiophene derivative, and a furan derivative) and an aromatic amine (a compound having an aromatic amine skeleton), are preferable.

The electron-transport layer is a layer transporting electrons, which are injected from a cathode by an electron-injection layer, to a light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a n-electron deficient heteroaromatic compound such as a nitrogen-containing heteroaromatic compound.

The electron-injection layer is a layer injecting electrons from a cathode into an electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

As the electron-injection layer, for example, an alkali metal, an alkaline earth metal, or a compound thereof, such as lithium, cesium, ytterbium, lithium fluoride (LiF), cesium fluoride (CsF), calcium fluoride (CaFx; X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used. The electron-injection layer may have a stacked-layer structure of two or more layers. In the stacked-layer structure, for example, lithium fluoride can be used for the first layer and ytterbium can be used for the second layer.

Alternatively, as the above-described electron-injection layer, an electron-transport material may be used. For example, a compound having an unshared electron pair and having an electron deficient heteroaromatic ring can be used as the electron-transport material. Specifically, a compound with at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino [2,3-a: 2',3 '-c]phenazine (abbreviation: HATNA), or 2,4,6-tris[3'-(pyridin-3-yl)biphenyl-3-yl]-1,3,5-triazine (abbreviation: TmPPPyTz) can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex—Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be smoothly transferred and light emission can be efficiently obtained. With this structure, high efficiency, low-voltage driving, and a long lifetime of the light-emitting element can be achieved at the same time.

For example, the intermediate layer can be favorably formed using a material that can be used for the electron-injection layer, such as lithium fluoride. As another example, the intermediate layer can be favorably formed using a material that can be used for the hole-injection layer. A layer containing a hole-transport material and an acceptor material (electron-accepting material) can be used as the intermediate layer. A layer containing an electron-transport material and a donor material can be used as the intermediate layer. Forming the intermediate layer including such a layer can suppress an increase in the driving voltage that would be caused by stacking light-emitting units.

There is no particular limitation on the light-emitting material of the light-emitting layer in the light-emitting apparatus 500 illustrated in FIG. 1A. For example, in the light-emitting apparatus 500 illustrated in FIG. 1A, the structure is made such that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a fluorescent material, the light-emitting layer 523G included in the light-emitting unit 512G_2 contains a fluorescent material, the light-emitting layer 523B included in the light-emitting unit 512B_1 contains a fluorescent material, and the light-emitting layer 523B included in the light-emitting unit 512B_2 contains a fluorescent material.

Alternatively, in the light-emitting apparatus 500 illustrated in FIG. 1A, the structure is made such that the light-emitting layer 523R included in the light-emitting unit 512R_1 contains a phosphorescent material, the light-emitting layer 523R included in the light-emitting unit 512R_2 contains a phosphorescent material, the light-emitting layer 523G included in the light-emitting unit 512G_1 contains a phosphorescent material, the light-emitting layer 523G included in the light-emitting unit 512G_2 contains a phosphorescent material, the light-emitting layer 523B included in the light-emitting unit 512B_1 contains a fluorescent material, and the light-emitting layer 523B included in the light-emitting unit 512B_2 contains a fluorescent material.

Note that in the display device of one embodiment of the present invention, all the light-emitting layers of the light-emitting apparatus 500 illustrated in FIG. 1A may contain fluorescent materials or all the light-emitting layers of the light-emitting apparatus 500 illustrated in FIG. 1A may contain phosphorescent materials.

Alternatively, in the display device of one embodiment of the present invention, the light-emitting apparatus 500 illustrated in FIG. 1A may employ a structure in which the light-emitting layer 523R included in the light-emitting unit 512R_1 contains a phosphorescent material and the light-emitting layer 523R included in the light-emitting unit 512R_2 contains a fluorescent material, or a structure in which the light-emitting layer 523R included in the light-emitting unit 512R_1 contains a fluorescent material and the light-emitting layer 523R included in the light-emitting unit 512R_2 contains a phosphorescent material, i.e., a structure in which a light-emitting layer in a first unit and a light-emitting layer in a second unit contain different light-emitting materials. Note that here, the light-emitting unit 512R_1 and the light-emitting unit 512R_2 are described, and the same structure can also be applied to the light-emitting unit 512G_1 and the light-emitting unit 512G_2, and the light-emitting unit 512B_1 and the light-emitting unit 512B_2.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, a structure example of a display device of one embodiment of the present invention and an example of a method for fabricating the display device will be described. One embodiment of the present invention is a display device including a light-emitting element (also referred to as a light-emitting device). The display device includes at least two light-emitting elements that emit light of different colors. The light-emitting elements each include a pair of electrodes and an EL layer between them. The light-emitting elements are preferably organic EL elements (organic electroluminescent elements). The two or more light-emitting elements that exhibit different colors include EL layers containing different materials. For example, three kinds of light-emitting elements emitting light of red (R), green (G), and blue (B) are included, whereby a full-color display device can be achieved.

Here, as a way of forming part or whole of EL layers separately between light-emitting elements of different colors, an evaporation method using a shadow mask such as a metal mask is known. However, this method causes a deviation from the designed shape and position of an island-shaped organic film due to various influences such as the accuracy of the metal mask, the positional deviation between the metal mask and a substrate, a warp of the metal mask, and the vapor-scattering-induced expansion of the outline of the deposited film; accordingly, it is difficult to achieve high resolution and a high aperture ratio of a display device. Thus, a measure has been taken for pseudo improvement in resolution (also referred to as a pixel density) by employing a unique pixel arrangement method such as PenTile arrangement, for example.

In one embodiment of the present invention, fine patterning of an EL layer is performed without a shadow mask such as a metal mask. This allows fabrication of a display device with high resolution and a high aperture ratio that has been difficult to achieve. Moreover, EL layers can be formed separately, enabling the display device to perform extremely clear display with high contrast and high display quality.

In this specification and the like, a device fabricated using a metal mask or an FMM (fine metal mask) may be referred to as a device having an MM (metal mask) structure. In this specification and the like, a device fabricated without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display device.

One embodiment of the present invention employs an EL layer having a tandem structure (also referred to as a stack structure) in which light-emitting units are stacked with an intermediate layer therebetween. This can reduce current necessary for emitting light with the same luminance as compared with a structure in which one light-emitting unit is included; thus, the power consumption can be reduced and the deterioration is significantly inhibited. Furthermore, luminance obtained with the same amount of current can be increased significantly, so that one embodiment of the present invention can be favorably used in an electronic device that is required to have high luminance.

Here, description is made on the case where EL layers in light-emitting elements of two colors are separately formed, for simplicity. First, a stack of a first EL film and a first mask film (also referred to as a sacrificial film) is formed to cover two pixel electrodes. Next, a resist mask is formed over the first mask film in a position overlapping with one pixel electrode (a first pixel electrode). Then, part of the first mask film and part of the first EL film are etched. At this time, the etching is stopped when the other pixel electrode (a second pixel electrode) is exposed. Thus, part of the first EL film processed into a belt-like or island shape (also referred to as a first EL layer) can be formed over the first pixel electrode, and part of the mask film (also referred to as a first mask layer or a first sacrificial layer) can be formed thereover.

Next, a stack of a second EL film and a second mask film is formed. Then, a resist mask is formed in a position overlapping with the second pixel electrode. Then, part of the second sacrificial film and part of the second EL film that do not overlap with the resist mask are etched in a manner similar to the above. As a result, the first EL layer and the first mask layer) are provided over the first pixel electrode, and a second EL layer and a second mask layer (also referred to as a second sacrificial layer) are provided over the second pixel electrode. In this manner, the first EL layer and the second EL layer can be formed separately. Finally, the first mask layer and the second mask layer are removed to expose the first EL layer and the second EL layer and then a common electrode is formed, whereby light-emitting elements of two colors can be formed separately.

Furthermore, by repeating the above-described steps, EL layers in light-emitting elements of three or more colors can be separately formed; accordingly, a display device including light-emitting elements of three colors or four or more colors can be achieved.

Here, an electrode (also referred to as a first electrode, a connection electrode, or the like), which is to supply a potential to the common electrode, can be formed on the same surface as the pixel electrode, whereby the connection electrode is electrically connected to the common electrode. The connection electrode is located outside the display portion including the pixels. In order to prevent a top surface of the connection electrode from being exposed in etching of the first EL film, it is preferable that the first mask layer be also provided over the connection electrode. Also in etching of the second EL film, the second mask layer is preferably provided over the connection electrode. The first and second mask layers provided over the connection electrode can be removed by etching concurrently with the first and second mask layers over the first and second EL layers.

It is difficult to set the distance between the EL layers for different colors to be less than 10 μm with a formation method using a metal mask, for example; however, with the use of the above method, the distance can be decreased to 3 μm or less, 2 μm or less, or 1 μm or less. For example, with the use of an exposure apparatus for LSI, the distance can be decreased to 500 nm or less, 200 nm or less, 100 nm or less, or 50 nm or less. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, a pattern of the EL layer itself can be made extremely smaller than that in the case of using a metal mask. For example, in the case of using a metal mask for forming EL layers separately, a variation in the thickness of the pattern occurs between the center and the edge of the pattern, which causes a reduction in an effective area that can be used as a light-emitting region with respect to the entire pattern area. By contrast, in the above fabrication method, a pattern is formed by processing a film deposited to have a uniform thickness, which enables a uniform thickness in the pattern; thus, even with a fine pattern, almost the entire area can be used as a light-emitting region. Therefore, the above fabrication method makes it possible to achieve both high resolution and a high aperture ratio.

Furthermore, an insulating layer is preferably provided between the two adjacent pixel electrodes. The insulating layer is provided to cover the end portions of the pixel electrodes. A region positioned on the pixel electrode and covered with the insulating layer does not function as a light-emitting region of the light-emitting element; therefore, the narrower the region where the insulating layer and the pixel electrode overlap is, the higher an effective light-emitting area ratio i.e., an aperture ratio of the display device can be.

An end portion (side surface) of the EL layer is positioned on the insulating layer. At this time, end portions (side surfaces) of two EL layers are provided to face each other. The narrower the interval between the two EL layers is, the smaller the width of the insulating layer can be; whereby an aperture ratio of the display device can be improved.

As described above, with the above fabrication method, a display device in which minute light-emitting elements are integrated can be obtained, and it is not necessary to conduct a pseudo improvement in resolution with a unique pixel arrangement method such as PenTile arrangement, for example. Therefore, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called stripe arrangement where R, G, and B are arranged in one direction. Furthermore, the display device can achieve the effective light-emitting area ratio (aperture ratio) higher than or equal to 50%, higher than or equal to 60%, or higher than or equal to 70%, and lower than 100%.

In this specification and the like, the effective light-emitting area ratio refers to a proportion of the area of a region that can be regarded as a light-emitting region in one pixel in the area of one pixel calculated from a repeated pixel pitch in a display device.

More specific structure examples and fabrication method examples of a display device of one embodiment of the present invention will be described below with reference to drawings.

Structure Example 1

Figure 5A:
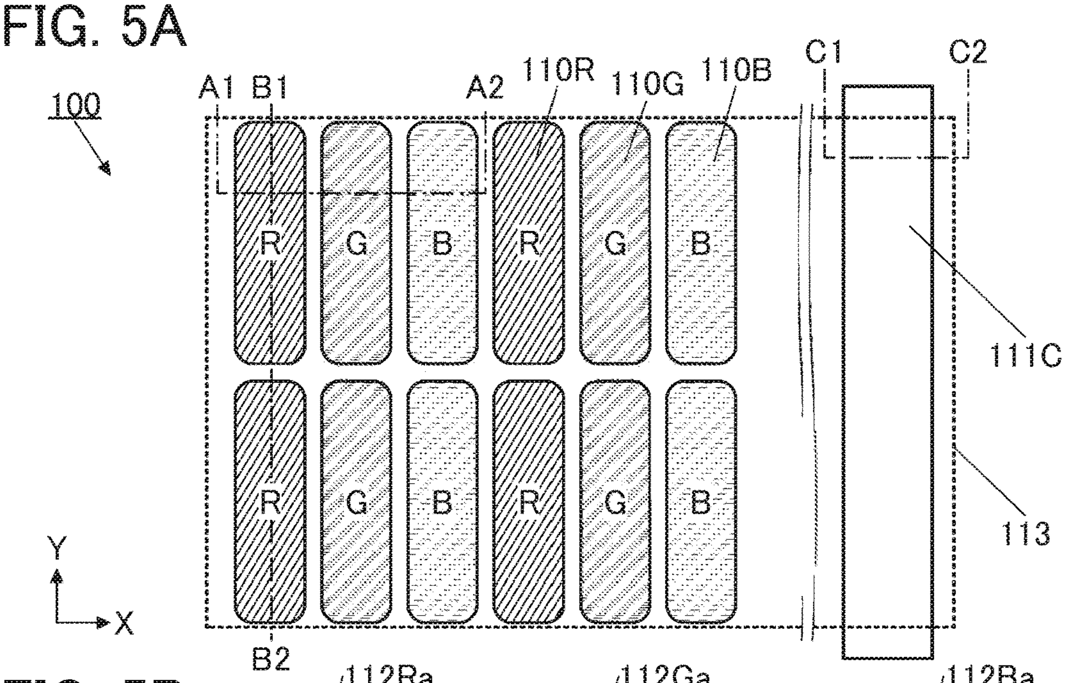
FIG. 5A to FIG. 5D are diagrams illustrating a structure example of a display device.

FIG. 5A is a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 5A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 5A illustrates what is called stripe arrangement, in which the light-emitting elements of the same color are arranged in one direction. Note that the arrangement method of the light-emitting elements is not limited thereto; another arrangement method such as delta arrangement, zigzag arrangement, or PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

As the light-emitting elements 110R, the light-emitting elements 110G, and the light-emitting elements 110B, EL elements such as OLEDs (Organic Light Emitting Diodes) or QLEDs (Quantum-dot Light Emitting Diodes) are preferably used. Examples of a light-emitting substance contained in the EL element include a substance that emits fluorescent light (a fluorescent material), a substance that emits phosphorescent light (a phosphorescent material), a substance that exhibits thermally activated delayed fluorescence (a thermally activated delayed fluorescent (TADF) material), and an inorganic compound (a quantum dot material). As the light-emitting substance contained in the EL element, not only organic compounds but also inorganic compounds (e.g., quantum dot materials) can be used.

Figure 5B:
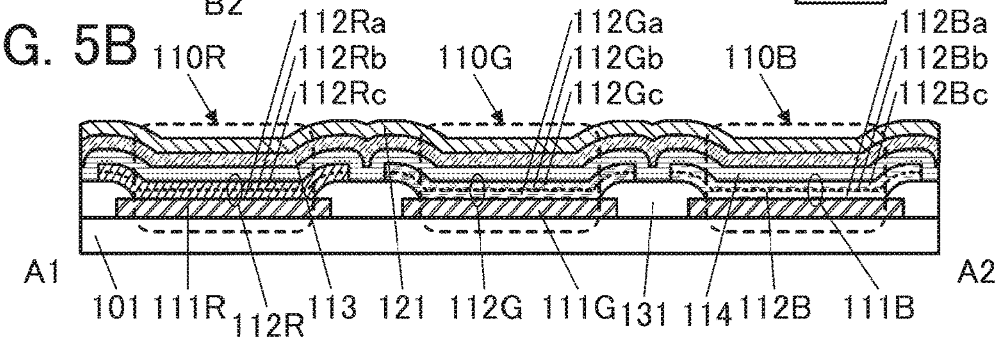
Figure 5C:
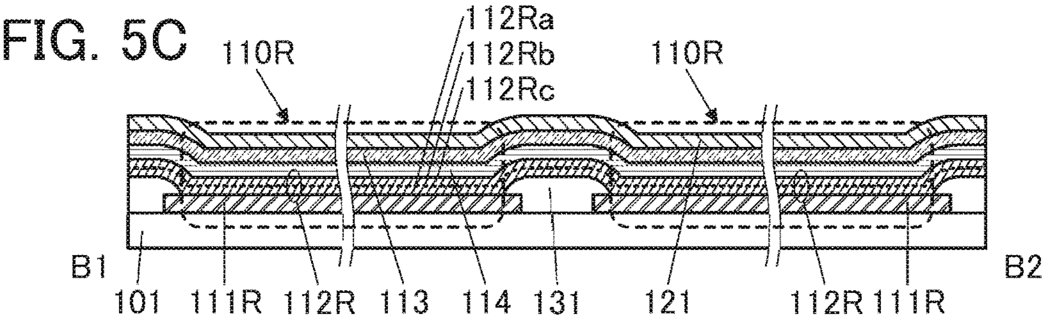

FIG. 5B is a schematic cross-sectional view taken along the dashed-dotted line A1-A2 in FIG. 5A, and FIG. 5C is a schematic cross-sectional view taken along the dashed-dotted line B1-B2.

FIG. 5B illustrates cross sections of the light-emitting element 110R, the light-emitting element 110G, and the light-emitting element 110B. The light-emitting element 110R includes a pixel electrode 111R, an EL layer 112R, an EL layer 114, and a common electrode 113. The light-emitting element 110G includes a pixel electrode 111G, an EL layer 112G, the EL layer 114, and the common electrode 113. The light-emitting element 110B includes a pixel electrode 111B, an EL layer 112B, the EL layer 114, and the common electrode 113. The EL layer 114 and the common electrode 113 are shared by the light-emitting element 110R, the light-emitting element 110G, and the light-emitting element 110B. The EL layer 114 can also be referred to as a common layer.

The EL layer 112R included in the light-emitting element 110R contains at least a light-emitting organic compound that emits light with intensity in a red wavelength range. The EL layer 112G included in the light-emitting element 110G contains at least a light-emitting organic compound that emits light with intensity in a green wavelength range. The EL layer 112B included in the light-emitting element 110B contains at least a light-emitting organic compound that emits light with intensity in a blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer). The EL layer 114 does not necessarily include the light-emitting layer. For example, the EL layer 114 includes one or more of an electron-injection layer, an electron-transport layer, a hole-injection layer, and a hole-transport layer.

Here, a light-emitting element having a tandem structure that is described in Embodiment 1 can be used as the light-emitting element 110R, the light-emitting element 110G, and the light-emitting element 110B.

Here, an example of the case of employing a light-emitting element having a two-unit tandem structure in which two light-emitting units are stacked is described. The EL layer 112R included in the light-emitting element 110 includes a light-emitting unit 112Ra, an intermediate layer 112Rb, and a light-emitting unit 112Rc. In FIG. 5B and FIG. 5C, the light-emitting unit 112Ra and the light-emitting unit 112Rc are denoted with the same hatching pattern and the intermediate layer 112Rb is denoted with the dashed line. Similarly, the EL layer 112G includes a light-emitting unit 112Ga, an intermediate layer 112Gb, and a light-emitting unit 112Gc and the EL layer 112B includes a light-emitting unit 112Ba, an intermediate layer 112Bb, and a light-emitting unit 112Bc.

Although not shown here, an insulating layer functioning as a sidewall protective layer may be provided in contact with side surfaces of the EL layer 112R, the EL layer 112G, and the EL layer 112B.

The pixel electrode 111R, the pixel electrode 111G, and the pixel electrode 111B are provided for the respective light-emitting elements. The common electrode 113 and the EL layer 114 is provided as a continuous layer shared by the light-emitting elements. A conductive film that has a property of transmitting visible light is used for either the respective pixel electrodes or the common electrode 113, and a reflective conductive film is used for the other. The light-transmitting pixel electrodes and the reflective common electrode 113 offer a bottom-emission display device, whereas the reflective pixel electrodes and the light-transmitting common electrode 113 offer a top-emission display device. Note that when both the pixel electrodes and the common electrode 113 transmit light, a dual-emission display device can be obtained.

An insulating layer 131 is provided to cover the end portions of the pixel electrode 111R, the pixel electrode 111G, and the pixel electrode 111B. The end portions of the insulating layer 131 are preferably tapered. Note that the insulating layer 131 is not necessarily provided when not needed. Note that in this specification and the like, an end portion of an object having a tapered shape indicates that the end portion has a cross-sectional shape in which the angle between a surface of the object and a formation surface of the object is greater than 0° and less than 90° preferably, greater than or equal to 5° and less than or equal to 70° in a region of the end portion, and the thickness continuously increases from the end portion.

The EL layer 112R, the EL layer 112G, and the EL layer 112B each include a region in contact with the top surface of the pixel electrode and a region in contact with the surface of the insulating layer 131. The end portions of the EL layer 112R, the EL layer 112G, and the EL layer 112B are positioned over the insulating layer 131.

As illustrated in FIG. 5B, there is a gap between the two EL layers of the light-emitting elements with different colors. In this manner, the EL layer 112R, the EL layer 112G, and the EL layer 112B are preferably provided so as not to be in contact with each other. This can suitably prevent unintentional light emission due to current flowing through the two adjacent EL layers. As a result, the contrast can be increased to achieve a display device with high display quality.

The EL layer 112R is formed into a belt-like shape so as to be continuous in the Y direction as illustrated in FIG. 5C. When the EL layer 112R and the like are formed into a belt-like shape, a space for dividing them is unnecessary and the area of a non-light-emitting region between the light-emitting elements can be reduced, so that the aperture ratio can be increased. Note that FIG. 5C illustrates the cross section of the light-emitting element 110R as an example; the light-emitting element 110G and the light-emitting element 110B can have a similar shape.

A protective layer 121 is provided over the common electrode 113 to cover the light-emitting element 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as an indium gallium oxide or an indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. This structure enables the top surface of the organic insulating film to be flat, and accordingly, coverage with the inorganic insulating film thereover is improved, leading to an improvement in barrier properties. Moreover, this structure is preferable because when a component (e.g., a color filter, an electrode of a touch sensor, a lens array, or the like) is provided above the protective layer 121, the flat top surface of the protective layer 121 allows the component to be less affected by an uneven shape caused by the lower components.

FIG. 5A also illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 5A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, a top surface of the connection electrode 111C can have a belt-like shape, an L shape, a square bracket shape, a quadrangular shape, or the like.

Figure 5D:
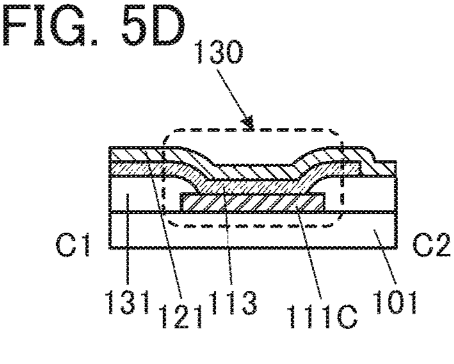

FIG. 5D is a schematic cross-sectional view taken along the dashed-dotted line C1-C2 in FIG. 5A. FIG. 5D illustrates a connection portion 130 in which the connection electrode 111C is electrically connected to the common electrode 113.

In the connection portion 130, the common electrode 113 is provided on and in contact with the connection electrode 111C and the protective layer 121 is provided to cover the common electrode 113. The insulating layer 131 is provided to cover end portions of the connection electrode 111C.

Fabrication Method Example 1

Figure 6A:
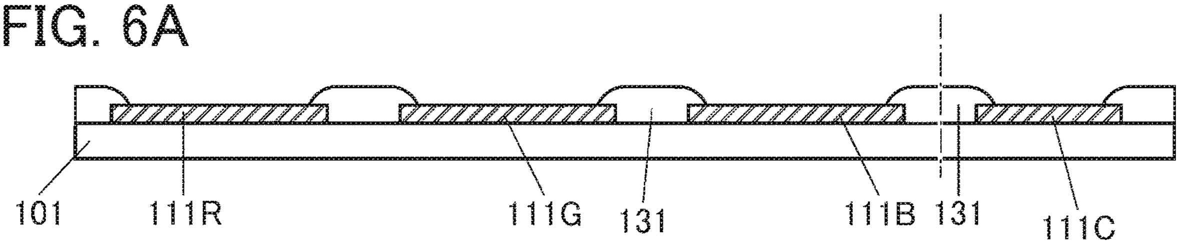
FIG. 6A to FIG. 6F are diagrams illustrating an example of a method for fabricating a display device.

An example of a method for fabricating the display device of one embodiment of the present invention will be described below with reference to drawings. Description here is made using the display device 100 described in the above structure example as an example. FIG. 6A to FIG. 7F are schematic cross-sectional views in steps of the method for fabricating the display device described below. In FIG. 6A and the like, the schematic cross-sectional views of the connection portion 130 and the periphery thereof are also illustrated on the right side.

Note that thin films that constitute the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. An example of a thermal CVD method is a metal organic chemical vapor deposition (MOCVD) method.

Alternatively, thin films that constitute the display device (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, or a knife coater.

The thin films constituting the display device can be processed by a photolithography method or the like. Besides, a nanoimprinting method, a sandblasting method, a lift-off method, or the like may be used for the processing of the thin films. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or combined light of any of them. Alternatively, ultraviolet light, KrF laser light, ArF laser light, or the like can be used. Exposure may be performed by liquid immersion exposure technique. As the light for the exposure, extreme ultraviolet (EUV) light, X-rays, or the like maybe used. Furthermore, instead of the light for the exposure, an electron beam can be used. It is preferable to use extreme ultraviolet light, X-rays, or an electron beam because extremely minute processing can be performed. Note that a photomask is not needed when exposure is performed by scanning with a beam such as an electron beam.

For etching of the thin film, a dry etching method, a wet etching method, a sandblasting method, or the like can be used.

[Preparation for Substrate 101]

As a substrate 101, a substrate having at least heat resistance high enough to withstand heat treatment performed later can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate or a polycrystalline semiconductor substrate using silicon, silicon carbide, or the like, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrodes 111R, 111G, 111B and Connection Electrode 111C]

Next, the pixel electrode 111R, the pixel electrode 111G, the pixel electrode 111B, and the connection electrode 111C are formed over the substrate 101. First, a conductive film to be the pixel electrodes and the connection electrode is deposited, a resist mask is formed by a photolithography method, and an unnecessary portion of the conductive film is removed by etching. After that, the resist mask is removed to form the pixel electrode 111R, the pixel electrode 111G, the pixel electrode 111B, and the connection electrode 111C.

In the case where a conductive film that has a property of reflecting visible light is used as each of the pixel electrodes, it is preferable to use a material having as high reflectance as possible in the whole wavelength range of visible light (e.g., silver or aluminum). This can increase color reproducibility as well as light extraction efficiency of the light-emitting elements.

[Formation of Insulating Layer 131]

Next, the insulating layer 131 is formed to cover the end portions of the pixel electrode 111R, the pixel electrode 111G, the pixel electrode 111B, and the connection electrode 111C (FIG. 6A). An organic insulating film or an inorganic insulating film can be used for the insulating layer 131. The end portions of the insulating layer 131 are preferably tapered to improve step coverage with an EL film formed later. In particular, when an organic insulating film is used, a photosensitive material is preferably used so that the shapes of the end portions can be easily controlled by the conditions of light exposure and development.

[Formation of EL Film 112Rf]

Subsequently, an EL film 112Rf to be the EL layer 112R later is deposited over the pixel electrode 111R, the pixel electrode 111G, the pixel electrode 111B, and the insulating layer 131.

The EL film 112Rf includes at least a film containing a light-emitting compound. Besides, a structure in which one or more of films functioning as an electron-injection layer, an electron-transport layer, a charge-generation layer, a hole-transport layer, and a hole-injection layer are stacked may be employed. The EL film 112Rf can be formed by, for example, an evaporation method, a sputtering method, an inkjet method, or the like. Without limitation to this, the above-described deposition method can be used as appropriate.

For example, the EL film 112Rf is preferably a stacked film in which a hole-injection layer, a hole-transport layer, a light-emitting layer, and an electron-transport layer are stacked in this order. In that case, a film including the electron-injection layer can be used as the EL layer 114 formed later. In particular, by providing an electron-transport layer covering the light-emitting layer, damage to the light-emitting layer caused by a subsequent photolithography step or the like can be inhibited; thus, a light-emitting element with high reliability can be fabricated. Furthermore, by using layers containing the same organic compound for an electron-transport layer used for the EL film 112Rf or the like and an electron-injection layer used for the EL layer 114 formed later, these bonding can be favorable and a light-emitting element with high emission efficiency and high reliability can be obtained. For example, an organic compound with an electron-transport property can be used for the electron-transport layer, and a material containing the organic compound and a metal can be used for an electron-injection layer.

The EL film 112Rf is preferably formed so as not to be provided over the connection electrode 111C. For example, in the case where the EL film 112Rf is formed by an evaporation method (or a sputtering method), it is preferable that the EL film 112Rf be formed using a shielding mask so as not to be formed over the connection electrode 111C.

[Formation of Mask Film 144*a*]

Next, a mask film 144*a* is formed to cover the EL film 112Rf. The mask film 144*a* is provided in contact with a top surface of the connection electrode 111C.

As the mask film 144*a*, it is possible to use a film highly resistant to etching treatment performed on the EL films such as the EL film 112Rf, i.e., a film having high etching selectivity. Furthermore, as the mask film 144*a*, it is possible to use a film having high etching selectivity with respect to a protective film such as a protective film 146*a* described later. Moreover, as the mask film 144*a*, it is possible to use a film that can be removed by wet etching method causing less damage to the EL films.

The mask film 144*a* can be formed using an inorganic film such as a metal film, an alloy film, a metal oxide film, a semiconductor film, or an inorganic insulating film, for example. The mask film 144*a* can be formed by any of a variety of deposition methods such as a sputtering method, an evaporation method, a CVD method, and an ALD method. In particular, the mask film 144*a* that is formed directly on the EL film 112Rf is preferably formed by an ALD method, which causes little damage on a formation layer.

For example, a metal material such as gold, silver, platinum, magnesium, nickel, tungsten, chromium, molybdenum, iron, cobalt, copper, palladium, titanium, aluminum, yttrium, zirconium, and tantalum, or an alloy material containing the metal material can be used as the mask film 144*a*. It is particularly preferable to use a low-melting-point material such as aluminum or silver.

Alternatively, the mask film 144*a* can be formed using a metal oxide such as an indium-gallium-zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Moreover, indium tin oxide containing silicon can also be used, for example.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

Alternatively, the mask film 144*a* can be formed using an inorganic insulating material such as aluminum oxide, hafnium oxide, or silicon oxide.

The mask film 144*a* is preferably formed using a material that can be dissolved in a solvent chemically stable with respect to at least the uppermost film of the EL film 112Rf. In particular, a material that will be dissolved in water or alcohol can be suitably used for the mask film 144*a*. In deposition of the mask film 144*a*, it is preferable that application of such a material dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of a wet deposition method that can be employed for forming the mask film 144*a* include spin coating, dipping, spray coating, ink-jetting, dispensing, screen printing, offset printing, a doctor knife method, a slit coating, a roll coating, a curtain coating, a knife coating, or the like.

As the mask film 144*a*, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Protective Film 146*a*]

Figure 6B:
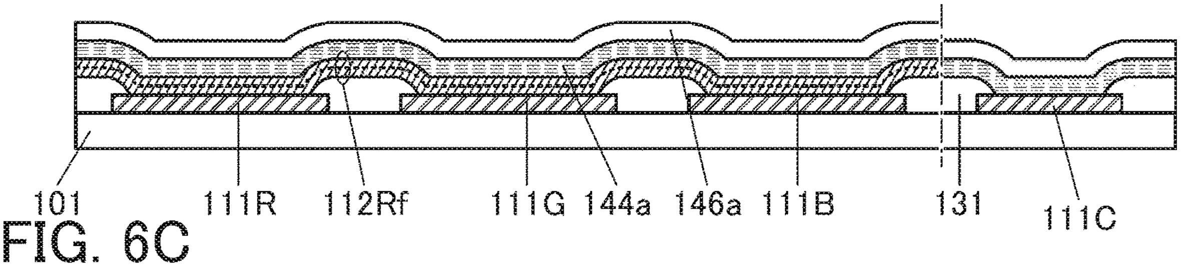

Next, the protective film 146*a* is formed over the mask film 144*a* (FIG. 6B).

The protective film 146*a* is a film used as a hard mask when the mask film 144*a* is etched later. In a later step of processing the protective film 146*a*, the mask film 144*a* is exposed. Thus, the combination of films having high etching selectivity therebetween is selected for the mask film 144*a* and the protective film 146*a*. It is thus possible to select a film that can be used for the protective film 146*a* depending on an etching condition of the mask film 144*a* and an etching condition of the protective film 146*a*.

For example, in the case where dry etching using a gas containing fluorine (also referred to as a fluorine-based gas) is used for the etching of the protective film 146*a*, silicon, silicon nitride, silicon oxide, tungsten, titanium, molybdenum, tantalum, tantalum nitride, an alloy containing molybdenum and niobium, an alloy containing molybdenum and tungsten, or the like can be used for the protective film 146*a*. Here, for example, a film of a metal oxide such as IGZO or ITO is given as a film having high etching selectivity (i.e., enabling low etching rate) in dry etching using the fluorine-based gas, and such a film can be used as the mask film 144*a*.

Without being limited to the above, a material of the protective film 146*a* can be selected from a variety of materials depending on an etching condition of the mask film 144*a* and an etching condition of the protective film 146*a*. For example, any of the films that can be used as the mask film 144*a* can be used.

As the protective film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the protective film 146*a*, an oxide film and an oxynitride film can also be used. Typically, an oxide film or an oxynitride film such as silicon oxide, silicon oxynitride, aluminum oxide, aluminum oxynitride, hafnium oxide, or hafnium oxynitride can be used.

For example, it is preferable that an inorganic insulating material such as aluminum oxide, hafnium oxide, or silicon oxide formed by an ALD method and a metal oxide containing indium such as indium gallium zinc oxide (also referred to as In—Ga—Zn oxide or IGZO) formed by a sputtering method be used as the mask film 144*a* and the protective film 146*a*, respectively.

Alternatively, as the protective film 146*a*, an organic film that can be used as the EL film 112Rf or the like can be used. For example, the organic film that is used as the EL film 112Rf, an EL film 112Gf, or an EL film 112Bf can be used as the protective film 146*a*. The use of such an organic film is preferable, in which case the deposition apparatus for the EL film 112Rf or the like can be used in common.

[Formation of Resist Mask 143*a*]

Figure 6C:
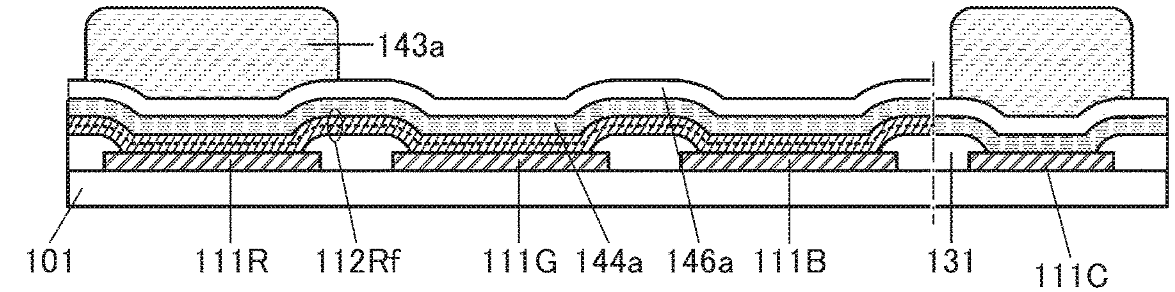

Then, over the protective film 146*a*, a resist mask 143*a* is formed in each of a position overlapping with the pixel electrode 111R and a position overlapping with the connection electrode 111C (FIG. 6C).

For the resist mask 143*a*, a resist material containing a photosensitive resin such as a positive type resist material or a negative type resist material can be used.

Here, in the case where the protective film 146*a* is not provided and the resist mask 143*a* is formed over the mask film 144*a*, if a defect such as a pinhole exists in the mask film 144*a*, there is a risk of dissolving the EL film 112Rf because of a solvent of the resist material. The use of the protective film 146*a* can prevent such a defect.

Note that in the case where a film that is unlikely to cause a defect such as a pinhole is used as the mask film 144*a*, the resist mask 143*a* may be formed directly on the mask film 144*a* without using the protective film 146*a*.

[Etching of Protective Film 146*a*]

Next, part of the protective film 146*a* that is not covered with the resist mask 143*a* is removed by etching, so that a belt-shaped protective layer 147*a* is formed. At that time, the protective layer 147*a* is formed also over the connection electrode 111C.

In the etching of the protective film 146*a*, an etching condition with high selectivity is preferably employed so that the mask film 144*a* is not removed by the etching. Either wet etching or dry etching can be performed for the etching of the protective film 146*a*; with the use of dry etching, a shrinkage of the pattern of the protective film 146*a* can be inhibited.

[Removal of Resist Mask 143*a*]

Figure 6D:
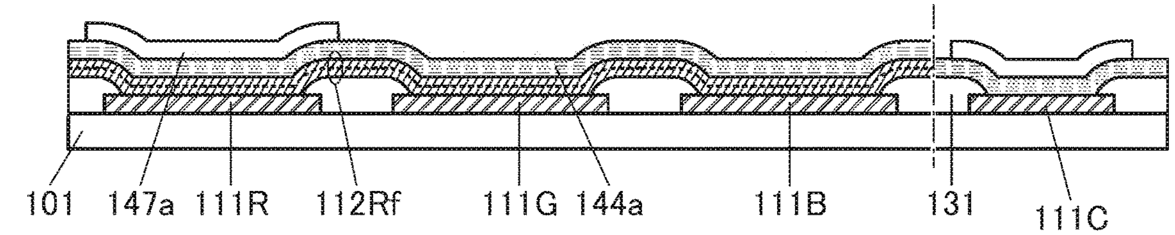

Next, the resist mask 143*a* is removed (FIG. 6D).

The removal of the resist mask 143*a* can be performed by wet etching or dry etching. It is particularly preferable to perform dry etching (also referred to as plasma ashing) using an oxygen gas as an etching gas to remove the resist mask 143*a*.

At this time, the removal of the resist mask 143*a* is performed in a state where the EL film 112Rf is covered with the mask film 144*a*; thus, the EL film 112Rf is less likely to be affected by the removal. This is particularly suitable in the case where etching using an oxygen gas, such as plasma ashing, is performed because when the EL film 112Rf is exposed to oxygen, the electrical characteristics are adversely affected in some cases.

[Etching of Mask Film 144*a*]

Figure 6E:
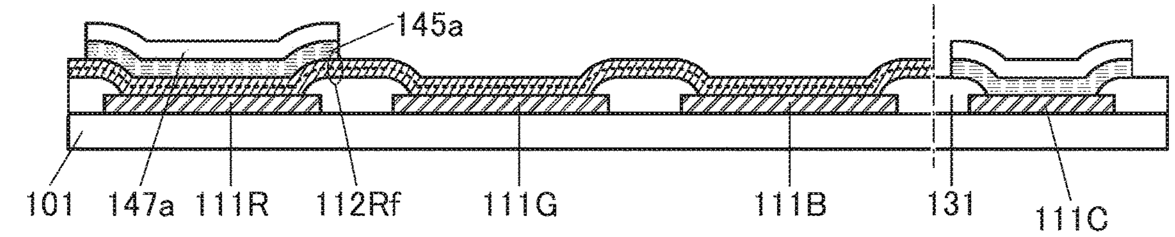

Next, part of the mask film 144*a* that is not covered with the protective layer 147*a* is removed by etching with the use of the protective layer 147*a* as a mask, so that a belt-shaped mask layer 145*a* is formed (FIG. 6E). At that time, the mask layer 145*a* is formed also over the connection electrode 111C.

Either wet etching or dry etching can be performed for the etching of the mask film 144*a*; the use of dry etching method is preferable, in which case a shrinkage of the pattern can be inhibited.

[Etching of EL Film 112Rf and Protective Layer 147*a*]

Figure 6F:
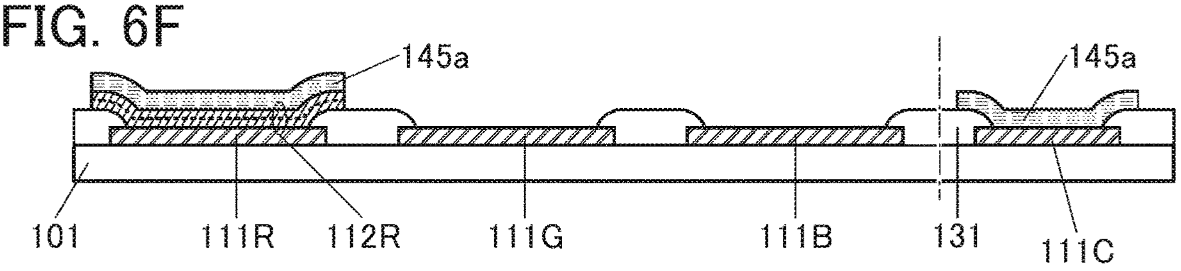

Next, part of the EL film 112Rf that is not covered with the mask layer 145*a* is removed by etching at the same time as etching of the protective layer 147*a*, whereby the belt-shaped EL layer 112R is formed (FIG. 6F). At that time, the protective layer 147*a* over the connection electrode 111C is also removed.

The EL film 112Rf and the protective layer 147*a* are preferably etched by the same treatment so that the process can be simplified to reduce the fabrication cost of the display device.

In particular, for the etching of the EL film 112Rf, it is preferable to perform dry etching using an etching gas that does not contain oxygen as its main component. This can inhibit the alteration of the EL film 112Rf to achieve a highly reliable display device. Examples of the etching gas that does not contain oxygen as its main component include $CF_4$, $C_4F_8$, $SF_6$, $CHF_3$, $Cl_2$, $H_2O$, $BCl_3$, $H_2$ and a noble gas such as He. Alternatively, a mixed gas of the above gas and a dilute gas that does not contain oxygen can be used as the etching gas.

Note that the etching of the EL film 112Rf and the etching of the protective layer 147*a* may be performed separately. In that case, either the etching of the EL film 112Rf or the etching of the protective layer 147*a* may be performed first.

At this step, the EL layer 112R and the connection electrode 111C are covered with the mask layer 145*a*.

[Formation of EL Film 112Gf]

Subsequently, the EL film 112Gf to be the EL layer 112G later is deposited over the mask layer 145*a*, the insulating layer 131, the pixel electrode 111G, and the pixel electrode 111B. At this time, similarly to the EL film 112Rf, the EL film 112Gf is preferably not provided over the connection electrode 111C.

Refer to the description of the EL film 112Rf for the formation method of the EL film 112Gf.

[Formation of Mask Film 144*b*]

Subsequently, a mask film 144*b* is formed over the EL film 112Gf. The mask film 144*b* can be formed in a manner similar to that for the mask film 144*a*. In particular, the mask film 144*b* is preferably formed using the same material as the mask film 144*a*.

At that time, the mask film 144*a* is formed also over the connection electrode 111C so as to cover the mask layer 145*a*.

[Formation of Protective Film 146*b*]

Subsequently, a protective film 146*b* is formed over the mask film 144*b*. The protective film 146*b* can be formed in a manner similar to that for the protective film 146*a*. In particular, the protective film 146*b* is preferably formed using the same material as the protective film 146*a*.

[Formation of Resist Mask 143*b*]

Figure 7A:
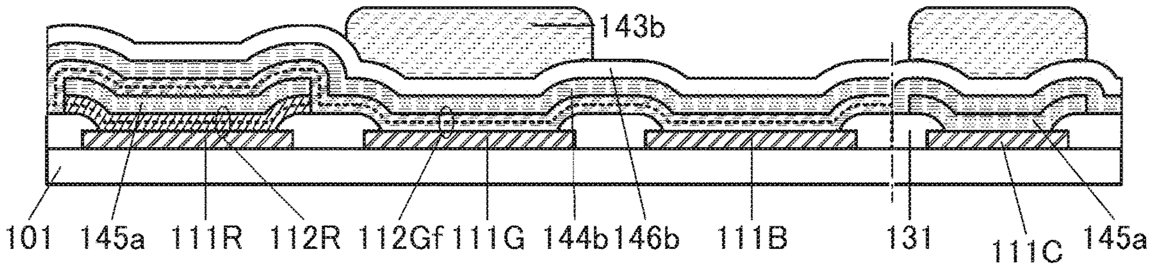
FIG. 7A to FIG. 7F are diagrams illustrating an example of a method for fabricating a display device.

Then, over the protective film 146*b*, a resist mask 143*b* is formed in a region overlapping with the pixel electrode 111G and a region overlapping with the connection electrode 111C (FIG. 7A).

The resist mask 143*b* can be formed in a manner similar to that for the resist mask 143*a*.

[Etching of Protective Film 146b]

Figure 7B:
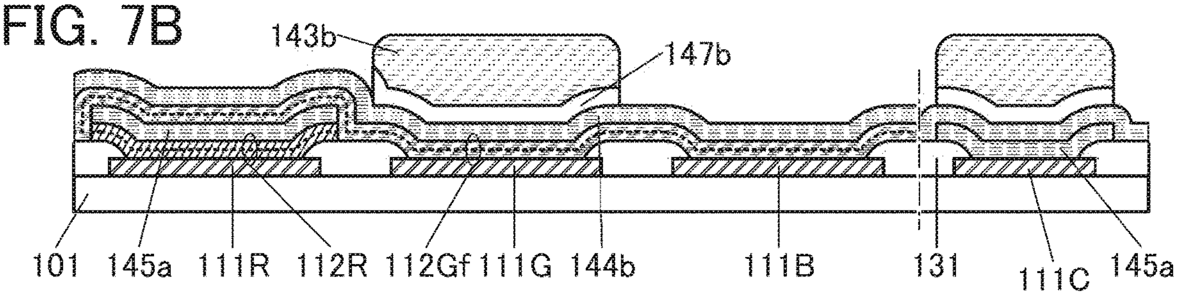

Next, part of the protective film 146b that is not covered with the resist mask 143b is removed by etching, so that a belt-shaped protective layer 147b is formed (FIG. 7B). At that time, the protective layer 147b is formed also over the connection electrode 111C.

Refer to the description of the protective film 146a for the etching of the protective film 146b.

[Removal of Resist Mask 143b]

Next, the resist mask 143a is removed. Refer to the description of the resist mask 143a for the removal of the resist mask 143b.

[Etching of Mask Film 144b]

Next, part of the mask film 144b that is not covered with the protective layer 147b is removed by etching with the use of the protective layer 147b as a mask, so that a belt-shaped mask layer 145b is formed. At that time, the mask layer 145b is formed also over the connection electrode 111C. The mask layer 145a and the mask layer 145b are stacked over the connection electrode 111C.

Refer to the description of the mask film 144a for the etching of the mask film 144b.

[Etching of EL Film 112Gf and Protective Layer 147b]

Figure 7C:
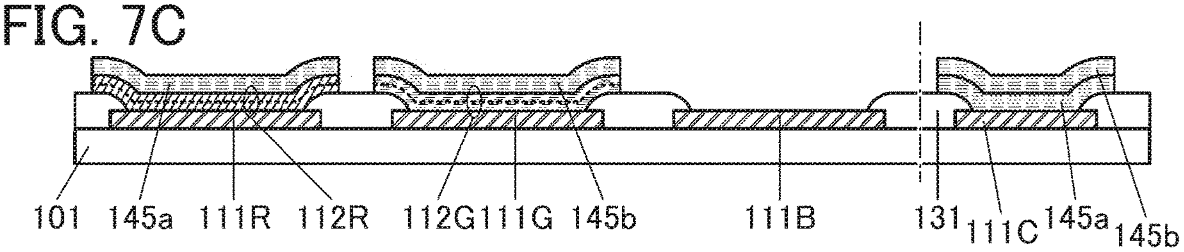

Next, part of the EL film 112Gf that is not covered with the mask layer 145b is removed by etching at the same time as etching of the protective layer 147b, whereby the belt-shaped EL layer 112G is formed (FIG. 7C). At that time, the protective layer 147b over the connection electrode 111C is also removed.

Refer to the description of the EL film 112Rf and the protective layer 147a for the etching of the EL film 112Gf and the protective layer 147b.

At this time, the EL layer 112R is protected by the mask layer 145a, and thus can be prevented from being damaged in the etching step of the EL film 112Gf.

In the above manner, the belt-shaped EL layer 112R and the belt-shaped EL layer 112G can be separately formed with high alignment accuracy.

[Formation of EL Layer 112B]

Figure 7D:
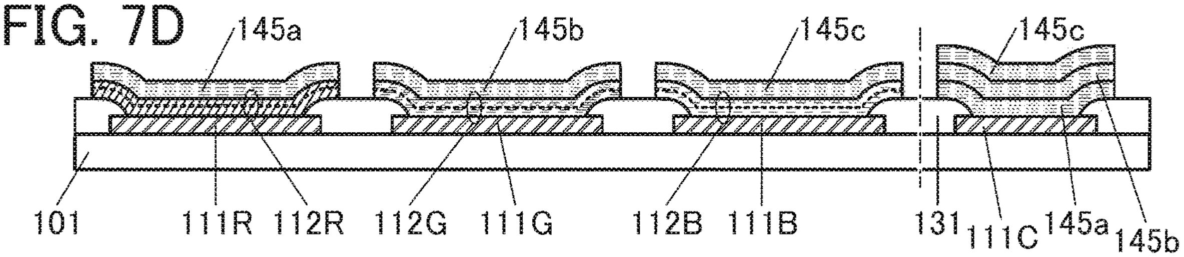

The above steps are performed on the EL film 112Bf (not illustrated), whereby the island-shaped EL layer 112B and an island-shaped mask layer 145c can be formed (FIG. 7D).

That is, after the EL layer 112G is formed, the EL film 112Bf, a mask film 144c, a protective film 146c, and a resist mask 143c (each of which is not illustrated) are sequentially formed. After that, the protective film 146c is etched to form a protective layer 147c (not illustrated); then, the resist mask 143c is removed. Subsequently, the mask film 144c is etched to form the mask layer 145c. Then, the protective layer 147c and the EL film 112Bf are etched to form the belt-shaped EL layer 112B.

After the EL layer 112B is formed, the mask layer 145c is concurrently formed also over the connection electrode 111C. The mask layer 145a, the mask layer 145b, and the mask layer 145c are stacked over the connection electrode 111C.

[Removal of Mask Layer]

Figure 7E:
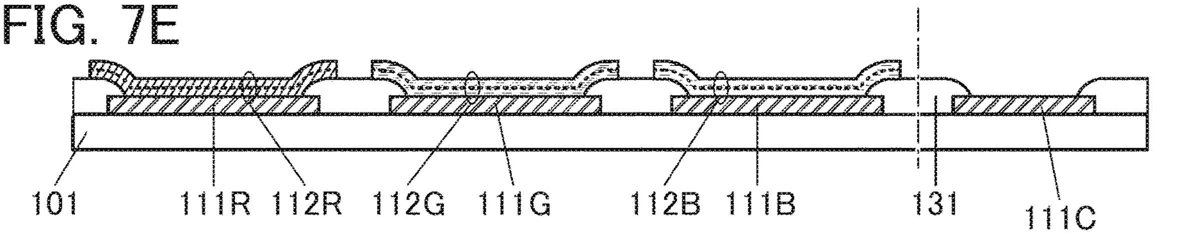

Next, the mask layer 145a, the mask layer 145b, and the mask layer 145c are removed to expose the top surfaces of the EL layer 112R, the EL layer 112G, and the EL layer 112B (FIG. 7E). At that time, the top surface of the connection electrode 111C is also exposed.

The mask layer 145a, the mask layer 145b, and the mask layer 145c can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using a tetramethyl ammonium hydroxide (TMAH) aqueous solution, diluted hydrofluoric acid, oxalic acid, phosphoric acid, acetic acid, nitric acid, or a mixed solution thereof is preferably performed.

Alternatively, the mask layer 145a, the mask layer 145b, and the mask layer 145c are preferably removed by being dissolved in a solvent such as water or alcohol. Here, as the alcohol in which the mask layer 145a, the mask layer 145b, and the mask layer 145c can be dissolved, any of various alcohols such as ethyl alcohol, methyl alcohol, isopropyl alcohol (IPA), and glycerin can be used.

After the mask layer 145a, the mask layer 145b, and the mask layer 145c are removed, drying treatment is preferably performed in order to remove water contained in the EL layer 112R, the EL layer 112G, and the EL layer 112B and water adsorbed on the surfaces of the EL layer 112R, the EL layer 112G, and the EL layer 112B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

In this manner, the EL layer 112R, the EL layer 112G, and the EL layer 112B can be formed separately.

[Formation of EL Layer 114]

Then, the EL layer 114 is deposited to cover the EL layer 112R, the EL layer 112G, and the EL layer 112B.

The EL layer 114 can be deposited in a manner similar to that of the EL film 112Rf or the like. In the case where the EL layer 114 is deposited by an evaporation method, the EL layer 114 is preferably deposited using a shielding mask so as not to be deposited over the connection electrode 111C.

[Formation of Common Electrode 113]

Figure 7F:
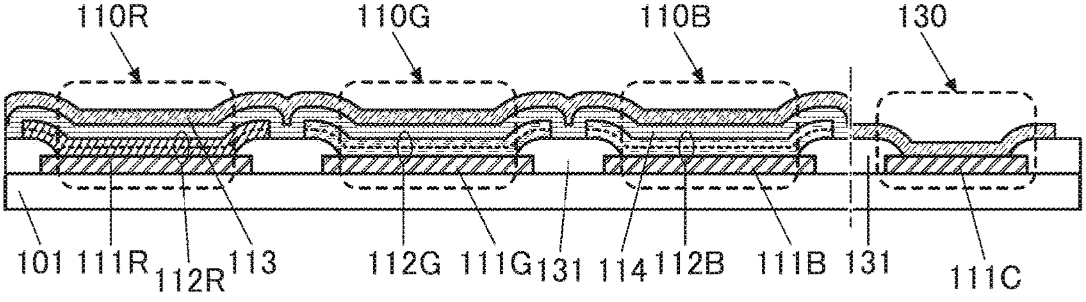

Then, the common electrode 113 is formed to cover the EL layer 114 and the connection electrode 111C (FIG. 7F).

The common electrode 113 can be formed by a deposition method such as an evaporation method or a sputtering method. Alternatively, a film formed by an evaporation method and a film formed by a sputtering method may be stacked. In that case, the common electrode 113 is preferably formed so as to cover a region where the EL layer 114 is deposited. That is, a structure in which end portions of the EL layer 114 overlap with the common electrode 113 can be obtained. The common electrode 113 is preferably formed using a shielding mask.

The common electrode 113 is electrically connected to the connection electrode 111C outside a display region.

[Formation of Protective Layer]

Next, the protective layer 121 is formed over the common electrode 113. An inorganic insulating film used for the protective layer 121 is preferably deposited by a sputtering method, a PECVD method, or an ALD method. In particular, an ALD method is preferable because it provides excellent step coverage and is less likely to cause a defect such as a pinhole. An organic insulating film is preferably deposited by an inkjet method because a uniform film can be formed in a desired area.

Through the above steps, the display device 100 illustrated in FIG. 5B and FIG. 5C can be fabricated.

Although the case where the common electrode 113 and the EL layer 114 are formed so as to have different top surface shapes is described above, they may be formed in the same region.

Figure 8A:
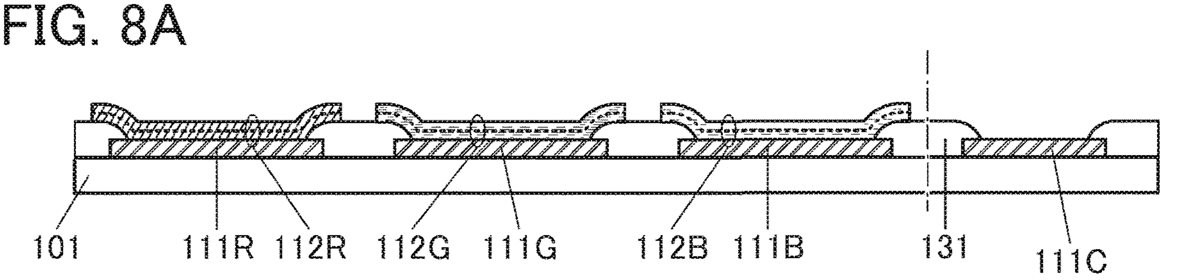
FIG. 8A to FIG. 8C are diagrams illustrating an example of a method for fabricating a display device.
Figure 8B:
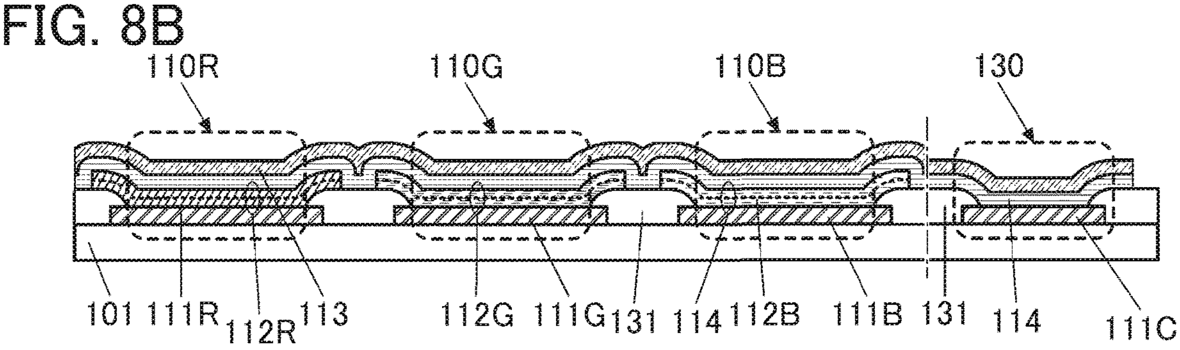

FIG. 8A is a schematic cross-sectional view after removal of the mask layer in the above description. Next, as illustrated in FIG. 8B, the EL layer 114 and the common electrode 113 are formed using the same shielding mask or without using a shielding mask. Thus, manufacturing cost can be reduced as compared to the case where different shielding masks are used.

As illustrated in FIG. 8B, in the connection portion 130, the EL layer 114 is provided between the connection electrode 111C and the common electrode 113. At this time, for the EL layer 114, a material with as low electric resistance as possible is preferably used. Alternatively, it is preferable to form the EL layer 114 as thin as possible, in which case the electric resistance of the EL layer 114 in the thickness direction can be reduced. For example, the EL layer 114 can be formed using a material having an electron-injection property or a hole-injection property having a thickness greater than or equal to 1 nm and less than or equal to 5 nm, preferably greater than or equal to 1 nm and less than or equal to 3 nm, whereby the electric resistance between the connection electrode 111C and the common electrode 113 can be made negligible in some cases.

Figure 8C:
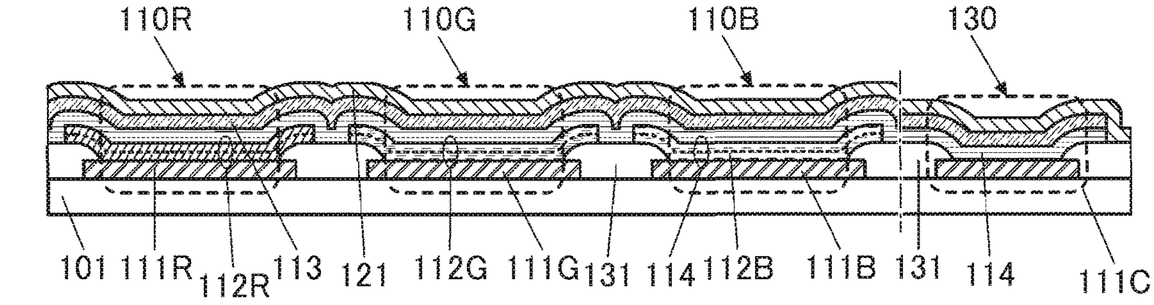

Subsequently, the protective layer 121 is formed as illustrated in FIG. 8C. At this time, as illustrated in FIG. 8C, the protective layer 121 is preferably provided to cover end portions of the common electrode 113 and the end portions of the EL layer 114. Accordingly, diffusion of impurities such as water or oxygen into the EL layer 114 and an interface between the EL layer 114 and the common electrode 113 from the outside can be effectively prevented.

The above is the description of the example of the fabrication method of the display device.

Structure Example 2

In the description below, a structure example of a display device whose structure is partly different from that of the above-described structure example 1 will be described. Hereinafter, description of the portions overlapping with the above is omitted in some cases.

A display device 100A illustrated in FIG. 9A to FIG. 9D is different from the display device 100 mainly in the shapes of the EL layer 114 and the common electrode 113.

Figure 9A:
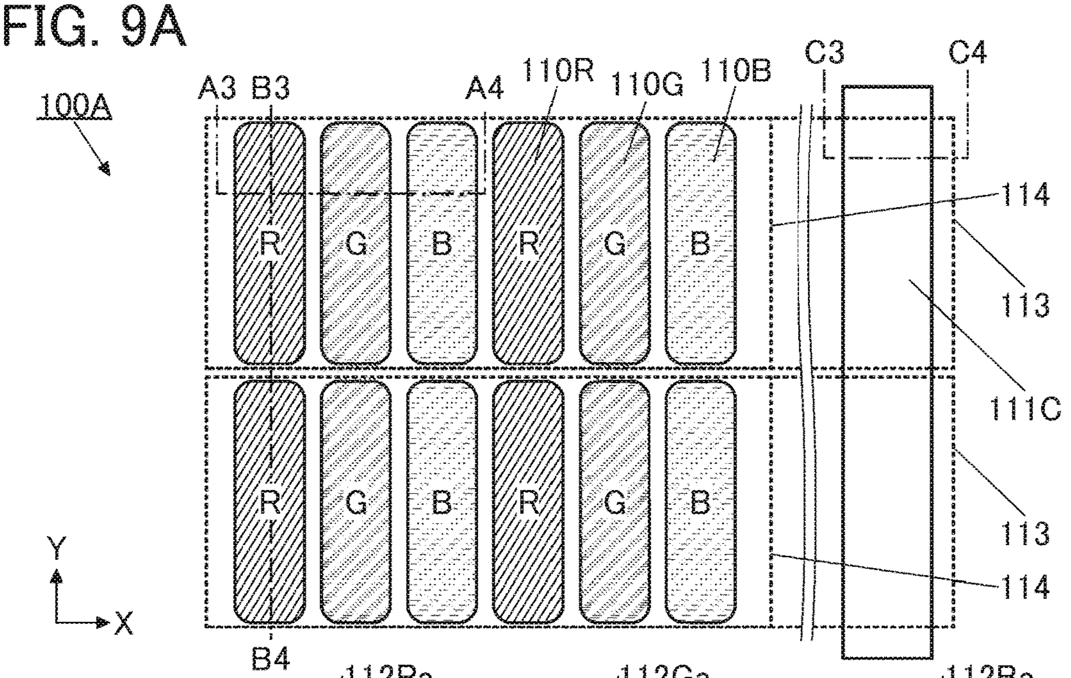
FIG. 9A to FIG. 9D are diagrams illustrating a structure example of a display device.
Figure 9B:
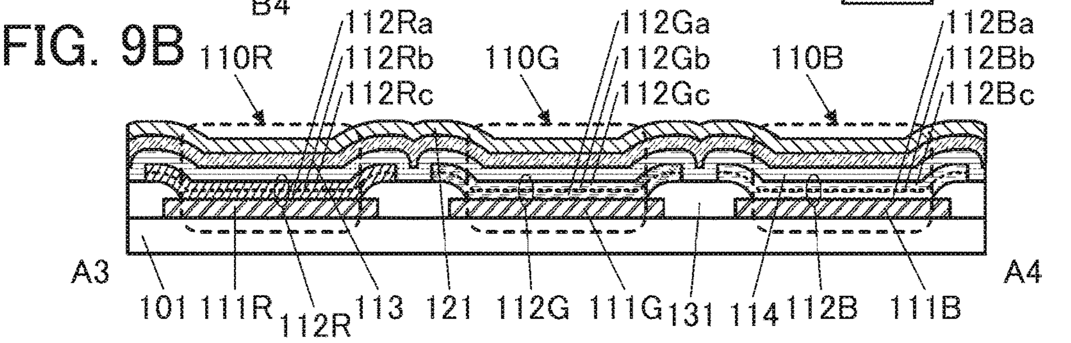
Figure 9C:
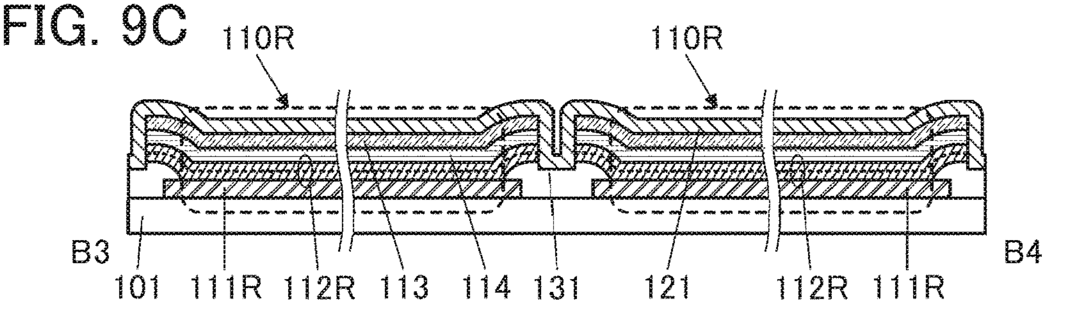
Figure 9D:
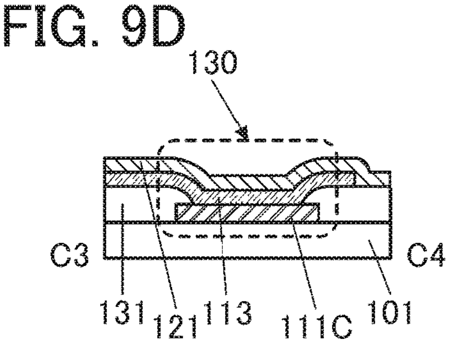

As illustrated in FIG. 9C, in a cross section in the Y direction, the EL layer 112R, the EL layer 114, and the common electrode 113 are separated between the two light-emitting elements 110R. In other words, the EL layer 112R, the EL layer 114, and the common electrode 113 have end portions in a portion overlapping with the insulating layer 131.

In addition, the protective layer 121 is provided to cover side surfaces of the EL layer 112R, the EL layer 114, and the common electrode 113 in a region overlapping with the insulating layer 131.

As illustrated in FIG. 9C, a recessed portion may be formed on part of a top surface of the insulating layer 131. In that case, the protective layer 121 is preferably provided along and in contact with the surface of the recessed portion of the insulating layer 131. This is preferable because the contact area between the insulating layer 131 and the protective layer 121 is increased and the adhesion of the insulating layer 131 and the protective layer 121 is improved.

In FIG. 9A, the outline of the common electrode 113 and the EL layer 114 is denoted by a dashed line. As illustrated in FIG. 9A, the common electrode 113 and the EL layer 114 each have a belt-shaped top surface shape, whereby a longitudinal direction is parallel to the X direction. By contrast, as illustrated in FIG. 9B and FIG. 9C, the EL layer 112R has an island shape.

Although not illustrated here, the light-emitting element 110G and the light-emitting element 110B can also have a similar structure.

Fabrication Method Example 2

An example of a fabrication method of the display device 100A will be described below. Note that in the description below, the fabrication method example 1 described above is referred to for portions similar to those described in the fabrication method example 1, and description of the portions is omitted in some cases. The fabrication method example described here is different from that of the above fabrication method example 1 in the process after the formation process of the common electrode 113.

FIG. 10A to FIG. 10D each illustrate a schematic cross-sectional view of a step described below as an example. Here, a cross section taken along dashed-dotted line B3-B4 and a cross section taken along dashed-dotted line C3-C4 in FIG. 9A are illustrated side by side.

Figure 10A:
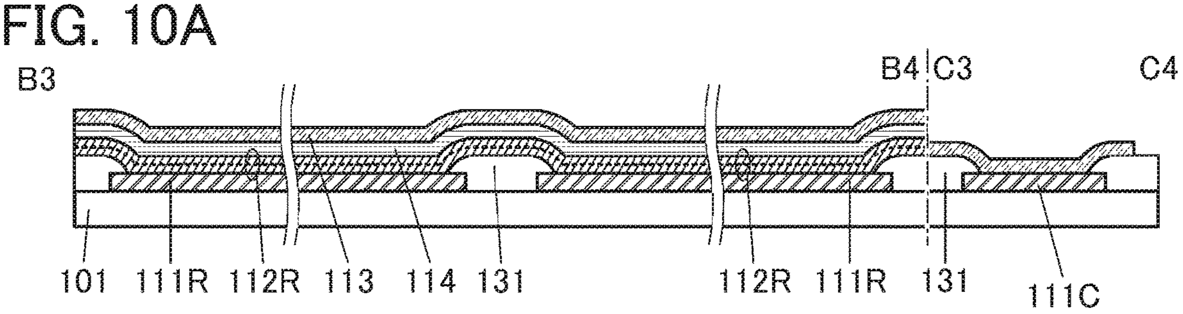
FIG. 10A to FIG. 10E are diagrams illustrating an example of a method for fabricating a display device.
Figure 10B:
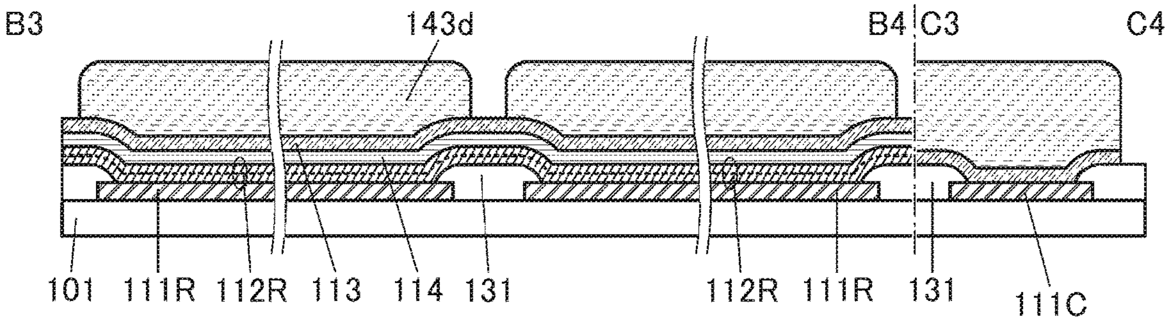

In a manner similar to that of the fabrication method example 1, steps up to the formation of the common electrode 113 are performed in order (FIG. 10A).

Next, a plurality of resist masks **143*d* are formed over the common electrode 113. The resist mask 143*d* is formed to have a belt-shaped top surface shape extending in the X direction. The resist mask 143*d* overlaps with the pixel electrode 111R. An end portion of the resist mask 143*d* is provided over the insulating layer 131**.

Figure 10C:
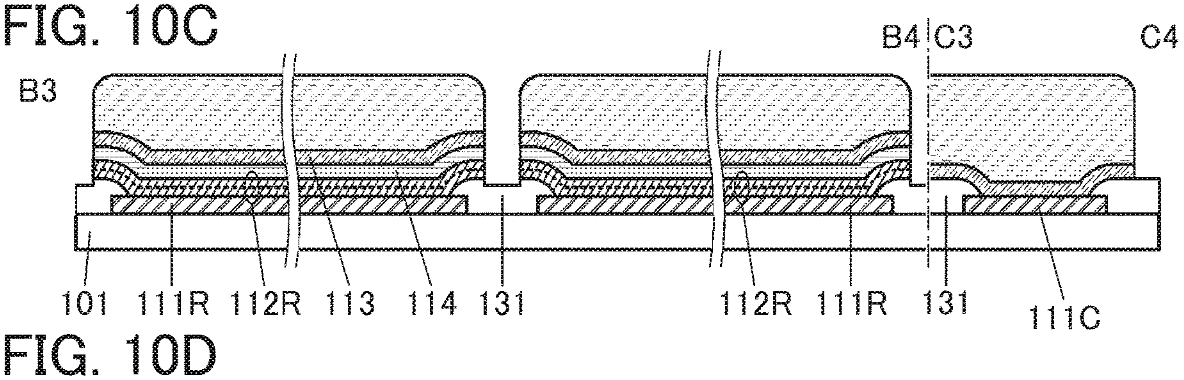

Next, portions of the common electrode 113, the EL layer 114, the EL layer 112R, the EL layer 112G (not illustrated), and the EL layer 112B (not illustrated) that are not covered with the resist mask **143*d* are removed by etching (FIG. 10C). Accordingly, the common electrode 113 and the EL layer 114 that have been covering the entire pixel electrodes and provided continuously can be divided with a slit formed by the etching so that the plurality of belt-shaped common electrodes 113 and the EL layer 114** are formed.

Etching is preferably performed by dry etching. For example, by changing the etching gas, the common electrode 113, the EL layer 114, the EL layer 112R, and the like are preferably etched successively without exposure to the air. Furthermore, a gas that does not contain oxygen as its main component is preferably used as the etching gas.

In the etching for the common electrode 113, the EL layer 114, the EL layer 112R, and the like, part of the insulating layer 131 may be etched, so that the recessed portion may be formed in the upper portion of the insulating layer 131 as illustrated in FIG. 10C. Alternatively, a portion of the insulating layer 131 that is not covered with the resist mask **143*d*** is etched and is divided into two in some cases.

Next, the resist mask **143*d* is removed. The removal of the resist mask 143*d*** can be performed by wet etching or dry etching.

Figure 10D:
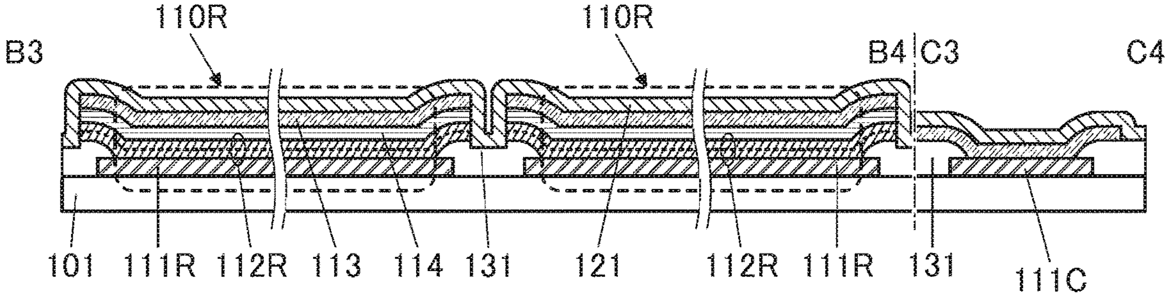

Next, the protective layer 121 is formed (FIG. 10D). The protective layer 121 is provided to cover the side surface of the common electrode 113, the side surface of the EL layer 114, and the side surface of the EL layer 112R. The protective layer 121 is preferably provided in contact with the top surface of the insulating layer 131.

Figure 10E:
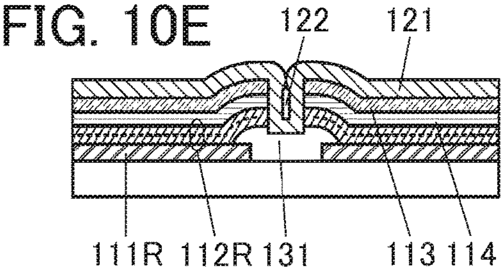

As illustrated in FIG. 10E, a space (also referred to as a gap, an interval, or the like) 122 might be formed above the insulating layer 131 when the protective layer 121 is formed. The space 122 may be in a reduced pressure state or in an atmospheric pressure. A gas such as air, nitrogen, or a noble gas or a deposition gas used for depositing the protective layer 121 may be contained in the space 122.

The above is the description of the fabrication method example of the display device 100A.

Note that although the resist mask 143*d* is directly formed over the common electrode 113, a film functioning as a hard mask may be provided over the common electrode 113. At this time, a hard mask can be formed using the resist mask 143*d* as a mask and after the resist mask is removed, the common electrode 113, the EL layer 114, the EL layer 112R, and the like can be etched using the hard mask as a mask. Note that at this time, the hard mask may be removed or left.

Modification Example

A structure example whose structure is partly different from that of the above is described below. Note that in the description below, the above description is referred to for portions similar to those described above and the portions are not described.

Modification Example 1

Figure 11A:
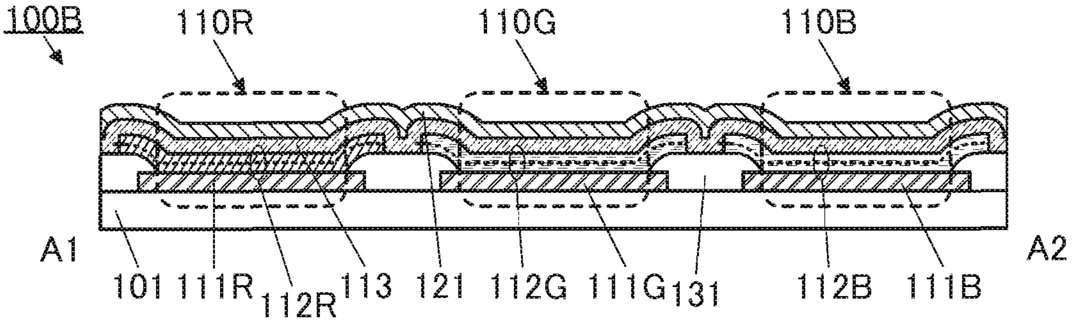
FIG. 11A to FIG. 11C are diagrams illustrating a structure example of a display device.
Figure 11B:
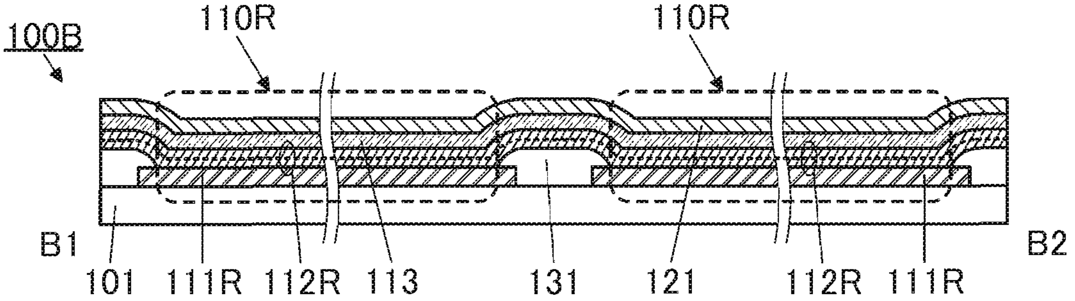

FIG. 11A and FIG. 11B are schematic cross-sectional views of a display device 100B. A top view of the display device 100B is similar to that in FIG. 5A. FIG. 11A corresponds to a cross section in the X direction, and FIG. 11B corresponds to a cross section in the Y direction.

The display device 100B is different from the display device 100 mainly in not including the EL layer 114, which is a common layer.

The common electrode 113 is provided in contact with the top surfaces of the EL layer 112R, the EL layer 112G, and the EL layer 112B. When the EL layer 114 is not provided, the light-emitting element 110R, the light-emitting element 110G, and the light-emitting element 110B can have significantly different stacked-layer structures; thus, options for materials increase, which can increase the design flexibility.

Figure 11C:
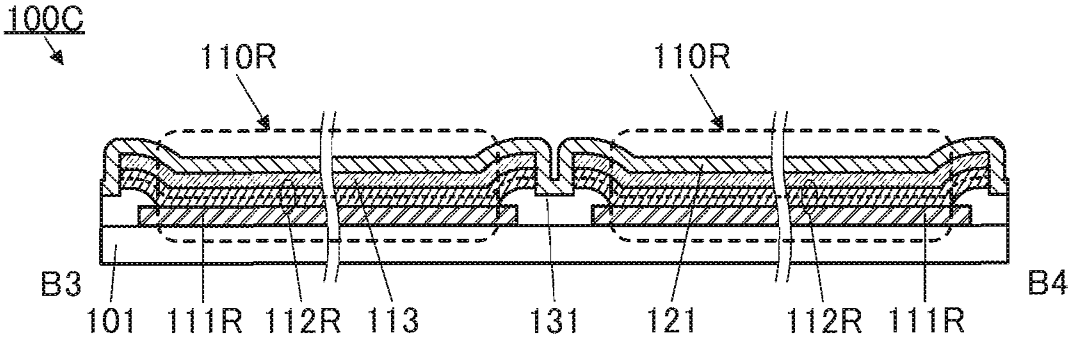

As illustrated in FIG. 11C, a display device 100C, as in the display device 100A, is an example of a case where a slit extending in the X direction in a region overlapping with the insulating layer 131 in the common electrode 113 is formed. In the display device 100C, the protective layer 121 is provided in contact with the side surface of the common electrode 113, the side surface of the EL layer 112R, and the top surface of the insulating layer 131.

Modification Example 2

Figure 12A:
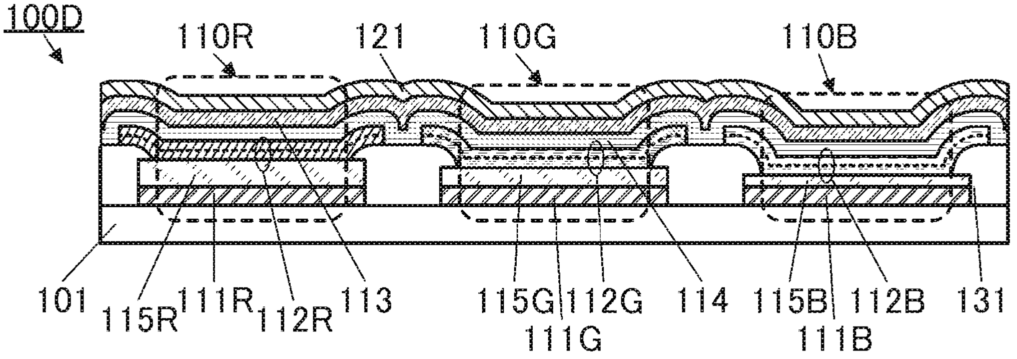
FIG. 12A to FIG. 12C are diagrams illustrating structure examples of a display device.
Figure 12B:
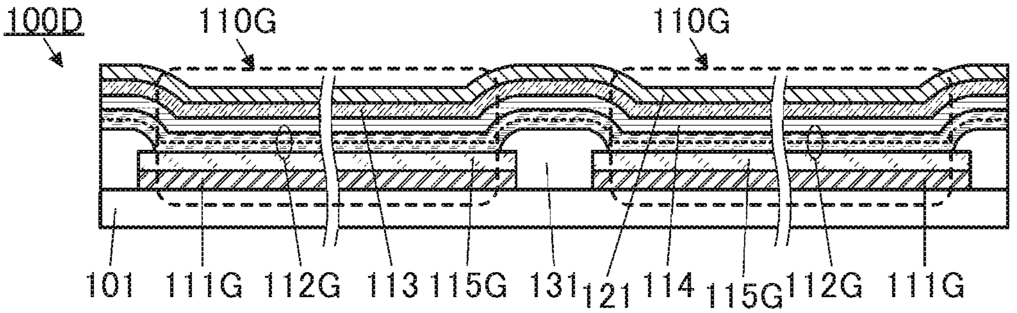

A display device 100D illustrated in FIG. 12A and FIG. 12B is different from the display device 100 mainly in the structure of the light-emitting element.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

In addition, the optical adjustment layer 115R, the optical adjustment layer 115G, and the optical adjustment layer 115B each have a property of transmitting visible light. The optical adjustment layer 115R, the optical adjustment layer 115G, and the optical adjustment layer 115B have different thicknesses. Thus, the optical path lengths of the light-emitting elements can differ from one another.

Here, a conductive film that has a property of reflecting visible light is used for the pixel electrode 111R, the pixel electrode 111G, and the pixel electrode 111B, and a conductive film that has properties of reflecting and transmitting visible light is used for the common electrode 113. Thus, the light-emitting elements have what is called a microcavity structure and intensify light with a specific wavelength. This can achieve a display device having a high color purity.

A conductive material that has a property of transmitting visible light can be used for each of the optical adjustment layers. For example, a conductive oxide such as indium oxide, indium tin oxide, indium zinc oxide, zinc oxide, zinc oxide containing gallium, indium-tin oxide containing silicon, or an indium-zinc oxide containing silicon can be used.

The optical adjustment layers can be formed after the formation of the pixel electrode 111R, the pixel electrode 111G, and the pixel electrode 111B and before the formation of the EL film 112Rf and the like. The optical adjustment layers may be formed using conductive films with different thicknesses or may have a single-layer structure, a two-layer structure, a three-layer structure, or the like, in ascending order of thickness.

Figure 12C:
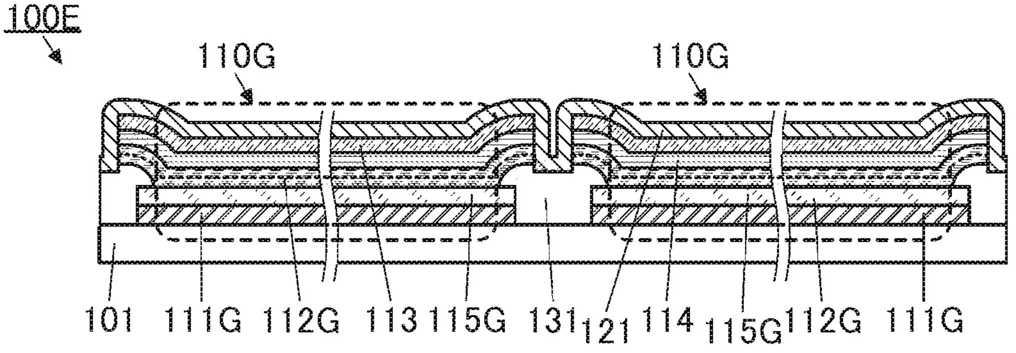

A display device 100E illustrated in FIG. 12C is an example of a case of the display device 100A in which an optical adjustment layer is used. FIG. 12C illustrates a cross section of the two light-emitting elements 110G that are arranged side by side in the Y direction.

Modification Example 3

Figure 13A:
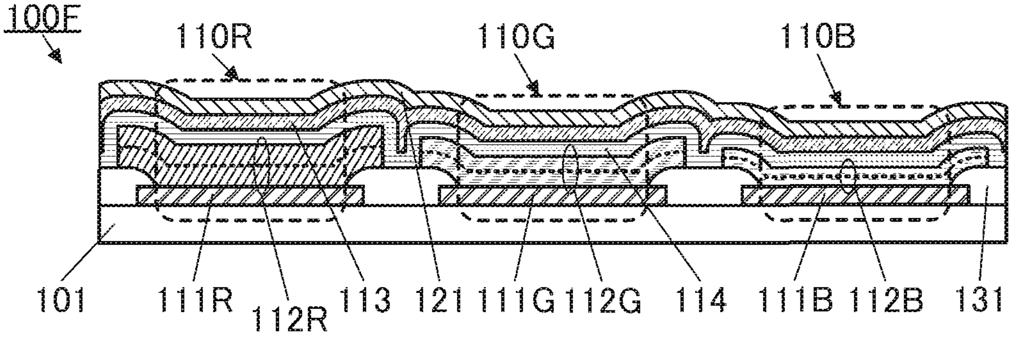
FIG. 13A to FIG. 13C are diagrams illustrating structure examples of a display device.
Figure 13B:
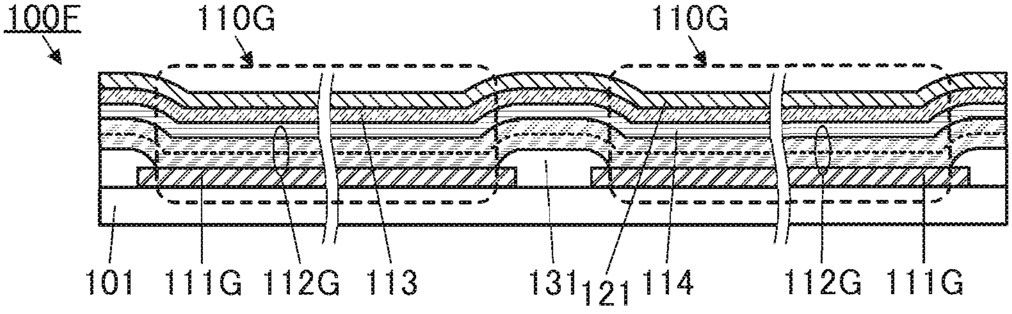

A display device 100F illustrated in FIG. 13A and FIG. 13B is different from the display device 100D mainly in not including an optical adjustment layer.

The display device 100F shows an example where a microcavity structure is achieved with the thicknesses of the EL layer 112R, the EL layer 112G, and the EL layer 112B. Such a structure does not require an optical adjustment layer provided additionally, simplifying the process.

For example, in the display device 100F, the EL layer 112R of the light-emitting element 110R emitting light whose wavelength is longest has the largest thickness, and the EL layer 112B of the light-emitting element 110B emitting light whose wavelength is shortest has the smallest thickness. Without limitation to this, the thickness of the EL layer can be adjusted in consideration of the wavelength of light emitted by the light-emitting element, the optical characteristics of the layer included in the light-emitting element, the electrical characteristics of the light-emitting element, and the like.

Figure 13C:
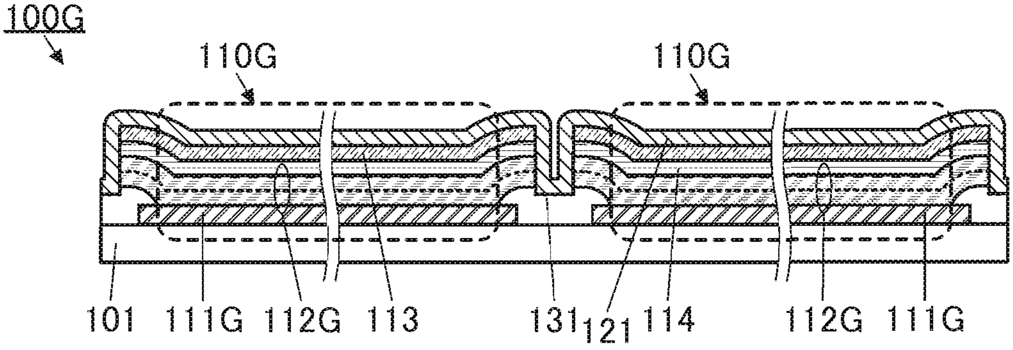

A display device 100G illustrated in FIG. 13C shows an example in which the thickness of the EL layer of the display device 100A is changed and a microcavity structure is achieved. FIG. 13C illustrates a cross section of the two light-emitting elements 110G that are arranged side by side in the Y direction.

The above is the description of the modification examples.

Note that although in modification example 2 and modification example 3, examples using the EL layer 114 are described, a structure in which the EL layer 114 is not provided may be employed.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, structure examples of display devices of one embodiment of the present invention will be described.

The display device in this embodiment can be a high-definition display device or a large-sized display device. Accordingly, the display device in this embodiment can be used for display portions of electronic devices such as a digital camera, a digital video camera, a digital photo frame, a mobile phone, a portable game machine, a smartphone, a watch-type terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

Figure 14:
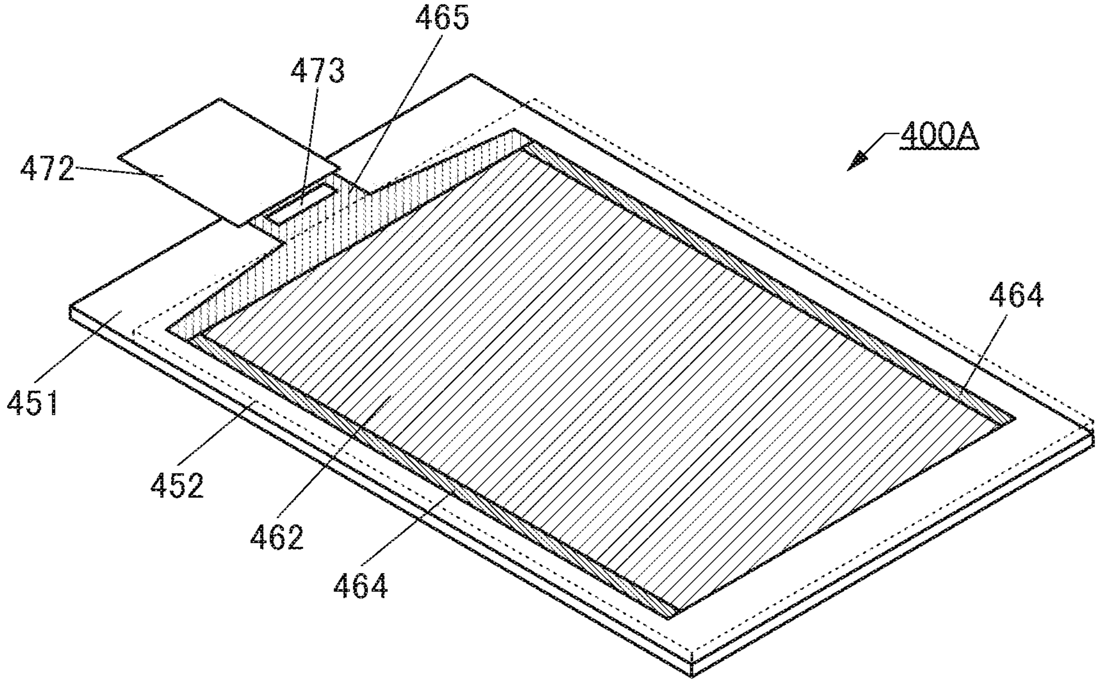
FIG. 14 is a perspective view illustrating an example of a display device.

FIG. 14 is a perspective view of a display device 400A, and FIG. 15A is a cross-sectional view of the display device 400A.

The display device 400A has a structure in which a substrate 452 and a substrate 451 are bonded to each other. In FIG. 14, the substrate 452 is denoted by a dashed line.

The display device 400A includes a display portion 462, a circuit 464, a wiring 465, and the like. FIG. 14 illustrates an example in which an IC 473 and an FPC 472 are mounted on the display device 400A. Thus, the structure illustrated in FIG. 14 can be regarded as a display module including the display device 400A, the IC (integrated circuit), and the FPC.

As the circuit 464, a scan line driver circuit can be used, for example.

The wiring 465 has a function of supplying a signal and electric power to the display portion 462 and the circuit 464. The signal and electric power are input to the wiring 465 from the outside through the FPC 472 or input to the wiring 465 from the IC 473.

FIG. 14 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 15A illustrates an example of cross sections of part of a region including the FPC 472, part of the circuit 464, part of the display portion 462, and part of a region including an end portion of the display device 400A.

The display device 400A illustrated in FIG. 15A includes a transistor 201, a transistor 205, a light-emitting element 430*a* that emits red light, a light-emitting element 430*b* that emits green light, a light-emitting element 430*c* that emits blue light, and the like between the substrate 451 and the substrate 452.

The light-emitting element described in Embodiment 1 can be used as the light-emitting element 430*a*, the light-emitting element 430*b*, and the light-emitting element 430*c*.

In the case where a pixel of the display device includes three kinds of subpixels including light-emitting elements emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

A protective layer 416 and the substrate 452 are bonded to each other with an adhesive layer 442. A solid sealing structure, a hollow sealing structure, or the like can be employed to seal the light-emitting elements. In FIG. 15A, a hollow sealing structure is employed in which a space 443 surrounded by the substrate 452, the adhesive layer 442, and the substrate 451 is filled with an inert gas (e.g., nitrogen or argon). The adhesive layer 442 may be provided to overlap with the light-emitting element. The space 443 surrounded by the substrate 452, the adhesive layer 442, and the substrate 451 may be filled with a resin different from that of the adhesive layer 442.

The light-emitting elements 430*a*, 430*b*, and 430*c* each include an optical adjustment layer between a pixel electrode and an EL layer. The light-emitting element 430*a* includes an optical adjustment layer 426*a*, the light-emitting element 430*b* includes an optical adjustment layer 426*b*, and the light-emitting element 430*c* includes an optical adjustment layer 426*c*. Refer to Embodiment 1 for the details of the light-emitting elements.

Pixel electrodes 411*a*, 411*b*, and 411*c* are each connected to a conductive layer 222*b* included in the transistor 205 through an opening provided in an insulating layer 214.

The end portions of the pixel electrodes and the optical adjustment layers are covered with an insulating layer 421. The pixel electrodes each contain a material that reflects visible light, and a counter electrode contains a material that transmits visible light.

Light from the light-emitting element is emitted toward the substrate 452 side. For the substrate 452, a material having a high visible-light-transmitting property is preferably used.

The transistor 201 and the transistor 205 are formed over the substrate 451. These transistors can be fabricated using the same material in the same step.

An insulating layer 211, an insulating layer 213, an insulating layer 215, and the insulating layer 214 are provided in this order over the substrate 451. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of the end portion of the display device 400A. This can inhibit entry of impurities from the end portion of the display device 400A through the organic insulating film. Alternatively, the organic insulating film may be formed such that its end portion is positioned inward from the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 15A, an opening is formed in the insulating layer 214. This can inhibit entry of impurities into the display portion 462 from the outside through the insulating layer 214 even when an organic insulating film is used as the insulating layer 214. Consequently, the reliability of the display device 400A can be increased.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are denoted with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity, in which case deterioration of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display device in this embodiment. Alternatively, a semiconductor layer of a transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of Min the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

For example, when the atomic ratio is described as In:Ga:Zn=4:2:3 or a composition in the vicinity thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or a composition in the vicinity thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or a composition in the vicinity thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On the top surface of the connection portion 204, the conductive layer 466 is exposed. Thus, the connection portion 204 and the FPC 472 can be electrically connected to each other through the connection layer 242.

A light-blocking layer 417 is preferably provided on the surface of the substrate 452 on the substrate 451 side. A variety of optical members can be arranged on the outer side of the substrate 452. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided on the outer side of the substrate 452.

Providing the protective layer 416 covering the light-emitting elements inhibits entry of impurities such as water into the light-emitting elements; as a result, the reliability of the light-emitting elements can be increased.

In the region 228 in the vicinity of the end portion of the display device 400A, the insulating layer 215 and the protective layer 416 are preferably in contact with each other through an opening in the insulating layer 214. In particular, the inorganic insulating film included in the insulating layer 215 and the inorganic insulating film included in the protective layer 416 are preferably in contact with each other. This can inhibit entry of impurities into the display portion 462 from the outside through the organic insulating film. Consequently, the reliability of the display device 400A can be increased.

FIG. 15B illustrates an example in which the protective layer 416 has a three-layer structure. In FIG. 15B, the protective layer 416 includes an inorganic insulating layer 416*a* over the light-emitting element 430*c*, an organic insulating layer 416*b* over the inorganic insulating layer 416*a*, and an inorganic insulating layer 416*c* over the organic insulating layer 416*b*.

The end portion of the inorganic insulating layer 416*a* and the end portion of the inorganic insulating layer 416*c* extend beyond the end portion of the organic insulating layer 416*b* and are in contact with each other. The inorganic insulating layer 416*a* is in contact with the insulating layer 215 (inorganic insulating layer) through the opening in the insulating layer 214 (organic insulating layer). Accordingly, the light-emitting element can be surrounded by the insulating layer 215 and the protective layer 416, whereby the reliability of the light-emitting element can be increased.

As described above, the protective layer 416 may have a stacked-layer structure of an organic insulating film and an inorganic insulating film. In that case, the end portions of the inorganic insulating films preferably extend beyond the end portion of the organic insulating film.

For each of the substrate 451 and the substrate 452, glass, quartz, ceramics, sapphire, a resin, a metal, an alloy, a semiconductor, or the like can be used. The substrate on the side from which light from the light-emitting element is extracted is formed using a material that transmits the light. When the substrate 451 and the substrate 452 are formed using a flexible material, the flexibility of the display device can be increased. Furthermore, a polarizing plate may be used as the substrate 451 or the substrate 452.

For each of the substrate 451 and the substrate 452, it is possible to use a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, cellulose nanofiber, or the like. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, an indium tin oxide, an indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of an indium tin oxide and an alloy of silver and magnesium is preferably used because conductivity can be increased. They can also be used for conductive layers such as a variety of wirings and electrodes included in the display device, and conductive layers (e.g., conductive layers functioning as the pixel electrode and the common electrode) included in the light-emitting element.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

[Display Device 400B]

FIG. 16A is a cross-sectional view of a display device 400B. A perspective view of the display device 400B is similar to that of the display device 400A (FIG. 14). FIG. 16A illustrates an example of cross sections of part of a region including the FPC 472, part of the circuit 464, and part of the display portion 462 in the display device 400B. FIG. 16A specifically illustrates an example of a cross section of a region including the light-emitting element 430*b* emitting green light and the light-emitting element 430*c* emitting blue light in the display portion 462. Note that portions similar to those in the display device 400A are not described in some cases.

The display device 400B illustrated in FIG. 16A includes a transistor 202, transistors 210, the light-emitting element 430*b*, the light-emitting element 430*c*, and the like between a substrate 453 and a substrate 454.

The substrate 454 and the protective layer 416 are bonded to each other with the adhesive layer 442. The adhesive layer 442 is provided to overlap with the light-emitting element 430*b* and the light-emitting element 430*c*, and the display device 400B employs a solid sealing structure.

The substrate 453 and an insulating layer 212 are bonded to each other with an adhesive layer 455.

As a method for fabricating the display device 400B, first, a formation substrate provided with the insulating layer 212, the transistors, the light-emitting elements, and the like and the substrate 454 provided with the light-blocking layer 417 are bonded to each other with the adhesive layer 442. Then, the substrate 453 is attached to a surface exposed by separation of the formation substrate, whereby the components formed over the formation substrate are transferred to the substrate 453. The substrate 453 and the substrate 454 are preferably flexible. Accordingly, the display device 400B can be highly flexible.

The inorganic insulating film that can be used as the insulating layer 211, the insulating layer 213, and the insulating layer 215 can be used as the insulating layer 212.

The pixel electrode is connected to the conductive layer 222*b* included in the transistor 210 through the opening provided in the insulating layer 214. The conductive layer 222*b* is connected to a low-resistance region 231*n* through an opening provided in the insulating layer 215 and an insulating layer 225. The transistor 210 has a function of controlling the driving of the light-emitting element. The end portions of the pixel electrode are covered with the insulating layer 421.

Light from the light-emitting elements 430*b* and 430*c* is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layer 222*a* and the conductive layer 222*b* functions as a source, and the other functions as a drain.

FIG. 16A illustrates an example in which the insulating layer 225 covers the top and side surfaces of the semiconductor layer. The conductive layer 222*a* and the conductive layer 222*b* are connected to the corresponding low-resistance regions 231*n* through openings provided in the insulating layer 225 and the insulating layer 215.

In a transistor 209 illustrated in FIG. 16B, the insulating layer 225 overlaps with the channel formation region 231*i* of the semiconductor layer 231 and does not overlap with the low-resistance regions 231*n*. The structure illustrated in FIG. 16B is obtained by processing the insulating layer 225 with the conductive layer 223 as a mask, for example. In FIG. 16B, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215. Furthermore, an insulating layer 218 covering the transistor may be provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 4

In this embodiment, a structure example of a display device different from those described above will be described.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 17A:
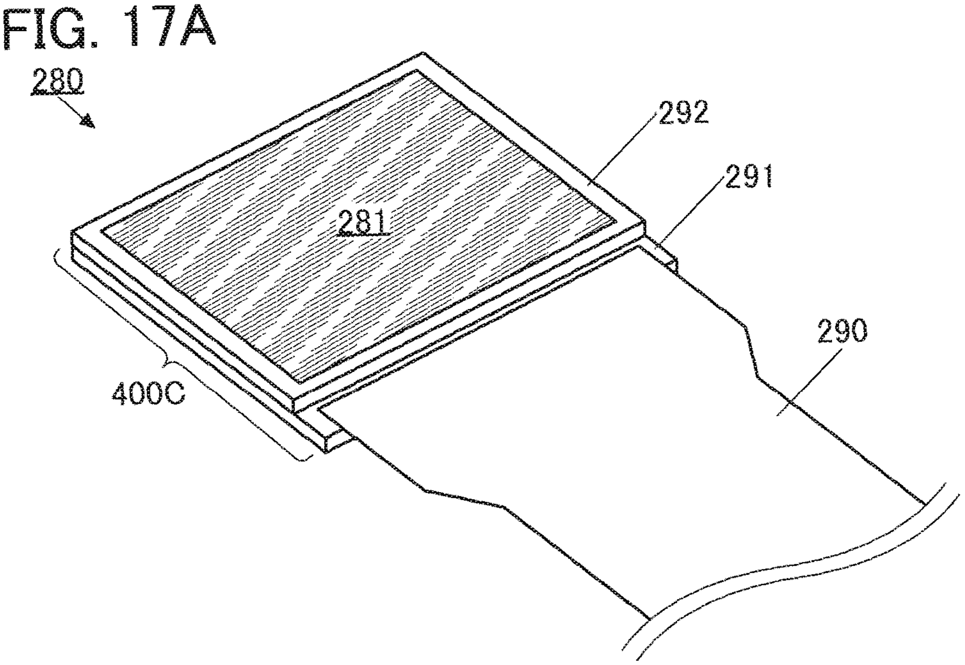
FIG. 17A and FIG. 17B are perspective views illustrating an example of a display module.

FIG. 17A is a perspective view of a display module 280. The display module 280 includes a display device 400C and an FPC 290. Note that the display device included in the display module 280 is not limited to the display device 400C and may be a display device 400D or a display device 400E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 17B:
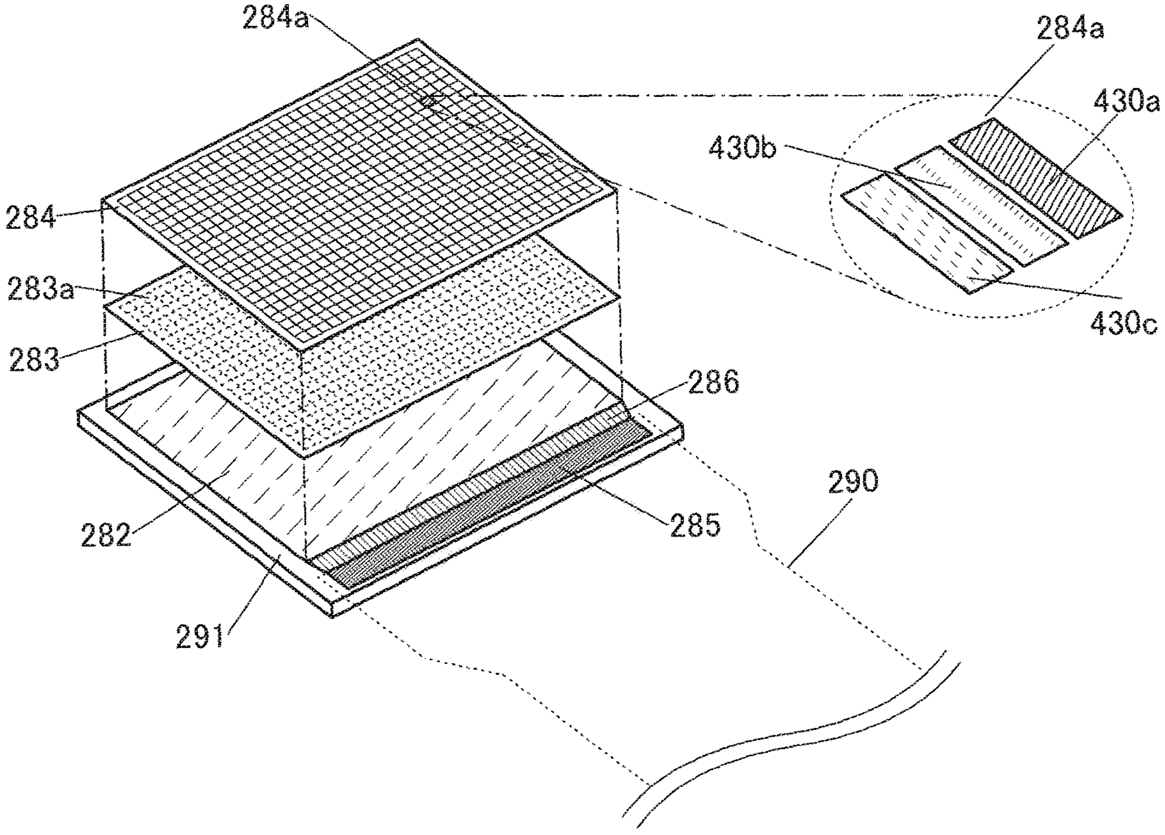

FIG. 17B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion that is over the substrate 291 and does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 17B. The pixel 284*a* includes the light-emitting elements 430*a*, 430*b*, and 430*c* that emit light of different colors from each other. The plurality of light-emitting elements may be arranged in a stripe arrangement as illustrated in FIG. 17B. With the stripe arrangement that enables high-density arrangement of pixel circuits, a high-resolution display device can be provided. Alternatively, a variety of arrangement methods, such as delta arrangement and PenTile arrangement, can be employed.

The pixel circuit portion 283 includes a plurality of pixel circuits 283*a* arranged periodically.

One pixel circuit 283*a* is a circuit that controls light emission of three light-emitting elements included in one pixel 284*a*. One pixel circuit 283*a* may be provided with three circuits each of which controls light emission of one light-emitting element. For example, the pixel circuit 283*a* can include at least one selection transistor, one current control transistor (driving transistor), and a capacitor for one light-emitting element. In this case, a gate signal is input to a gate of the selection transistor, and a source signal is input to one of a source and a drain of the selection transistor. Thus, an active-matrix display device is achieved.

The circuit portion 282 includes a circuit for driving the pixel circuits 283*a* in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device such as a watch.

[Display Device 400C]

Figure 18:
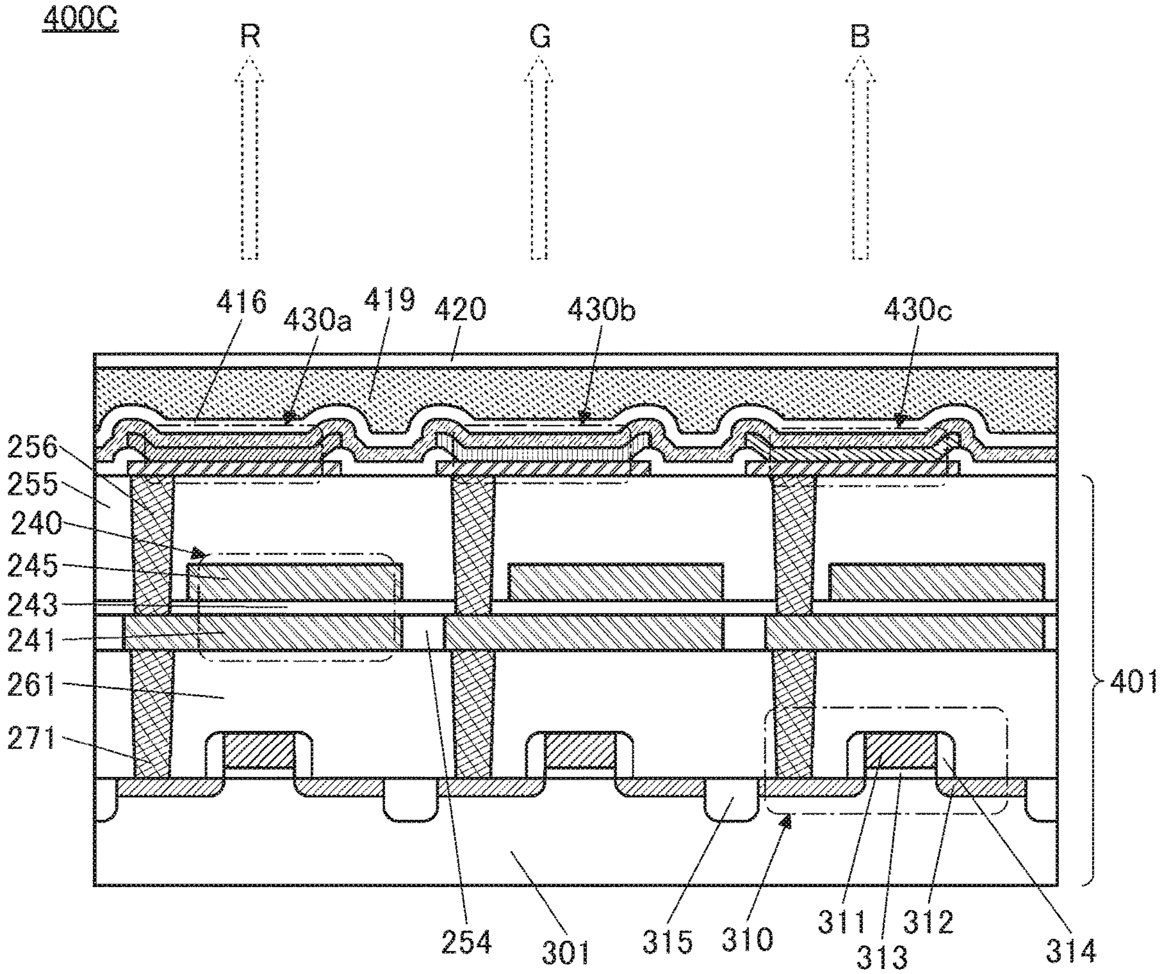
FIG. 18 is a cross-sectional view illustrating an example of a display device.

The display device 400C illustrated in FIG. 18 includes a substrate 301, the light-emitting elements 430*a*, 430*b*, and 430*c*, a capacitor 240, and a transistor 310.

The substrate 301 corresponds to the substrate 291 in FIG. 17A and FIG. 17B. A stacked-layer structure including the substrate 301 and the components thereover up to an insulating layer 255 corresponds to the substrate in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting elements 430*a*, 430*b*, and 430*c* and the like are provided over the insulating layer 255. The protective layer 416 is provided over the light-emitting elements 430*a*, 430*b*, and 430*c*, and a substrate 420 is bonded to the top surface of the protective layer 416 with a resin layer 419. The substrate 420 corresponds to the substrate 292 illustrated in FIG. 17A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 400D]

Figure 19:
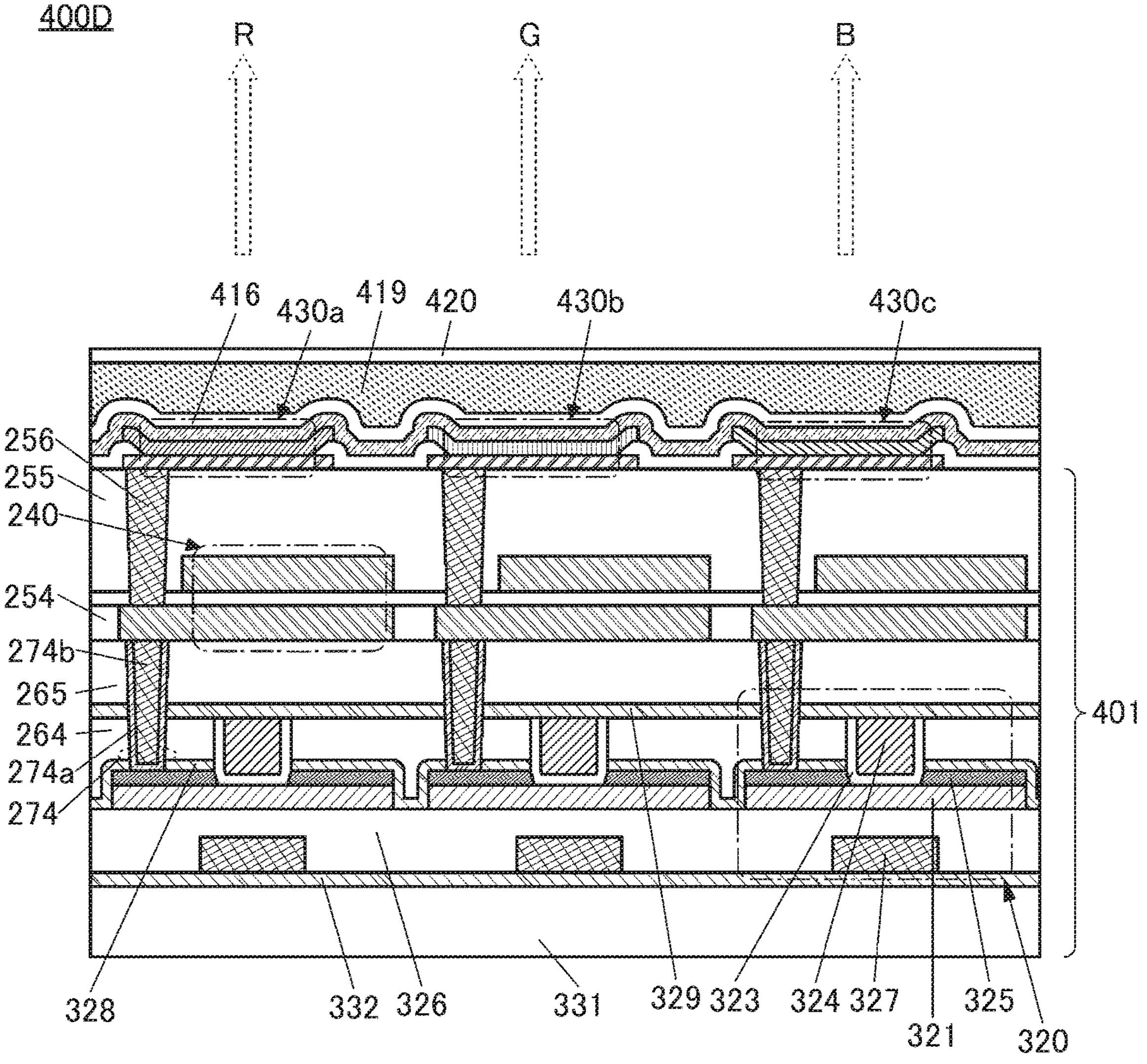
FIG. 19 is a cross-sectional view illustrating an example of a display device.

The display device 400D illustrated in FIG. 19 differs from the display device 400C mainly in a structure of a transistor. Note that portions similar to those in the display device 400C are not described in some cases.

A transistor 320 is a transistor that contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 17A and FIG. 17B. A stacked-layer structure including the substrate 331 and the components thereover up to the insulating layer 255 corresponds to a layer 401 including a transistor in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. A material that can be suitably used for the semiconductor layer 321 will be described in detail later.

The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers the side surface of an opening in the insulating layer 265, the insulating layer 329, the insulating layer 264, and the insulating layer 328 and part of the top surface of the conductive layer 325, and a conductive layer 274*b* in contact with the top surface of the conductive layer 274*a*. In this case, a conductive material through which hydrogen and oxygen are less likely to diffuse is preferably used for the conductive layer 274*a*.

The structures of the insulating layer 254 and the components thereover up to the substrate 420 in the display device 400D are similar to those in the display device 400C.

[Display Device 400E]

Figure 20:
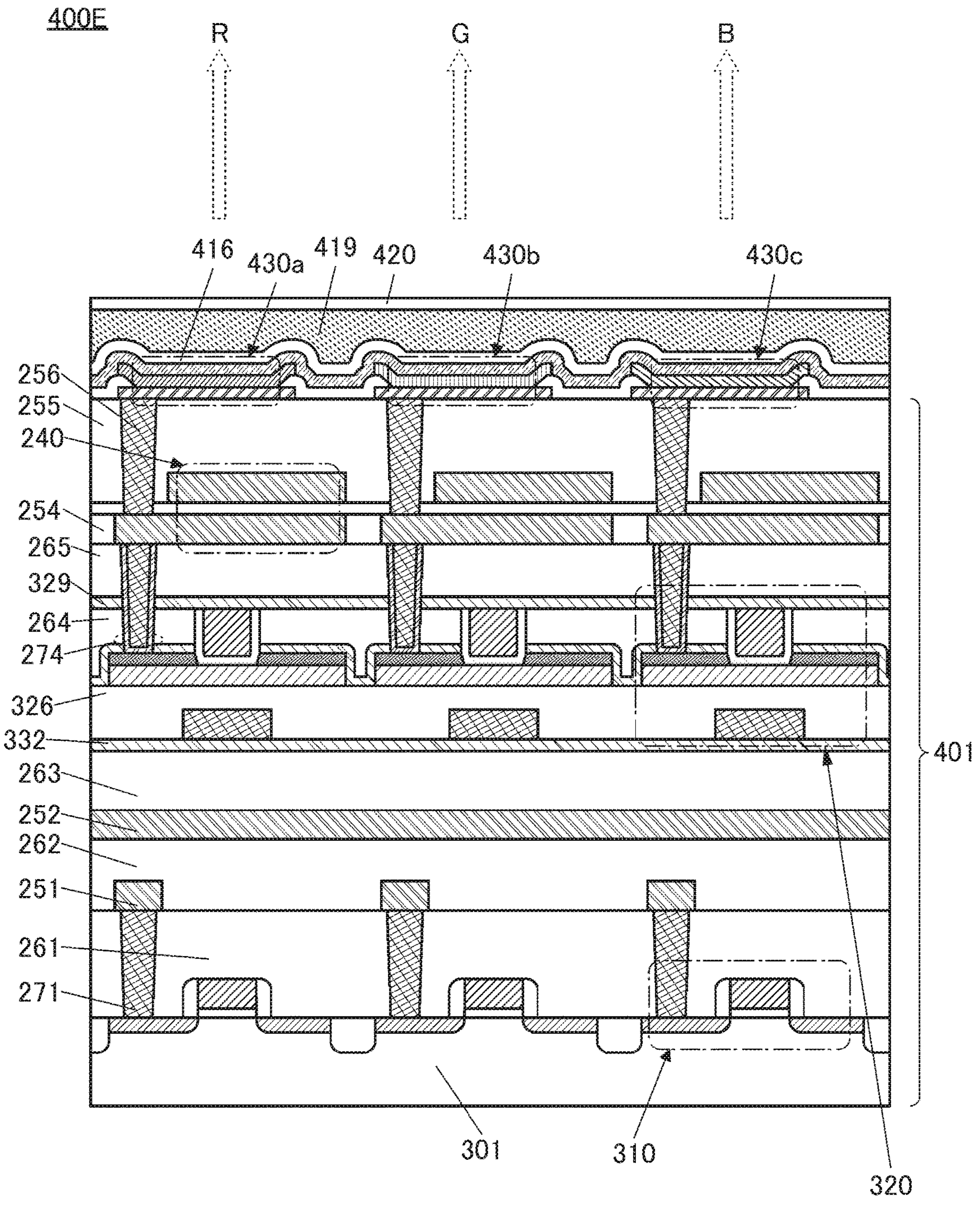
FIG. 20 is a cross-sectional view illustrating an example of a display device.

The display device 400E illustrated in FIG. 20 has a structure in which the transistor 310 whose channel is formed in the substrate 301 and the transistor 320 including a metal oxide in the semiconductor layer where the channel is formed are stacked. Note that portions similar to those in the display devices 400C and 400D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting elements; thus, the display device can be downsized as compared with the case where a driver circuit is provided around a display region.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, a high-resolution display device will be described.

Structure Example of Pixel Circuit

Examples of a pixel suitable for a high-resolution display device and an arrangement method thereof are described below.

Figure 21A:
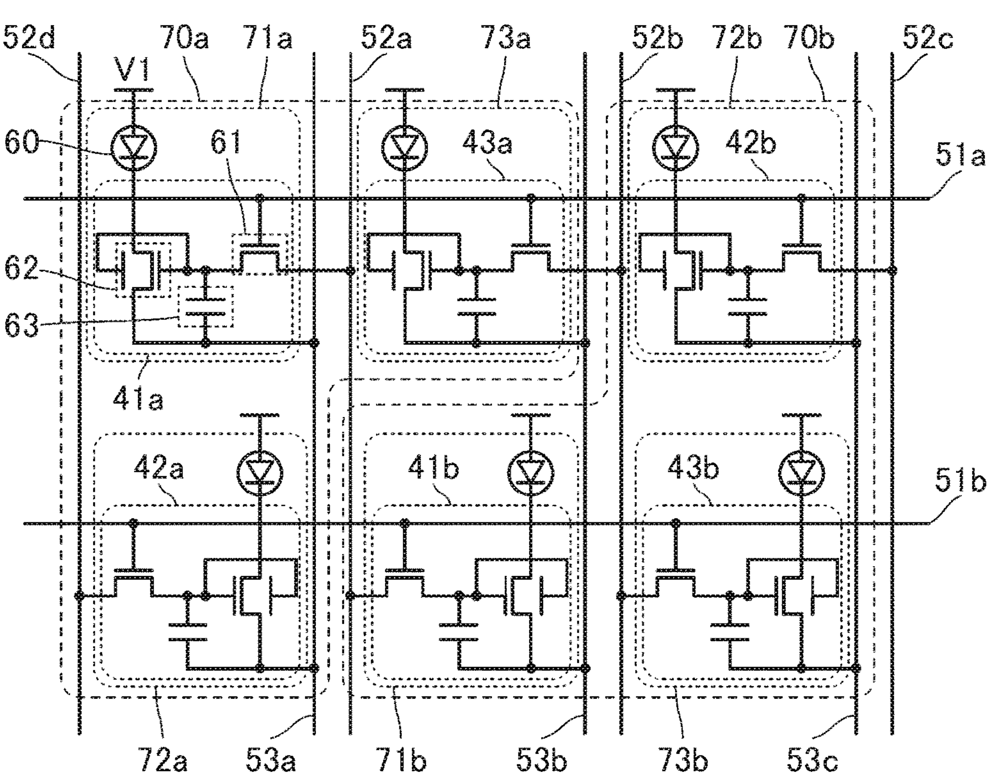
FIG. 21A and FIG. 21B are diagrams illustrating a structure example of a display device.

FIG. 21A illustrates an example of a circuit diagram of a pixel unit 70. The pixel unit 70 is composed of two pixels (a pixel 70*a* and a pixel 70*b*). In addition, the pixel unit 70 is connected to a wiring 51*a*, a wiring 51*b*, a wiring 52*a*, a wiring 52*b*, a wiring 52*c*, a wiring 52*d*, a wiring 53*a*, a wiring 53*b*, and a wiring 53*c* and the like.

The pixel 70*a* includes a subpixel 71*a*, a subpixel 72*a*, and a subpixel 73*a*. The pixel 70*b* includes a subpixel 71*b*, a subpixel 72*b*, and a subpixel 73*b*. The subpixel 71*a*, the subpixel 72*a*, and the subpixel 73*a* include a pixel circuit 41*a*, a pixel circuit 42*a*, and a pixel circuit 43*a*, respectively. The subpixel 71*b*, the subpixel 72*b*, and the subpixel 73*b* include a pixel circuit 41*b*, a pixel circuit 42*b*, and a pixel circuit 43*b*, respectively.

Each subpixel includes the pixel circuit and a display element 60. For example, the subpixel 71*a* includes the pixel circuit 41*a* and the display element 60. A light-emitting element such as an organic EL element is used here as the display element 60.

The wiring 51*a* and the wiring 51*b* each function as a gate line. The wiring 52*a*, the wiring 52*b*, the wiring 52*c*, and the wiring 52*d* each function as a signal line (also referred to as a data line). The wiring 53*a*, the wiring 53*b*, and the wiring 53*c* each have a function of supplying a potential to the display element 60.

The pixel circuit 41*a* is electrically connected to the wiring 51*a*, the wiring 52*a*, and the wiring 53*a*. The pixel circuit 42*a* is electrically connected to the wiring 51*b*, the wiring 52*d*, and the wiring 53*a*. The pixel circuit 43*a* is electrically connected to the wiring 51*a*, the wiring 52*b*, and the wiring 53*b*. The pixel circuit 41*b* is electrically connected to the wiring 51*b*, the wiring 52*a*, and the wiring 53*b*. The pixel circuit 42*b* is electrically connected to the wiring 51*a*, the wiring 52*c*, and the wiring 53*c*. The pixel circuit 43*b* is electrically connected to the wiring 51*b*, the wiring 52*b*, and the wiring 53*c*.

With the structure illustrated in FIG. 21A in which two gate lines are connected to one pixel, the number of source lines can be conversely reduced by half as compared with that in a stripe arrangement. As a result, the number of terminals of the ICs used as source driver circuits can be reduced by half and the number of components can be reduced.

One wiring functioning as a signal line is preferably connected to pixel circuits corresponding to the same color. For example, when a signal with an adjusted potential is supplied to the wiring to correct for variation in luminance between pixels, the correction value may greatly vary between colors. Thus, when pixel circuits connected to one signal line are pixel circuits corresponding to the same color, the correction can be performed easily.

In addition, each pixel circuit includes a transistor 61, a transistor 62, and a capacitor 63. In the pixel circuit 41*a*, for example, a gate of the transistor 61 is electrically connected to the wiring 51*a*, one of a source and a drain of the transistor 61 is electrically connected to the wiring 52*a*, and the other of the source and the drain is electrically connected to a gate of the transistor 62 and one electrode of the capacitor 63. One of a source and a drain of the transistor 62 is electrically connected to one electrode of the display element 60, and the other of the source and the drain is electrically connected to the other electrode of the capacitor 63 and the wiring 53*a*. The other electrode of the display element 60 is electrically connected to a wiring to which a potential V1 is supplied.

Note that, as illustrated in FIG. 21A, the other pixel circuits are similar to the pixel circuit 41*a* except for the wiring to which the gate of the transistor 61 is connected, the wiring to which one of the source and the drain of the transistor 61 is connected, and the wiring to which the other electrode of the capacitor 63 is connected.

In FIG. 21A, the transistor 61 functions as a selection transistor. The transistor 62 is in a series connection with the display element 60 and has a function of controlling a current flowing into the display element 60. The capacitor 63 has a function of holding the potential of a node connected to the gate of the transistor 62. Note that the capacitor 63 does not have to be intentionally provided in the case where an off-state leakage current of the transistor 61, a leakage current through the gate of the transistor 62, and the like are extremely small.

The transistor 62 preferably includes a first gate and a second gate electrically connected to each other as illustrated in FIG. 21A. This structure with the two gates can increase the amount of current that the transistor 62 can carry. Such a structure is particularly preferable for a high-resolution display device because the amount of current can be increased without increasing the size, the channel width in particular, of the transistor 62.

Note that the transistor 62 may have one gate. This structure eliminates the need for forming the second gate and thus can simplify the process as compared with the above structure. The transistor 61 may have two gates. This structure enables a reduction in size of each transistor. A first gate and a second gate of each transistor can be electrically connected to each other. Alternatively, one gate may be electrically connected not to the other gate but to another wiring. In this case, threshold voltages of the transistors can be controlled by varying potentials that are supplied to the two gates.

One of a pair of electrodes of the display element 60 that is electrically connected to the transistor 62 corresponds to a pixel electrode. FIG. 21A illustrates a structure where an electrode of the display element 60 that is electrically connected to the transistor 62 is a cathode and the opposite electrode is an anode. This structure is particularly effective when the transistor 62 is an n-channel transistor. That is, when the transistor 62 is on, the potential applied through the wiring 53*a* is a source potential; accordingly, the amount of current flowing into the transistor 62 can be constant regardless of variation and change in resistance of the display element 60. Alternatively, a p-channel transistor may be used as a transistor of the pixel circuit.

Example of Pixel Electrode Layout Method

Figure 21B:
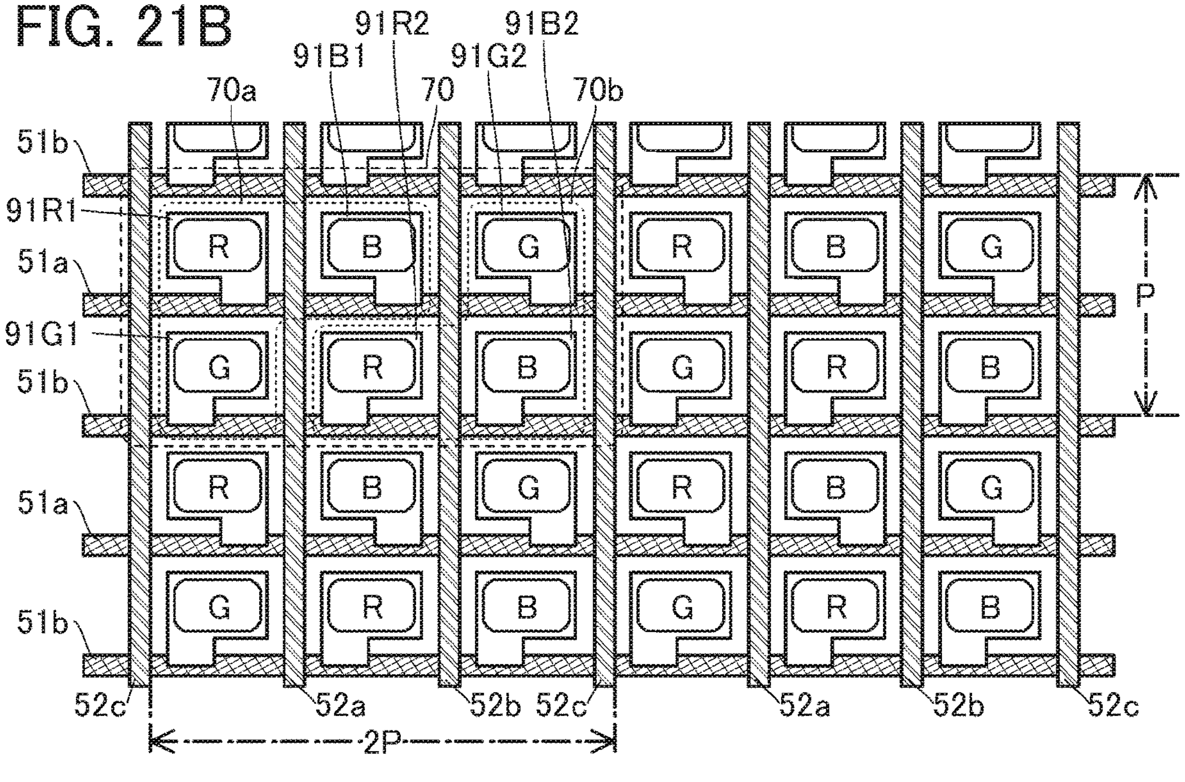

FIG. 21B is a schematic top view illustrating an example of a layout method of pixel electrodes and wirings in the display region. The wirings 51*a* and the wirings 51*b* are alternately arranged. The wiring 52*a*, the wiring 52*b*, and the wiring 52*c*, which intersect with the wirings 51*a* and the wirings 51*b*, are arranged in this order. The pixel electrodes are arranged in matrix in the extending direction of the wirings 51*a* and wirings 51*b*.

The pixel unit 70 includes the pixel 70*a* and the pixel 70*b*. The pixel 70*a* includes a pixel electrode 91R1, a pixel electrode 91G1, and a pixel electrode 91B1. The pixel 70*b* includes a pixel electrode 91R2, a pixel electrode 91G2, and a pixel electrode 91B2. A display region of a subpixel is inside the pixel electrode of the subpixel.

As illustrated in FIG. 21B, when a pitch of the pixel units 70 arranged in the extending direction of the wiring 52*a* or the like (also referred to as the first direction) is denoted as P, a pitch of the pixel units 70 arranged in the extending direction of the wiring 51*a* or the like (also referred to as the second direction) is preferably twice the pitch (the pitch 2P). In that case, distortion-free images can be displayed. The pitch P can be longer than or equal to 1 μm and shorter than or equal to 150 μm, preferably longer than or equal to 2 μm and shorter than or equal to 120 μm, further preferably longer than or equal to 3 μm and shorter than or equal to 100 μm, and still further preferably longer than or equal to 4 μm and shorter than or equal to 60 μm. In that case, the display device with extremely high resolution can be obtained.

It is preferable that the pixel electrode 91R1 or the like should not overlap with the wiring 52*a* or the like serving as a signal line, for example. This can suppress change in luminance of the display element, which is caused by change in potential of the pixel electrode 91R1 and the like due to transmission of electrical noise through capacitance between, for example, the wiring 52*a* and the pixel electrode 91R1.

The pixel electrode 91R1 or the like may overlap with the wiring 51*a* or the like serving as a scan line. This can increase the area of the pixel electrode 91R1 and thus increase the aperture ratio. FIG. 21B illustrates an example where part of the pixel electrode 91R1 overlaps with the wiring 51*a*.

When the pixel electrode 91R1 or the like of a subpixel overlaps with the wiring 51*a* or the like serving as a scan line, the wiring is preferably connected to a pixel circuit of the subpixel. For example, a period in which a signal for changing the potential of the wiring 51*a* or the like is input corresponds to a period in which data of the subpixel is rewritten. Thus, if electrical noise is transmitted from the wiring 51*a* or the like to the pixel electrode via capacitance, the luminance of the subpixel does not change.

Example 1 of Pixel Layout

A layout example of the pixel unit 70 is described below.

Figure 22A:
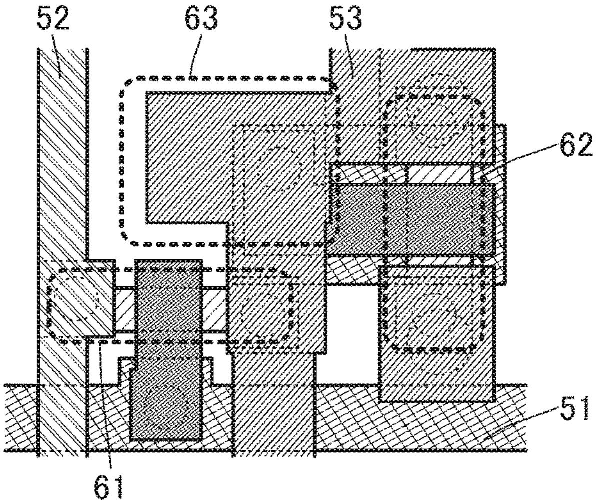
FIG. 22A and FIG. 22B are diagrams illustrating a structure example of a display device.

FIG. 22A is a layout example of a subpixel. The example shows, for easy viewing, a state before a pixel electrode is formed. The subpixel illustrated in FIG. 22A includes the transistor 61, the transistor 62, and the capacitor 63. The transistor 62 includes two gates with a semiconductor layer therebetween.

The lowermost conductive film forms a wiring 51, one gate of the transistor 62, and the like. A conductive film which is formed thereafter forms a gate of the transistor 61, the other gate of the transistor 62, and the like. A conductive film which is formed thereafter forms a wiring 52, source and drain electrodes of the transistors, one electrode of the capacitor 63, and the like. A conductive film which is formed thereafter forms a wiring 53 and the like. Part of the wiring 53 functions as the other electrode of the capacitor 63.

Figure 22B:
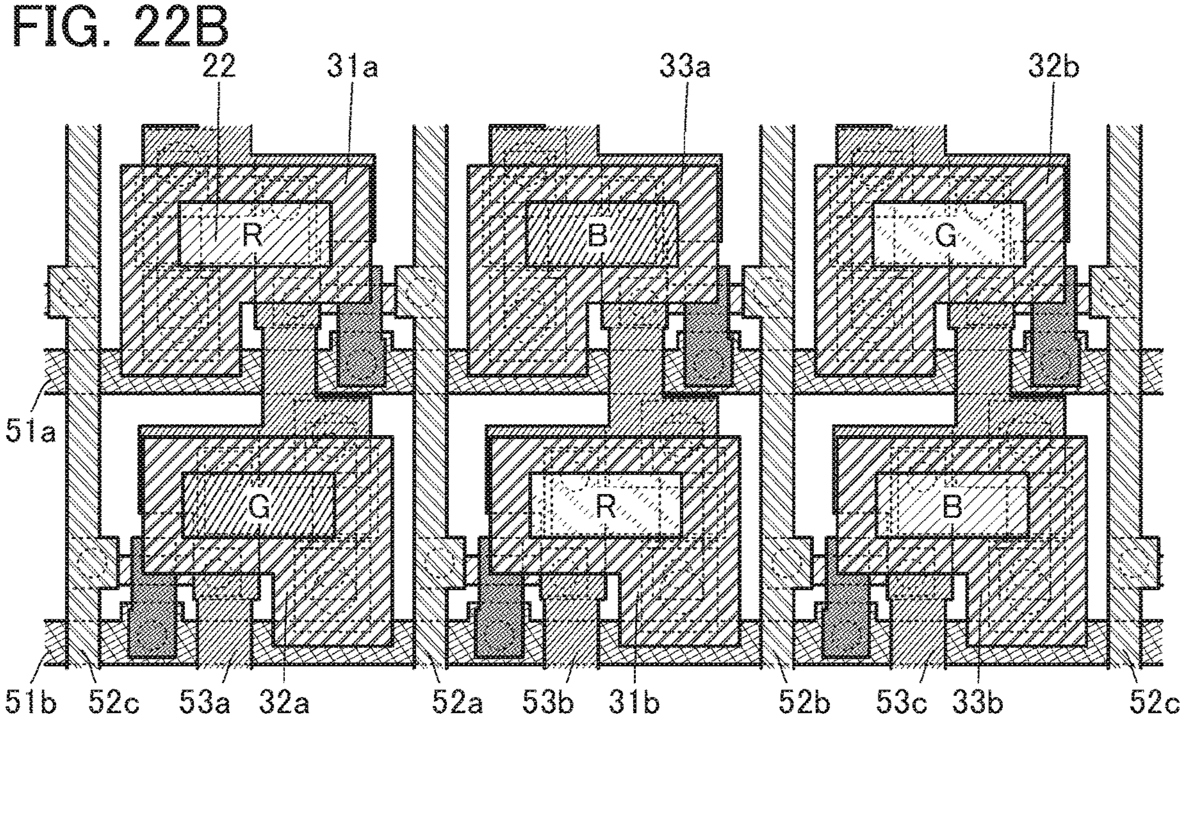

FIG. 22B is a layout example of the pixel unit 70 including the subpixel illustrated in FIG. 22A. FIG. 22B illustrates pixel electrodes (a pixel electrode 31*a*, a pixel electrode 32*a*, a pixel electrode 33*a*, a pixel electrode 31*b*, a pixel electrode 32*b*, and a pixel electrode 33*b*) and a display region 22.

In this example, three subpixels electrically connected to the wiring 51*a* and three subpixels electrically connected to the wiring 51*b* are each bilaterally symmetrical. Therefore, in the structure in which same-color subpixels are arranged in a zigzag pattern in the extending direction of the wiring 52*a* or the like and are connected to one wiring serving as a signal line, wirings in the subpixels can have uniform length, so that variation in luminance between the subpixels can be suppressed.

With use of such a pixel layout, a display device with extremely high resolution can be fabricated even in a production line in which the minimum feature size is greater than or equal to 0.5 μm and smaller than or equal to 6 μm, typically greater than or equal to 1.5 μm and smaller than or equal to 4 μm, for example.

Structure Example of Display Panel

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display device may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves realistic sensation.

Figure 23A:
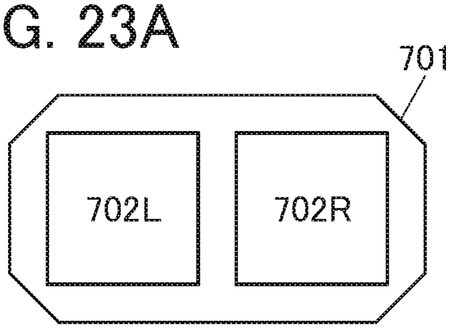
FIG. 23A to FIG. 23J are diagrams illustrating structure examples of a display device.

FIG. 23A illustrates a structure example of a display panel. In FIG. 23A, a display portion 702L for the left eye and a display portion 702R for the right eye are provided inside a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 23A have a square top surface shape.

Figure 23B:
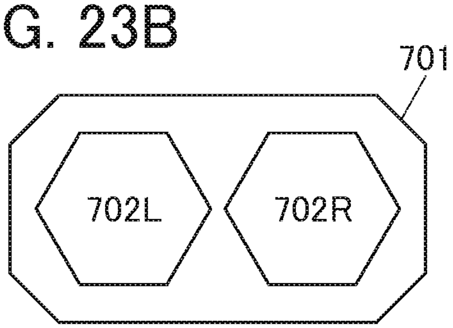
Figure 23C:
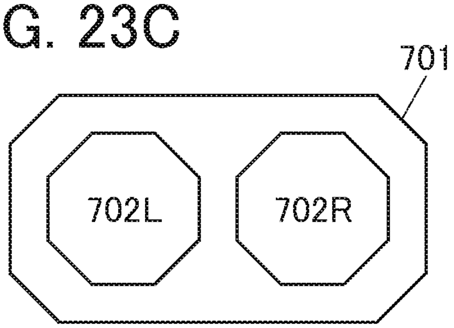
Figure 23D:
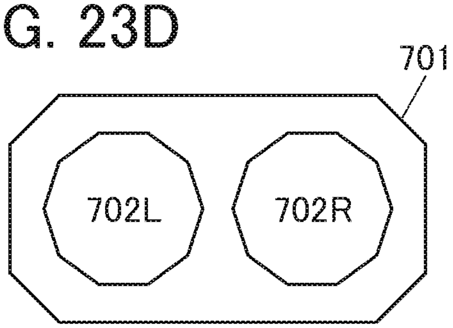
Figure 23E:
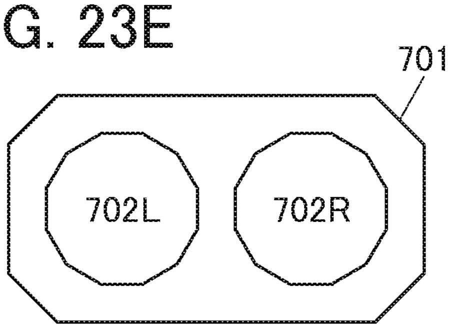

The top surface shapes of the display portion 702L and the display portion 702R may be other regular polygons. FIG. 23B illustrates an example in which the top surface shape is a regular hexagon; FIG. 23C illustrates an example in which the top surface shape is a regular octagon; FIG. 23D illustrates an example in which the top surface shape is a regular decagon; and FIG. 23E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a straight line portion of the outline of the display portion is not strictly a straight line and can be partly a stair-like portion. In particular, a straight line portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

Figure 23F:
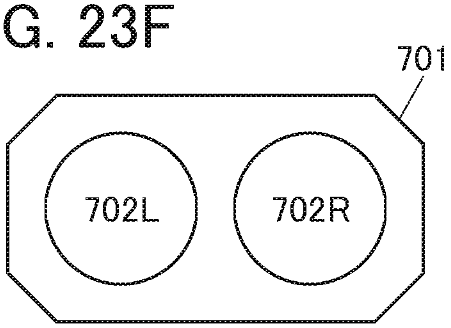

FIG. 23F illustrates an example in which the top surface shapes of the display portion 702L and the display portion 702R are circular.

The top surface shapes of the display portion 702L and the display portion 702R may be bilaterally asymmetrical. Moreover, the top surface shapes may not necessarily be regular polygonal.

Figure 23G:
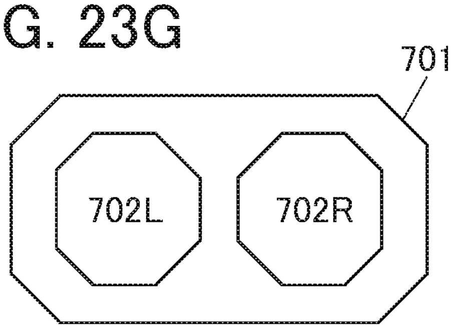
Figure 23H:
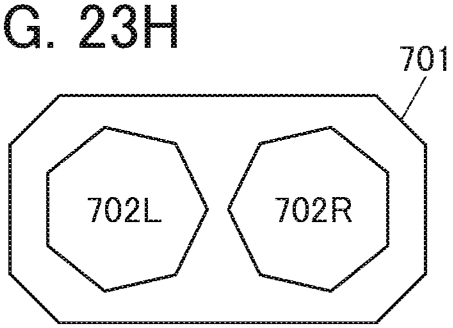

FIG. 23G illustrates an example in which the top surface shapes of the display portion 702L and the display portion 702R are bilaterally asymmetric octagonal. FIG. 23H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

Figure 23I:
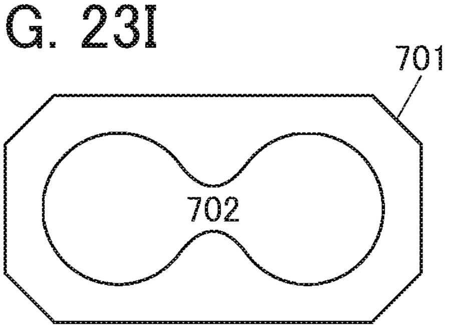
Figure 23J:
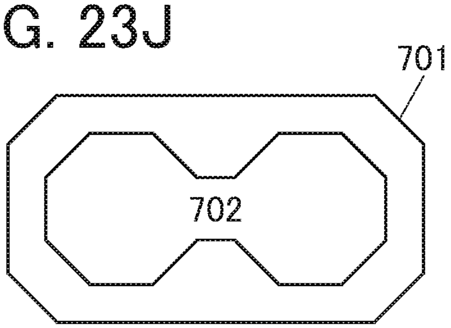

FIG. 23I illustrates an example in which two of the circular display portions in FIG. 23F are connected. FIG. 23J illustrates an example in which two of the regular octagonal display portions in FIG. 23C are connected.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 6

Figure 24:
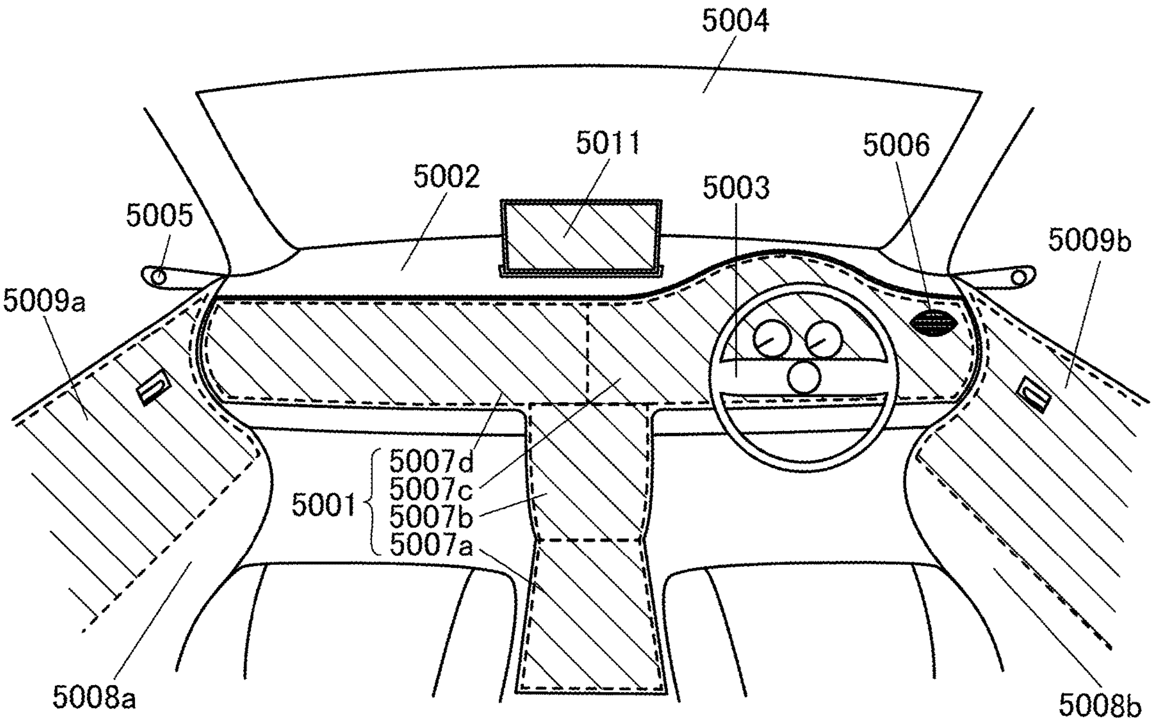
FIG. 24 is a diagram illustrating a structure example of a vehicle.

A display device of one embodiment of the present invention can be incorporated along a curved surface of an inside wall or an outside wall of a house or a building or the interior or the exterior of a vehicle. FIG. 24 illustrates an example of installation of the display device of one embodiment of the present invention in a vehicle.

FIG. 24 illustrates a structure example of a vehicle equipped with a display portion 5001. The display device of one embodiment of the present invention is used in the display portion 5001. Note that although in the example illustrated in FIG. 24, the display portion 5001 is installed in, but not limited to, a right-hand drive vehicle; installation in a left-hand drive vehicle is possible. In that case, the left and right of the components arranged in FIG. 24 are reversed.

FIG. 24 illustrates a dashboard 5002, a steering wheel 5003, a windshield 5004, and the like that are arranged around a driver seat and a front passenger seat. The display portion 5001 is placed in a predetermined position in the dashboard 5002, specifically, around the driver, and has a rough T shape. Although one display portion 5001 formed of a plurality of display panels 5007 (display panels 5007*a*, 5007*b*, 5007*c*, and 5007*d*) is provided along the dashboard 5002 in the example illustrated in FIG. 24, the display portion 5001 may be divided and placed in a plurality of places.

Furthermore, in FIG. 24, a display portion 5009*a* and a display portion 5009*b* are provided along a surface of a door 5008*a* by the passenger seat and a surface of a door 5008*b* by the driver seat, respectively. Each of the display portion 5009*a* and the display portion 5009*b* can be formed using one or a plurality of display panels.

The display portion 5009*a* and the display portion 5009*b* are placed to face each other, and the display portion 5001 is provided on the dashboard 5002 so as to connect an end portion of the display portion 5009*a* and an end portion of the display portion 5009*b*. Accordingly, the driver and the fellow passenger in the passenger seat are surrounded on the front and both sides by the display portion 5001, the display portion 5009*a*, and the display portion 5009*b*. For example, displaying one image across the display portion 5009*a*, the display portion 5001, and the display portion 5009*b* can provide an enhanced sense of immersion to the driver and the fellow passenger.

Note that the plurality of display panels 5007 may have flexibility. In this case, the display portion 5001 can be processed into a complicated shape; for example, a structure in which the display portion 5001 is provided along a curved surface of the dashboard 5002 or the like or a structure in which a display region of the display portion 5001 is not provided at a connection portion of the steering wheel, display portions of meters, a ventilation duct 5006, or the like can easily be achieved.

In addition, a plurality of cameras 5005 that take pictures of the situations at the rear side may be provided outside the vehicle. Although the camera 5005 is provided instead of a side mirror in the example in FIG. 24, both the side mirror and the camera may be provided.

As the camera 5005, a CCD camera, a CMOS camera, or the like can be used. In addition, an infrared camera may be used in combination with such a camera. The infrared camera, which has a higher output level with a higher temperature of an object, can detect or extract a living body such as not only a human but also an animal.

An image captured with the camera 5005 can be output to any one or more of the display panels 5007. This display portion 5001 is mainly used for supporting driving of the vehicle. An image of the situation on the rear side is taken at a wide angle of view by the camera 5005, and the image is displayed on the display panels 5007 so that the driver can see a blind area for avoiding an accident.

Furthermore, a structure in which the discontinuity of the picture at the junctions between the display panels 5007*a*, 5007*b*, 5007*c*, and 5007*d* is compensated may be employed. This makes it possible to display a near seamless picture, so that the visibility of the display portion 5001 during driving can be improved.

Furthermore, a distance image sensor may be provided over a roof of the vehicle, for example, and an image obtained by the distance image sensor may be displayed on the display portion 5001. For the distance image sensor, an image sensor, LIDAR (Light Detection and Ranging), or the like can be used. An image obtained by the image sensor and the image obtained by the distance image sensor are displayed on the display portion 5001, whereby more information can be provided to the driver to support driving.

The display portion 5001 may also have a function of displaying map information, traffic information, television images, DVD images, and the like. For example, map information can be displayed on the display panels 5007*a*, 5007*b*, 5007*c*, and 5007*d* as a large display screen. Note that the number of display panels 5007 can be increased depending on the image to be displayed.

Furthermore, the images displayed on the display panels 5007*a*, 5007*b*, 5007*c*, and 5007*d* can be freely set to meet the driver's preference. For example, television images or DVD images are displayed on the display panel 5007*d* on the left, map information is displayed on the display panel 5007*b* at the center position, meters are displayed on the display panel 5007*c* on the right, and audio information and the like are displayed on the display panel 5007*a* near a transmission gear (between the driver's seat and the front passenger's seat). In addition, a combination of the plurality of display panels 5007 can add a fail-safe function to the display portion 5001. For example, even when any one of the display panels 5007 is broken for any reason, a display region can be changed so that display can be performed using another display panel 5007.

Also images displayed on the display portion 5009*a* and the display portion 5009*b* can be set freely depending on the driver's or fellow passenger's preference. For example, for a child sitting in the front passenger seat, the display portion 5009*a* can display contents for children, such as animation.

In addition, the display portion 5009*a* and the display portion 5009*b* can display an image synchronized with the scenery from the window, which is obtained by synthesizing images obtained by the camera 5005 and the like. That is, an image which the driver and the fellow passenger can see through the door 5008*a* and the door 5008*b* can be displayed on the display portion 5009*a* and the display portion 5009*b*. Therefore, the driver and the fellow passenger can experience a feeling as if they are floating.

A display panel having an image capturing function is preferably used as at least one of the display panels 5007*a*, 5007*b*, 5007*c*, and 5007*d*. Furthermore, a display panel having an image capturing function can also be used as one or more of the display panels provided in the display portion 5009*a* and the display portion 5009*b*.

For example, when the driver touches the display panel, the vehicle can perform biometric authentication such as fingerprint authentication or palm print authentication. The vehicle may have a function of setting an environment to meet the driver's preference when the driver is authenticated by biometric authentication. For example, one or more of adjustment of the position of the seat, adjustment of the position of the handle, adjustment of the position of the camera 5005, setting of brightness, setting of an air conditioner, setting of the speed (frequency) of wipers, volume setting of audio, and reading of the playlist of the audio are preferably performed after authentication.

Alternatively, a vehicle can be brought into a state where the vehicle can be driven, e.g., a state where an engine is started or a state where an electric vehicle can be started after the driver is authenticated by biometric authentication. This is preferable because a key, which is conventionally necessary, is unnecessary.

Although the display portion 5001 illustrated in FIG. 24 is provided along the dashboard 5002 and the like, one embodiment of the present invention is not limited thereto. For example, the display portion can be provided on other than the surface of the dashboard like a display portion 5011 illustrated in FIG. 24. The display portion 5011 illustrated in FIG. 24 is a head-up display which is retractable into the dashboard. Furthermore, the display portion 5011 having detachable structure can be used also as a tablet terminal. The display portion 5001 and the display portion 5011 can have a planar shape or a curved shape.

At least part of this embodiment can be implemented in combination with the other embodiments described in this specification as appropriate.

Embodiment 7

Described in this embodiment is a metal oxide (also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structures>

Amorphous (including completely amorphous), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

A crystal structure of a film or a substrate can be evaluated with an X-ray diffraction (XRD) spectrum. For example, evaluation is possible using an XRD spectrum obtained by GIXD (Grazing-Incidence XRD) measurement. Note that a GIXD method is also referred to as a thin film method or a Seemann-Bohlin method.

For example, the XRD spectrum of a quartz glass substrate shows a peak with a substantially bilaterally symmetrical shape. On the other hand, the peak of the XRD spectrum of an IGZO film having a crystal structure has a bilaterally asymmetrical shape. The asymmetrical peak of the XRD spectrum clearly shows the existence of a crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction method (NBED) (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide. The CAAC-OS is an oxide semiconductor with high crystallinity in which no clear grain boundary is observed. Thus, in the CAAC-OS, a reduction in electron mobility due to the grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Hence, an oxide semiconductor including the CAAC-OS is physically stable.

Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes an indium oxide, an indium zinc oxide, or the like as its main component. The second region includes a gallium oxide, a gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The ratio of the flow rate of the oxygen gas to the total flow rate of the deposition gas in deposition is preferably as low as possible; for example, the ratio of the flow rate of the oxygen gas to the total flow rate of the deposition gas in deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility (μ) can be achieved.

The second region has a higher insulating property than the first region. In other words, when the second regions are distributed in a metal oxide, leakage current can be inhibited.

Thus, in the case where the CAC-OS is used for a transistor, a switching function (On/Off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 8

In this embodiment, electronic devices of one embodiment of the present invention will be described with reference to FIG. 25 to FIG. 28.

An electronic device in this embodiment includes the display device of one embodiment of the present invention. For the display device of one embodiment of the present invention, increases in resolution, definition, or sizes are easily achieved. Thus, the display device of one embodiment of the present invention can be used for display portions of a variety of electronic devices.

The display device of one embodiment of the present invention can be fabricated at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine such as a pachinko machine; a digital camera; a digital video camera; a digital photo frame; a mobile phone; a portable game machine; a portable information terminal; and an audio reproducing device.

In particular, the display device of one embodiment of the present invention can have a high resolution, and thus can be suitably used for an electronic device having a relatively small display portion. As such an electronic device, a watch-type or bracelet-type information terminal device (wearable device); and a wearable device worn on a head, such as a device for VR such as a head-mounted display and a glasses-type device for AR can be given, for example.

Examples of wearable devices include a device for SR (Substitutional Reality) and a device for MR (Mixed Reality).

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With such a display device with high definition and high resolution, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, a video, information, and the like can be displayed on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays).

The electronic device in this embodiment can have a variety of functions. For example, the electronic device can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 25A:
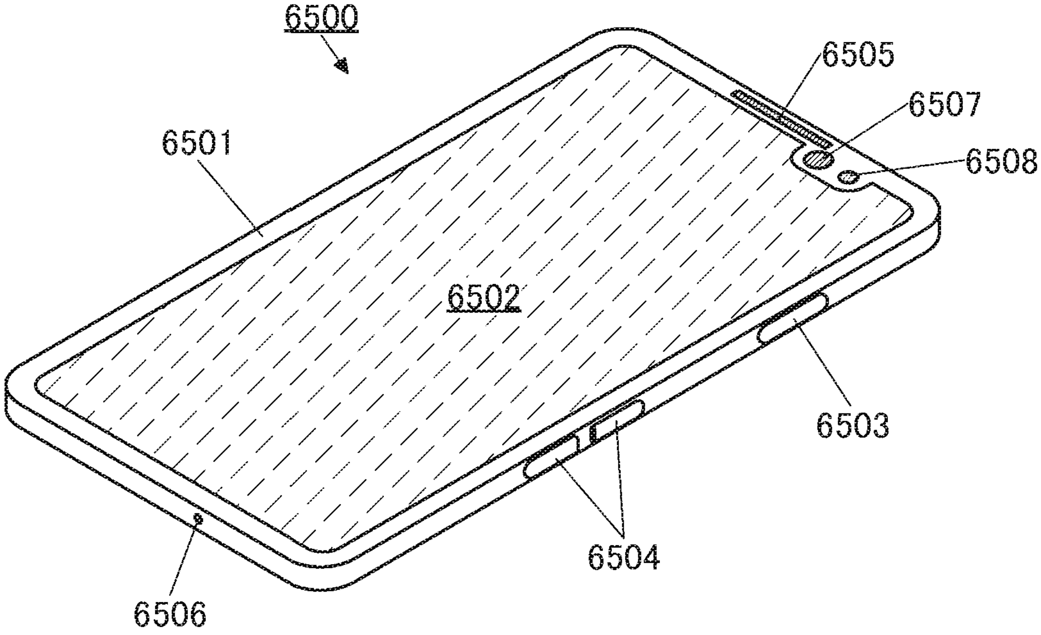
FIG. 25A and FIG. 25B are diagrams illustrating an example of an electronic device.

An electronic device 6500 illustrated in FIG. 25A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 25B:
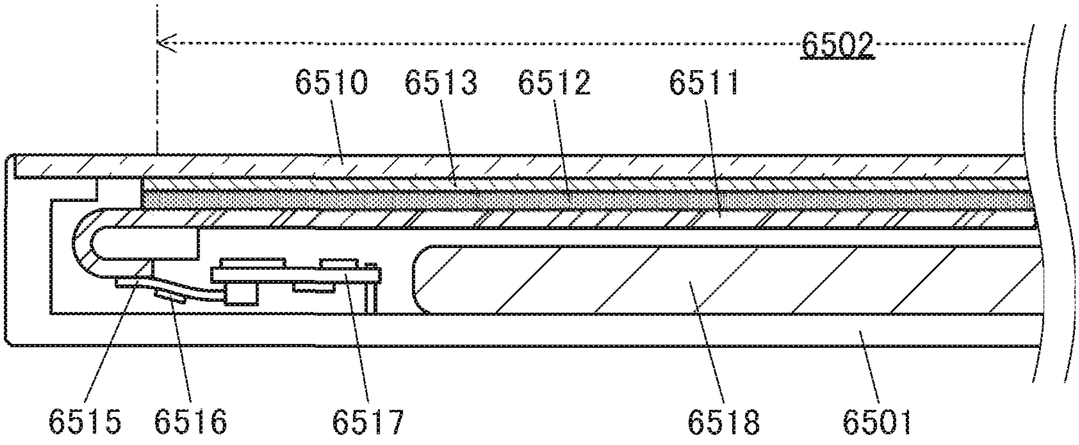

FIG. 25B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of the pixel portion, whereby an electronic device with a narrow bezel can be achieved.

Figure 26A:
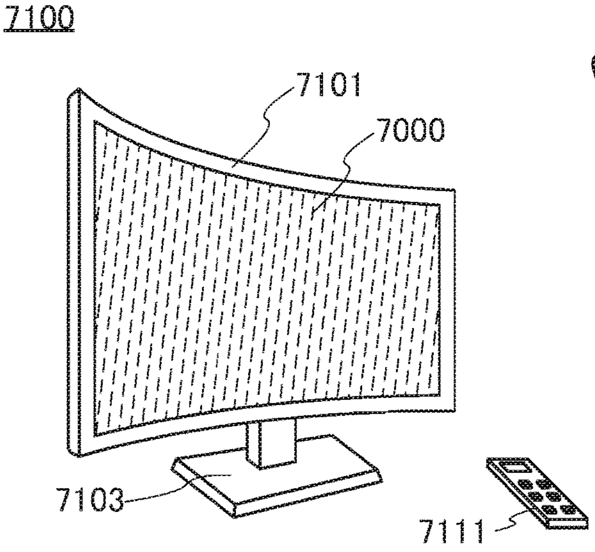
FIG. 26A to FIG. 26D are diagrams illustrating examples of electronic devices.

FIG. 26A illustrates an example of a television device. In a television device 7100, a display portion 7000 is incorporated in a housing 7101. Here, the housing 7101 is supported by a stand 7103.

The display device of one embodiment of the present invention can be used in the display portion 7000.

Operation of the television device 7100 illustrated in FIG. 26A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) information communication can be performed.

Figure 26B:
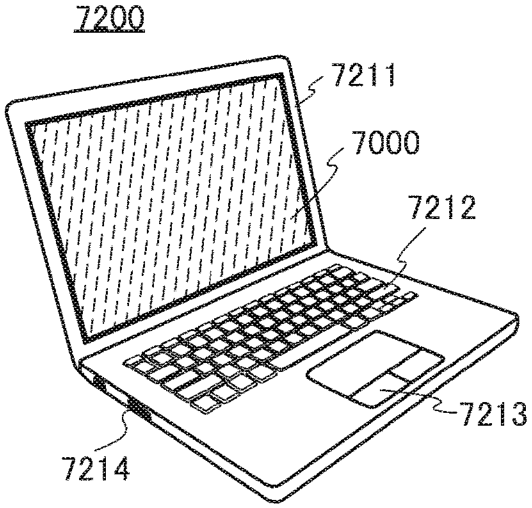

FIG. 26B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 26C:
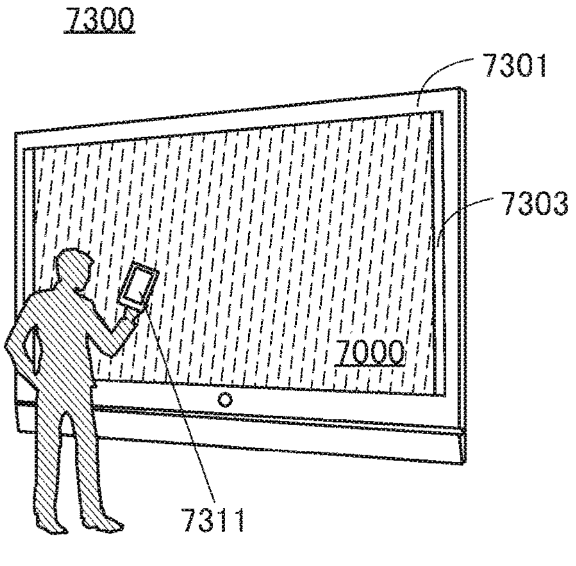
Figure 26D:
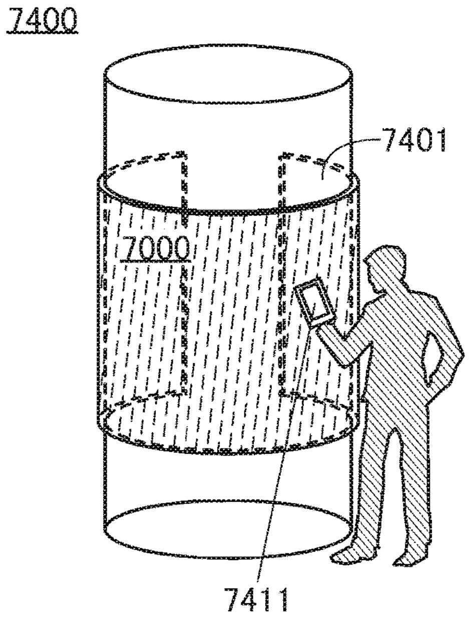

FIG. 26C and FIG. 26D illustrate examples of digital signage.

Digital signage 7300 illustrated in FIG. 26C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 26D illustrates digital signage 7400 mounted on a cylindrical pillar 7401. The digital signage 7400 includes the display portion 7000 provided along a curved surface of the pillar 7401.

The display device of one embodiment of the present invention can be used in the display portion 7000 in each of FIG. 26C and FIG. 26D.

A larger area of the display portion 7000 can increase the amount of information that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 26C and FIG. 26D, it is preferable that the digital signage 7300 or the digital signage 7400 be capable of working with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Figure 27A:
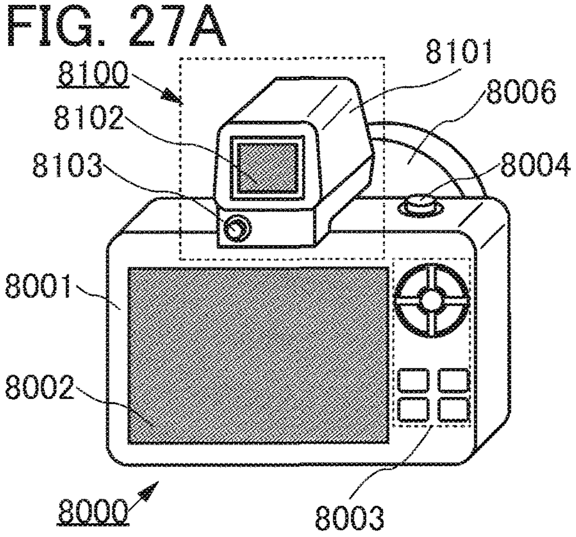
FIG. 27A to FIG. 27F are diagrams illustrating examples of electronic devices.

FIG. 27A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power button or the like.

The display device of one embodiment of the present invention can be used in the display portion 8002 of the camera 8000 and the display portion 8102 of the finder 8100. Note that a finder may be incorporated in the camera 8000.

Figure 27B:
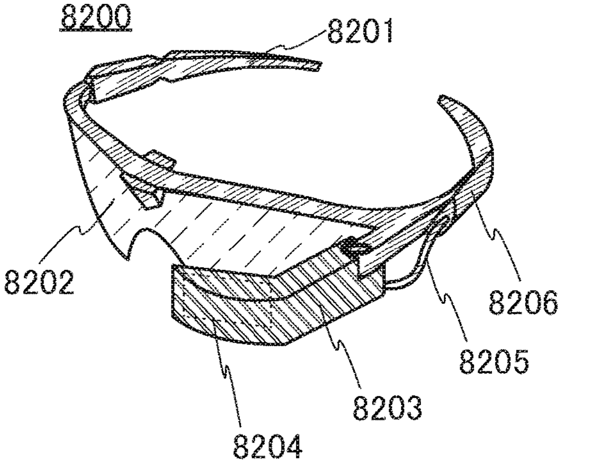

FIG. 27B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive video information and display it on the display portion 8204. The main body 8203 includes a camera, and information on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing through the electrodes. The mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The display device of one embodiment of the present invention can be used in the display portion 8204.

Figure 27C:
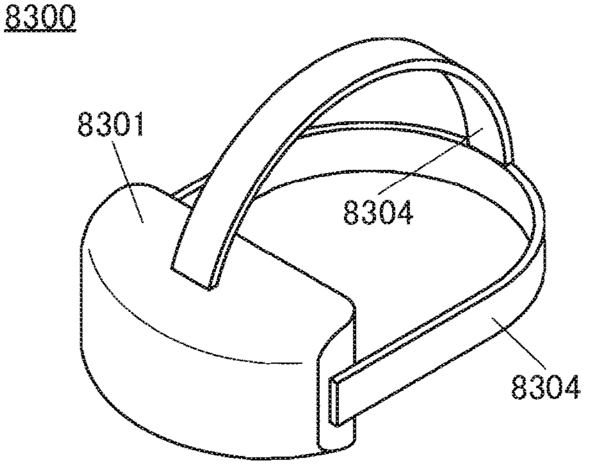
Figure 27D:
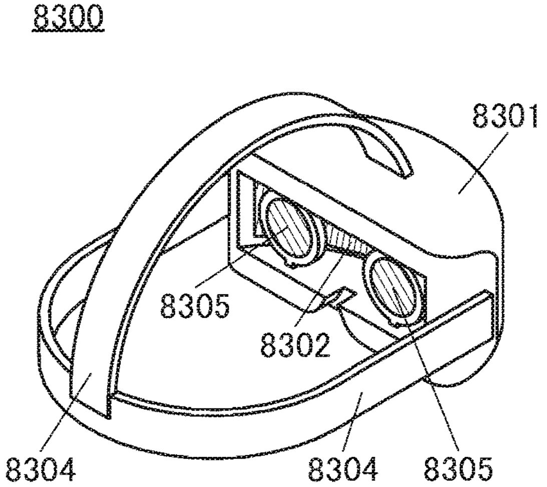
Figure 27E:
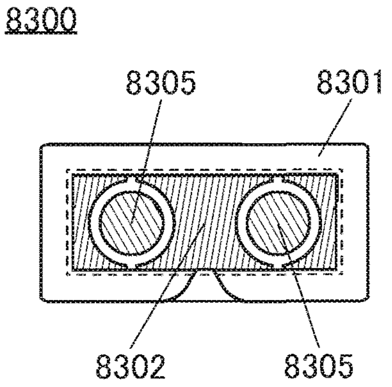

FIG. 27C to FIG. 27E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. The display portion 8302 is preferably curved so that the user can feel high realistic sensation. Another image displayed on another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display device of one embodiment of the present invention can be used in the display portion 8302. The display device of one embodiment of the present invention achieves extremely high definition. For example, a pixel is not easily seen by the user even when the user sees display that is magnified by the use of the lenses 8305 as illustrated in FIG. 27E. In other words, a video with a strong sense of reality can be seen by the user with use of the display portion 8302.

Figure 27F:
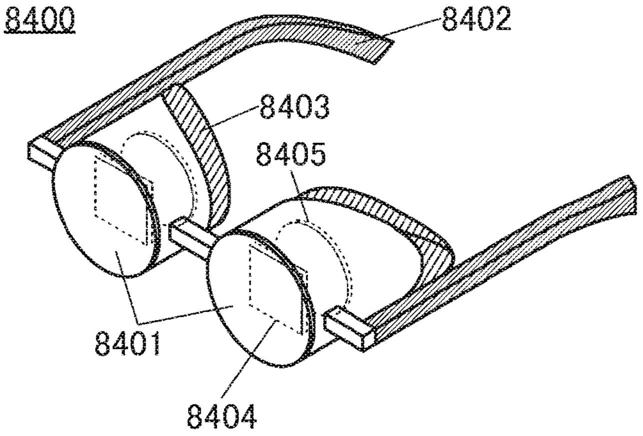

FIG. 27F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy videos and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 28A to FIG. 28F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, an electric field, current, voltage, electric power, radiation, a flow rate, humidity, gradient, oscillation, a smell, or infrared rays), a microphone 9008, and the like.

The electronic devices illustrated in FIG. 28A to FIG. 28F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display device of one embodiment of the present invention can be used in the display portion 9001.

The electronic devices illustrated in FIG. 28A to FIG. 28F will be described in detail below.

Figure 28A:
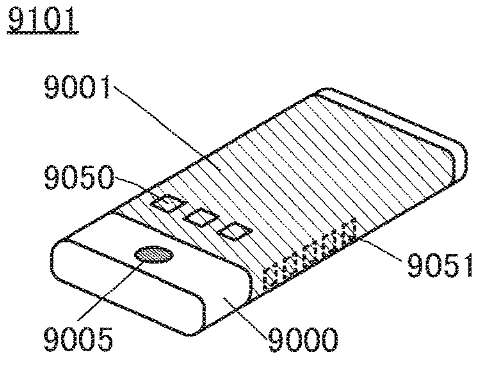
FIG. 28A to FIG. 28F are diagrams illustrating examples of electronic devices.

FIG. 28A is a perspective view illustrating a portable information terminal 9101. The portable information terminal 9101 can be used as a smartphone, for example. Note that the portable information terminal 9101 may include the speaker 9003, the connection terminal 9006, the sensor 9007, or the like. The portable information terminal 9101 can display characters and image information on its plurality of surfaces. FIG. 28A illustrates an example in which three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the reception strength of an antenna. Alternatively, the icon 9050 or the like may be displayed at the position where the information 9051 is displayed.

Figure 28B:
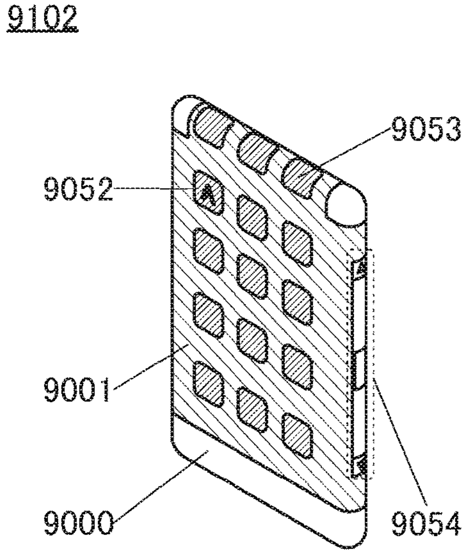

FIG. 28B is a perspective view illustrating a portable information terminal 9102. The portable information terminal 9102 has a function of displaying information on three or more surfaces of the display portion 9001. Here, an example is illustrated in which information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. The user can see the display without taking out the portable information terminal 9102 from the pocket and decide whether to answer the call, for example.

Figure 28C:
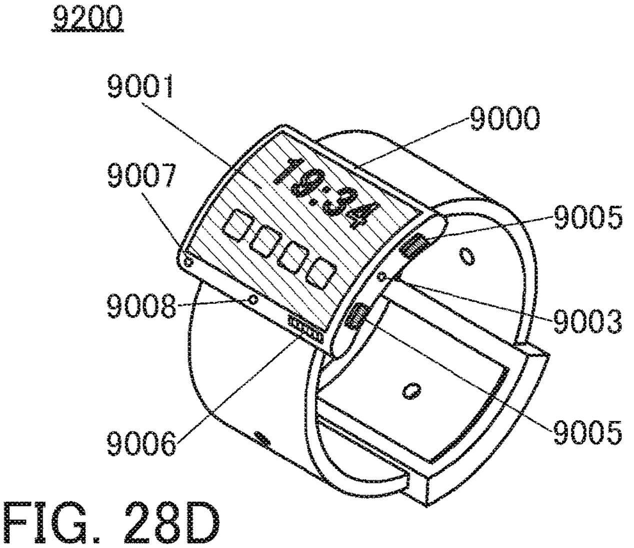

FIG. 28C is a perspective view illustrating a watch-type portable information terminal 9200. For example, the portable information terminal 9200 can be used as a Smartwatch (registered trademark). The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 28D:
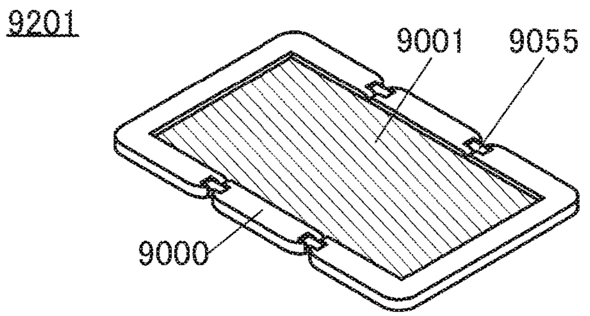
Figure 28E:
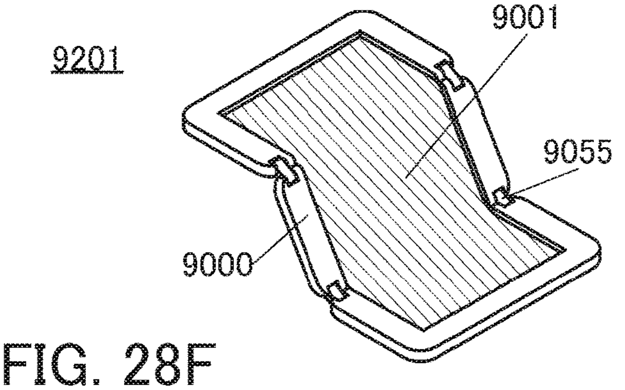
Figure 28F:
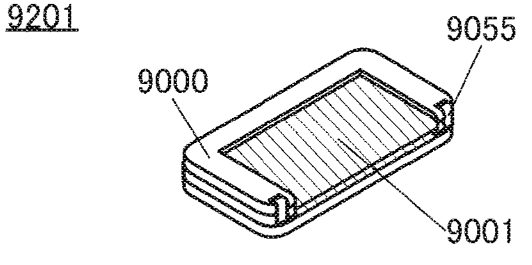

FIG. 28D to FIG. 28F are perspective views illustrating a foldable portable information terminal 9201. FIG. 28D is a perspective view of an opened state of the portable information terminal 9201, FIG. 28F is a perspective view of a folded state thereof, and FIG. 28E is a perspective view of a state in the middle of change from one of FIG. 28D and FIG. 28F to the other. The portable information terminal 9201 is highly portable in the folded state and is highly browsable in the opened state because of a seamless large display region. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

REFERENCE NUMERALS

100: display device: 100A-G: display devices: 101: substrate: 110R, G, B: light-emitting elements: 111R, G, B: pixel electrodes: 111C: connection electrode: 112R, G, B: EL layers: 112Ra, Ga, Ba: light-emitting units: 112Rb, Gb, Bb: intermediate layers: 112Rc, Gc, Bc: light-emitting units: 112Rf, Gf, Bf: EL films: 113: common electrode: 114: EL layer: 115R, G, B: optical adjustment layers: 121: protective layer: 122: space: 130: connection portion: 131: insulating layer: 143-*d*: resist mask: 144*a-c*: mask films: 145*a-c*: mask layers: 146*a-c*: protective films: 147*a-c*: protective layers: 500: light-emitting apparatus: 501: electrode: 502: electrode: 503: region: 512R, G, B: light-emitting units: 521: layer: 522: layer: 523R, G, B: light-emitting layers: 524:

layer: 525: layer: 531: intermediate layer: 541: insulating layer: 542: insulating layer: 550R, G, B: light-emitting elements

The invention claimed is:

1. A display device comprising a plurality of first light-emitting elements and a plurality of second light-emitting elements, wherein each of the first light-emitting elements comprises a first pixel electrode, a first EL layer, a common layer, and a common electrode in this order from a substrate side, wherein each of the second light-emitting elements comprises a second pixel electrode, a second EL layer, the common layer, and the common electrode in this order from the substrate side, wherein the first light-emitting elements and the second light-emitting elements are arranged in a first direction, wherein the plurality of first light-emitting elements and the plurality of second light-emitting elements are each arranged in a second direction intersecting with the first direction, wherein an end portion of the first EL layer and an end portion of the second EL layer are not in contact with each other but face each other with a space therebetween, wherein the first EL layer comprises a region not overlapping with the first pixel electrode, wherein the second EL layer comprises a region not overlapping with the second pixel electrode, wherein a first light-emitting unit, a first intermediate layer, and a second light-emitting unit are stacked in the first EL layer, wherein a third light-emitting unit, a second intermediate layer, and a fourth light-emitting unit are stacked in the second EL layer, wherein the first light-emitting unit and the second light-emitting unit each comprise a first light-emitting layer emitting light of a first color, and wherein the third light-emitting unit and the fourth light-emitting unit each comprise a second light-emitting layer emitting light of a second color different from the first color.

2. The display device according to claim 1, wherein the side surface of the first EL layer is perpendicular or substantially perpendicular to a formation surface of the first EL layer, and wherein the side surface of the second EL layer is perpendicular or substantially perpendicular to a formation surface of the second EL layer.

3. The display device according to claim 1, wherein an angle between the side surface of the first EL layer and a formation surface of the first EL layer is greater than or equal to 60° and less than or equal to 90°, and wherein an angle between the side surface of the second EL layer and a formation surface of the second EL layer is greater than or equal to 60° and less than or equal to 90°.

4. The display device according to claim 1, further comprising an insulating layer between the first pixel electrode and the second pixel electrode, wherein the common layer and the common electrode have a region that overlaps with neither the first EL layer nor the second EL layer and overlaps with the insulating layer, and wherein end portions of the first EL layer and the second EL layer are positioned over the insulating layer.

5. The display device according to claim 4, wherein the insulating layer comprises an organic insulating film or an inorganic insulating film.

6. The display device according to claim 1, further comprising a connection electrode on the same surface as the first pixel electrode, wherein the connection electrode is electrically connected to the common electrode without through the first EL layer and the second EL layer.

7. The display device according to claim 6, wherein the connection electrode is electrically connected to the common electrode through the common layer.

8. The display device according to claim 1, wherein the plurality of first light-emitting elements are arranged with a resolution higher than or equal to 1000 ppi, and wherein an aperture ratio is higher than or equal to 50%.

* * * * *